(12) United States Patent
Doyle

(10) Patent No.: US 9,345,147 B2
(45) Date of Patent: *May 17, 2016

(54) VERTICALLY SEPARATED PASS THROUGH CONVEYOR SYSTEM AND METHOD IN SURFACE MOUNT TECHNOLOGY PROCESS EQUIPMENT

(71) Applicant: ILLINOIS TOOL WORKS INC., Glenview, IL (US)

(72) Inventor: Dennis G. Doyle, Shrewsbury, MA (US)

(73) Assignee: ILLINOIS TOOL WORKS, INC., Glenview, IL (US)

( * ) Notice: Subject to any disclaimer, the term of this patent is extended or adjusted under 35 U.S.C. 154(b) by 306 days.

This patent is subject to a terminal disclaimer.

(21) Appl. No.: 13/968,762

(22) Filed: Aug. 16, 2013

(65) Prior Publication Data

US 2013/0333206 A1 Dec. 19, 2013

Related U.S. Application Data

(62) Division of application No. 12/608,768, filed on Oct. 29, 2009, now Pat. No. 8,555,783.

(60) Provisional application No. 61/115,954, filed on Nov. 19, 2008, provisional application No. 61/144,651, (Continued)

(51) Int. Cl.
*B41F 15/08* (2006.01)
*B05C 13/02* (2006.01)
(Continued)

(52) U.S. Cl.
CPC ... *H05K 3/30* (2013.01); *B65G 37/00* (2013.01); *H05K 13/0061* (2013.01);
(Continued)

(58) Field of Classification Search
CPC ... H05K 13/0061; H05K 3/30; H05K 3/1216; B65G 37/00; Y10T 29/49126; Y10T 29/5313; Y10T 29/53187; Y10T 29/4913; Y10T 29/53174
USPC ............ 101/114, 123, 124, 126, 129; 198/468.8, 435, 369.1, 369.6, 463.3, 198/346.1, 346.2

See application file for complete search history.

(56) References Cited

U.S. PATENT DOCUMENTS

| 2,381,301 A | 8/1945 | Markle, Jr. |
| 3,445,076 A | 5/1969 | Dalglish |

(Continued)

FOREIGN PATENT DOCUMENTS

| JP | H06-166166 A | 6/1994 |
| JP | H07-15133 A | 1/1995 |

(Continued)

OTHER PUBLICATIONS

US 2001/0040442, 6/2001, Ikeda et al. (withdrawn).

(Continued)

*Primary Examiner* — Leslie J Evanisko
(74) *Attorney, Agent, or Firm* — Lando & Anastasi, LLP

(57) ABSTRACT

Disclosed herein is an apparatus for depositing viscous material on an electronic substrate. The apparatus comprises a frame, an assembly material applicator coupled to the frame and configured to apply assembly material to the electronic substrate, a substrate support assembly, coupled to the frame, configured to support and secure the electronic substrate in a material application position, and a transport system, coupled to the frame, to shuttle electronic substrates to and from the substrate support assembly, the transport system including an upper track and a lower track disposed below the upper track.

20 Claims, 48 Drawing Sheets

Related U.S. Application Data filed on Jan. 14, 2009, provisional application No. 61/176,797, filed on May 8, 2009, provisional application No. 61/176,801, filed on May 8, 2009, provisional application No. 61/176,803, filed on May 8, 2009, provisional application No. 61/176,804, filed on May 8, 2009, provisional application No. 61/176,810, filed on May 8, 2009, provisional application No. 61/176,813, filed on May 8, 2009.

(51) Int. Cl.
| | | |
|---|---|---|
| *H05K 13/02* | (2006.01) | |
| *H05K 3/30* | (2006.01) | |
| *H05K 13/00* | (2006.01) | |
| *B65G 37/00* | (2006.01) | |
| *H05K 3/12* | (2006.01) | |

(52) U.S. Cl.
CPC .......... *H05K 3/1216* (2013.01); *Y10T 29/4913* (2015.01); *Y10T 29/49126* (2015.01); *Y10T 29/5313* (2015.01); *Y10T 29/53174* (2015.01); *Y10T 29/53187* (2015.01)

(56) References Cited

U.S. PATENT DOCUMENTS

| | | | |
|---|---|---|---|
| 3,857,337 A | 12/1974 | Tsuji et al. | |
| 4,725,182 A | 2/1988 | Sakamoto et al. | |
| 4,742,905 A | 5/1988 | Beers | |
| 5,436,028 A | 7/1995 | Becher et al. | |
| 5,873,939 A | 2/1999 | Doyle et al. | |
| 6,032,577 A | 3/2000 | Doyle | |
| 6,032,788 A | 3/2000 | Smithers et al. | |
| 6,066,206 A | 5/2000 | Doyle et al. | |
| 6,089,149 A | 7/2000 | Zelko | |
| 6,113,693 A | 9/2000 | Thompson | |
| 6,145,190 A | 11/2000 | Shin et al. | |
| 6,189,488 B1 | 2/2001 | Goldsher et al. | |
| 6,206,964 B1 | 3/2001 | Purcell et al. | |
| 6,207,220 B1 | 3/2001 | Doyle et al. | |
| 6,224,675 B1 | 5/2001 | Prentice et al. | |
| 6,232,766 B1 * | 5/2001 | Saouli ................ | G01R 31/2806 324/757.02 |
| 6,267,819 B1 | 7/2001 | Doyle et al. | |
| 6,322,854 B1 | 11/2001 | Purcell et al. | |
| 6,374,729 B1 | 4/2002 | Doyle | |
| 6,395,334 B1 | 5/2002 | Prentice et al. | |
| 6,543,347 B2 | 4/2003 | Comulada, Jr. et al. | |
| 6,572,702 B1 | 6/2003 | Freeman et al. | |
| 6,663,712 B2 | 12/2003 | Doyle et al. | |
| 6,684,765 B1 | 2/2004 | Rajathuray et al. | |
| 6,688,458 B2 | 2/2004 | Prentice et al. | |
| 6,739,246 B2 | 5/2004 | Lan | |
| 6,866,881 B2 | 3/2005 | Prentice et al. | |
| 6,876,192 B2 | 4/2005 | Seppala et al. | |
| 6,902,052 B2 | 6/2005 | Prentice et al. | |
| 7,032,304 B2 | 4/2006 | Gieskes | |
| 7,032,704 B2 | 4/2006 | Zernickel et al. | |
| 7,434,675 B1 | 10/2008 | Rohm et al. | |
| 7,710,611 B2 | 5/2010 | Prince | |
| 8,205,736 B2 | 6/2012 | Ando et al. | |
| 8,413,577 B2 | 4/2013 | Doyle | |
| 8,413,578 B2 | 4/2013 | Doyle | |
| 8,555,783 B2 | 10/2013 | Doyle | |
| 2002/0020346 A1 | 2/2002 | Doyle et al. | |
| 2002/0088355 A1 | 7/2002 | Comulada et al. | |
| 2003/0018631 A1 | 1/2003 | Lipson et al. | |
| 2003/0041752 A1 | 3/2003 | Witte | |
| 2003/0086089 A1 | 5/2003 | Carlomagno et al. | |
| 2003/0226251 A1 | 12/2003 | Mehdianpour et al. | |
| 2004/0128828 A1 | 7/2004 | Hwang et al. | |
| 2005/0183600 A1 | 8/2005 | Perault et al. | |
| 2007/0240588 A1 | 10/2007 | Dumenil | |
| 2008/0197170 A1 | 8/2008 | Prince | |
| 2010/0122633 A1 | 5/2010 | Doyle | |
| 2010/0122634 A1 | 5/2010 | Doyle | |
| 2010/0122635 A1 | 5/2010 | Doyle | |
| 2010/0122636 A1 | 5/2010 | Doyle | |
| 2010/0125357 A1 | 5/2010 | Doyle | |
| 2010/0125359 A1 | 5/2010 | Doyle | |
| 2012/0031952 A1 | 2/2012 | Hattori et al. | |
| 2013/0180829 A1 | 7/2013 | Doyle | |

FOREIGN PATENT DOCUMENTS

| | | |
|---|---|---|
| JP | H11-10832 A | 1/1999 |
| JP | 2001-047600 A | 2/2001 |
| JP | 2001-315310 A | 11/2001 |
| JP | 2004-142299 A | 5/2004 |
| JP | 2005536360 A | 12/2005 |
| JP | 2006-339238 A | 12/2006 |
| JP | 2007150051 A | 6/2007 |
| WO | 9959389 A2 | 11/1999 |

OTHER PUBLICATIONS

International Search Report and Written Opinion for Application No. PCT/US2009/064094 dated Jan. 11, 2010.

Supplementary European Search Report from corresponding EP 09828036.5 dated Mar. 4, 2013.

Extended European Search Report from corresponding EP09828036.5 dated Mar. 4, 2013.

* cited by examiner

VERTICALLY SEPARATED PASS THROUGH CONVEYOR SYSTEM AND METHOD IN SURFACE MOUNT TECHNOLOGY PROCESS EQUIPMENT

RELATED APPLICATIONS

This application claims the benefit under 35 U.S.C. §120 as a division of U.S. application Ser. No. 12/608,768, titled "VERTICALLY SEPARATED PASS THROUGH CONVEYOR SYSTEM AND METHOD IN SURFACE MOUNT TECHNOLOGY PROCESS EQUIPMENT," filed on Oct. 29, 2009 which claims priority under 35 U.S.C. §119(e) to U.S. Provisional Application Ser. No. 61/115,954, titled "SMALL FOOTPRINT STENCIL PRINTER CONCEPTS," filed on Nov. 19, 2008, to U.S. Provisional Application Ser. No. 61/144,651, titled "SMALL FOOTPRINT STENCIL PRINTER CONCEPTS," filed on Jan. 14, 2009, to U.S. Provisional Application Ser. No. 61/176,797, titled "DYNAMIC PASS-THROUGH LANE SIZING IN SURFACE-MOUNT TECHNOLOGY-SMT PROCESS EQUIPMENT," filed on May 8, 2009, to U.S. Provisional Application Ser. No. 61/176,801, titled "DEFECT REJECTION STATION IN SURFACE-MOUNT TECHNOLOGY-SMT PROCESS EQUIPMENT," filed on May 8, 2009, to U.S. Provisional Application Ser. No. 61/176,803, titled "ADJACENT PRINTER CONTROL IN SURFACE-MOUNT TECHNOLOGY-SMT PROCESS EQUIPMENT," filed on May 8, 2009, to U.S. Provisional Application Ser. No. 61/176,804, titled "PRINTER CONTROL OF ADJACENT EQUIPMENT IN SURFACE-MOUNT TECHNOLOGY-SMT PROCESS EQUIPMENT," filed on May 8, 2009, to U.S. Provisional Application Ser. No. 61/176,810, titled "VERTICALLY SEPARATED PASS-THROUGH CONVEYOR IN SURFACE-MOUNT TECHNOLOGIES PROCESS EQUIPMENT," filed on May 8, 2009, and to U.S. Provisional Application Ser. No. 61/176,813, titled "LINE CONTROL SYSTEM IN SURFACE-MOUNT TECHNOLOGY-SMT PROCESS EQUIPMENT," filed on May 8, 2009, each of which is herein incorporated by reference in its entirety.

BACKGROUND OF INVENTION

1. Field of Invention

Embodiments of the present disclosure are directed generally to surface-mount technology (SMT), and more particularly to systems and methods of applying materials to circuit boards for use in surface mount technology.

2. Discussion of Related Art

Stencil printers and other SMT material application systems typically have a single conveyor track on which printed circuit boards may be introduced into and removed from the printer. These conveyor tracks are designed to handle a particular size of circuit board. In order to handle multiple sizes of circuit boards and/or increase the production of the stencil printer, a stencil printer may be outfitted with two different conveyor tracks, resulting in what is referred to as a dual-lane implementation, which may include a front lane disposed adjacent a front of the stencil printer and a rear lane disposed adjacent a rear or back side of the stencil printer or having both lanes centered about the printer. In a Dual Lane/Dual Print implementation, both lanes could be active and evenly spaced within the printer. With a dual-lane configuration, the two lanes are disposed along a common plane, but typically fixed in the Y-direction with respect to a specific rail orientation (front fixed rail or rear fixed rail for each lane). Dynamic sizing of conveyor tracks to handle different sizes of circuit boards may not be feasible on some dual-lane implementations because one practice is to use two printers in series and print one circuit board on the front lane of one machine and another circuit board on the rear lane of the other machine. Because the print lanes typically use specific board tooling, the lane size cannot easily be adjusted. This restriction limits pass through capacity of the system to the same size board or to a board size that is equal to or larger than the board being printed.

Stencil printers typically contain an individual personal computer or "PC" and the only standard level of communication to adjacent pieces of equipment is through SMEMA. For example, a printed circuit board fabrication line may include one or more pieces of equipment, such as stencil printers, dispensers, pick-and-place machines, reflow ovens, wave soldering machines and/or inspection machines. SMEMA is a simple protocol that is used during such printed circuit board fabrication lines, and, unfortunately, only indicates whether the printed circuit board is ready (or not) for board transport and that the adjacent machine is ready to receive the board or not.

Typically, process lines including stencil printers and placement machines are operated by a pull system with the placement machines controlling the introduction of product into different pieces of equipment in the production line. This is typically done in an attempt to maximize cycle time performance, primarily of the placement equipment. The production line is usually designed around the placement machines. The placement machines are typically the more expensive equipment in the production line, and so effort is made to keep them operating at maximum capacity. Errors discovered in the printing process may require manual intervention to rectify, which can impact the flow of materials into the placement system, decreasing the utilization of the placement system.

SUMMARY OF INVENTION

In accordance with an embodiment of the present disclosure, there is provided a method of processing electronic substrates. The method comprises loading a first electronic substrate onto an upper track of a first stencil printer, raising the upper track of the first stencil printer, bringing a lower track of the first stencil printer into a position in which the lower track of the first stencil printer is aligned with an upper track of a second stencil printer, loading a second electronic substrate on to the lower track of the first stencil printer, and transporting the second electronic substrate to the upper track of the second stencil printer.

The method may further comprise loading a third electronic substrate on to the lower track of the first stencil printer and transporting the third electronic substrate to an upper track of a third stencil printer and may further comprise removing the first electronic substrate by transporting the first electronic substrate through lower tracks of the second and third stencil printers.

The method may further comprise loading a fourth electronic substrate on to the upper track of the first stencil printer, removing the second electronic substrate by transporting the second circuit board through one of the lower track of the first stencil printer and the lower track of the third stencil printer, loading a fifth electronic substrate on to the upper track of the second stencil printer, removing the third electronic substrate, loading a sixth electronic substrate on to the upper track of the third stencil printer, and removing the fourth, fifth and sixth electronic substrates.

Removing an electronic substrate may selectively comprise moving the electronic substrate in a direction at an angle to a direction in which the electronic substrate was loaded.

The method may further comprise transporting the removed electronic substrate to at least one of an encapsulation station, an inspection station, and a bar code reader and may further comprise reintroducing the removed electronic substrate into one of the first, second, and third stencil printers directly after being processed in the at least one of the encapsulation station, the inspection station, and the bar code reader.

Removing the first electronic substrate may comprise lowering the upper track of the first stencil printer to a position where the upper track of the first stencil printer is aligned with lower tracks of the second and third stencil printers.

The method may further comprise performing an inspection operation within at least one of the first stencil printer and the second stencil printer on at least one of the first electronic substrate and the second electronic substrate.

The method may further comprise adjusting a transport width of the lower track of the first stencil printer. The adjustment of the transport width of the lower track of the first stencil printer may be performed in response to a signal from a controller. The controller may be coupled to at least one of the first, second, and the third stencil printers.

In accordance with some aspects of the method, the first electronic substrate may be loaded onto the upper track of the first stencil printer in a different direction from which the second electronic substrate is loaded onto the lower track of the first stencil printer.

In accordance with some aspects of the method, at least one of the first substrate is loaded onto the upper track of the first stencil printer and the second substrate is loaded onto the lower track of the first stencil printer in response to a signal from a controller. The controller may receive information regarding at least one of an operational status of at least one piece of equipment downstream of the first stencil printer and a demand for product. The controller, based on the information, may make a decision to load an electronic substrate onto at least one of the upper track of the first stencil printer and the lower track of the first stencil printer.

The method may further comprise loading a third electronic substrate onto a second upper track of the first stencil printer, raising the second upper track of the first stencil printer, bringing a second lower track of the first stencil printer into a position in which the second lower track of the first stencil printer is aligned with an upper track of a third stencil printer, loading a fourth electronic substrate on to the second lower track of the first stencil printer, and transporting the fourth electronic substrate to the upper track of the third stencil printer.

The method may further comprise adjusting a transport width of the second lower track of the first stencil printer prior to loading the fourth electronic substrate on to the second lower track of the first stencil printer and may further comprise performing an inspection operation within at least one of the first stencil printer and the second stencil printer on the fourth electronic substrate.

The method may further comprise transporting the first electronic substrate to at least one of an encapsulation station, an inspection station, and a bar code reader prior to processing on the first stencil printer.

The method may further comprise performing at least one of a dispense and a direct write operation within at least one of the first stencil printer and the second stencil printer on at least one of the first electronic substrate and the second electronic substrate.

In accordance with another embodiment of the present disclosure there is provided an apparatus for depositing viscous material on an electronic substrate. The apparatus comprises a frame, an assembly material applicator coupled to the frame and configured to apply assembly material to the electronic substrate, a substrate support assembly, coupled to the frame, configured to support and secure the electronic substrate in a material application position, and a transport system, coupled to the frame, to shuttle electronic substrates to and from the substrate support assembly, the transport system including an upper track and a lower track disposed below the upper track.

The apparatus may further comprise a controller configured to control the operation of the apparatus, said controller located external to the apparatus.

The frame may include a fixed frame member and a movable frame member coupled to the fixed frame member. The movable frame member may be movably secured to the fixed frame member by linear bearings. The frame may further include a mechanism to move the movable frame member with respect to the fixed frame member.

In accordance with some aspects, the apparatus is configured as a stencil printer and the assembly material comprises at least one of a solder paste and a conductive ink.

In accordance with some aspects, the assembly material comprises an encapsulent.

In accordance with some aspects, the apparatus is configured as a direct write printer and the assembly material comprises at least one of a solder paste and a conductive ink.

In accordance with some aspects, the lower track is configured to be removed from the apparatus without disrupting an operation of the assembly material applicator or disrupting an operation of the upper track. Removal of the lower track may provide an opening in the apparatus of a sufficient size so that an alternate transport system may be coupled to the apparatus and assume a function of the lower track.

In accordance with some aspects, a transport width of at least one of the upper track and the lower track of the transport system of the apparatus is adjustable.

In accordance with another embodiment of the present disclosure, there is provided a system. The system comprises a piece of equipment configured to perform an operation on an electronic substrate, a substrate support assembly configured to support an electronic substrate in a work position of a piece of equipment utilized in a surface mount manufacturing process, the substrate support assembly including a support configured to support and secure the electronic substrate in the work position, and a sub-system to shuttle electronic substrates to and from the support of the substrate support assembly, the sub-system including an upper track and a lower track disposed below the upper track.

In accordance with some aspects of the system, a transport width of at least one of the upper track and the lower track is adjustable. The transport width of at least one of the upper track and the lower track may be controlled by a controller associated with the system. The controller may be located external to the system. The controller may be located internal to the system.

In accordance with some aspects of the system, the lower track is configured to be removed from the system without disrupting an operation of the assembly material applicator or disrupting an operation of the upper track, wherein removal of the lower track provides an opening in the system of a sufficient size so that an alternate transport system may be coupled to the apparatus and assume a function of the lower track.

The system may be configured as at least one of an inspection system and a placement system. The system may further comprise a second sub-system configured to shuttle electronic substrates through the system.

In accordance with another embodiment of the present disclosure, there is provided a system. The system comprises a piece of equipment configured to perform an operation on an electronic substrate, a substrate support assembly configured to support an electronic substrate in a work position of a piece of equipment utilized in a surface mount manufacturing process, the substrate support assembly including a support configured to support and secure the electronic substrate in the work position, and a sub-system configured to shuttle electronic substrates to and from the support of the substrate support assembly, the sub-system including an upper track and an opening in the system of a sufficient size to allow transport of the electronic substrate through the system by passing through the opening.

In accordance with another embodiment of the present disclosure, there is provided an apparatus for depositing viscous material on an electronic substrate. The apparatus comprises a frame, an assembly material applicator coupled to the frame and configured to apply assembly material to the electronic substrate, a substrate support assembly, coupled to the frame, configured to support and secure the electronic substrate in a work position, and a transport system, coupled to the frame, to shuttle electronic substrates to and from the substrate support assembly, the transport system including a first track and a second track, the first track being mounted on a first displacement mechanism and the second track being mounted on a second displacement mechanism configured to laterally move the second track relative to the first track, the second displacement mechanism configured to raise the first track relative to the second track.

In accordance with some aspects of the apparatus, the first displacement mechanism and the second displacement mechanism are configured to position the first and second track at a same vertical level.

In accordance with some aspects of the apparatus, the transport system is configured to move the first track and the second track from a first state in which the first track is at a same vertical level as the second track to a second state in which the first track is raised by the first displacement mechanism and the second track is laterally moved by the second displacement mechanism to position the second track under the first track.

The apparatus may further comprise a cross conveyor configured to rotate at least one of the first track and the second track.

The apparatus may further comprise an interface for a modular controller. The apparatus may be configured to receive commands through the interface for the modular controller and to operate at least one of at least a portion of the transport system, the substrate support assembly, and the assembly material applicator in response to the received commands. The apparatus may be configured to transmit commands for controlling the operation of at least one other apparatus in a same production line as the apparatus through the interface for the modular controller.

In accordance with another embodiment of the present disclosure, there is provided a system. The system comprises a piece of equipment configured to perform an operation on an electronic substrate, a substrate support assembly configured to support an electronic substrate in a work position of a piece of equipment utilized in a surface mount manufacturing process, the substrate support assembly including a support configured to support and secure the electronic substrate in the work position, and a sub-system to shuttle electronic substrates to and from the support of the substrate support assembly, the sub-system including a first track and a second track horizontally displaced from the first track, the first track mounted on a first displacement mechanism configured to horizontally displace the first track relative to the second track.

In some aspects of the system, the second track is mounted on a second displacement mechanism configured to raise the second track relative to the first track. The first displacement system and the second displacement system may be configured to position the first and second track at a same vertical level, and horizontally displaced from one another.

In some aspects of the system, the sub-system is configured to move the first track and the second track from a first state in which the first track is at a same vertical level as the second track to a second state in which the first track is raised by the first displacement mechanism and the second track is laterally moved by the second displacement mechanism to position the second track under the first track.

The system may further comprise a transport system configured to shuttle electronic substrates to and from the substrate support assembly in a first direction, the transport system including a mechanism configured to rotate the electronic substrate and to deliver the electronic substrate to at least one of the first and the second track for movement in a second direction that is generally perpendicular to the first direction.

In accordance with another embodiment of the present disclosure, there is provided an apparatus for depositing viscous material on an electronic substrate. The apparatus comprises a frame, an assembly material applicator coupled to the frame and configured to apply assembly material to the electronic substrate, a substrate support assembly, coupled to the frame, configured to support and secure the electronic substrate in a work position, and a transport system, coupled to the frame, configured to shuttle electronic substrates to and from the substrate support assembly in a first direction, the transport system including a mechanism configured to rotate the electronic substrate and to deliver the electronic substrate to a track for movement in a second direction that is generally perpendicular to the first direction.

In some aspects of the apparatus, the transport system comprises a conveyor mounted to an apparatus having a rotational axis of motion. The transport system may comprise two conveyors with a cross path, wherein the two conveyors are positioned at different height and at an angle to one another. The transport system may be mounted on an apparatus configured to rotate the transport system and which is further configured to displace the transport system in a vertical direction. The transport system may be further configured to selectively transport electronic substrates to a secondary parallel processing location within the machine.

In some aspects, the apparatus may further comprise a controller configured to control the operation of the apparatus, said controller located external to the apparatus.

In some aspects, the apparatus may further comprise an interface for a modular controller. The apparatus may be configured to receive commands through the interface for the modular controller and to operate at least one of at least a portion of the transport system, the substrate support assembly, and the assembly material applicator in response to the received commands. The apparatus may be configured to transmit commands for controlling the operation of at least one other apparatus in a same production line as the apparatus through the interface for the modular controller.

In accordance with another embodiment of the present disclosure, there is provided a modular printing system for printing viscous material on an electronic substrate. The modular printing system comprises a first stencil printer including a first frame, a first stencil coupled to the first frame, a first print head, coupled to the first frame and configured to deposit and print viscous material through the first stencil, a first substrate support assembly, coupled to the first frame, the first substrate support assembly including a first support configured to support and secure the electronic substrate in a print position, and a first system, coupled to the first frame and configured to shuttle electronic substrates to and from the first support of the first substrate support assembly, the first system including a first upper track and a first lower track disposed below the first upper track, and at least one second stencil printer including a second frame, a second stencil coupled to the second frame, a second print head, coupled to the second frame and configured to deposit and print viscous material through the second stencil, a second substrate support assembly, coupled to the second frame, the second substrate support assembly including a second support configured to support and secure the electronic substrate in a print position, and a second system, coupled to the second frame and configured to shuttle electronic substrates to and from the second support of the second substrate support assembly, the second system including a at least one second upper track and a second lower track disposed below the second upper track.

The modular printing system may further comprise at least one controller configured to control the operation of the first stencil printer and the at least one second stencil printer. The controller may be positioned external to the first stencil printer and the at least one second stencil printer. The controller may communicate with the first stencil printer and the at least one second stencil printer over a communications network using a communications protocol other than SMEMA. The controller may be positioned internal to at least one of the first stencil printer and the at least one second stencil printer. The at least one controller may further be configured to control loading a first electronic substrate into the first upper track of the first stencil printer, raising the first upper track and the first lower track of the first stencil printer to a position in which first lower track of the first stencil printer is aligned with the second upper track of the second stencil printer, and loading a second electronic substrate on to the first lower track of the first stencil printer and transporting the second electronic substrate to the second upper track of the second stencil printer.

The modular printing system may further comprise a third stencil printer including a third frame, a third stencil coupled to the third frame, a third print head, coupled to the third frame and configured to deposit and print viscous material through the third stencil, a third substrate support assembly, coupled to the third frame and configured to support the electronic substrate in a print position, the third substrate support assembly including a third table configured to support and secure the electronic substrate in a print position, and a third conveyor system, coupled to the third frame and configured to shuttle electronic substrates to and from the third table of the third substrate support assembly, the third conveyor system including a third upper track and a third lower track disposed below the third upper track.

The modular printing system may further comprising at least one controller configured to control the operation of the first stencil printer, the at least one second stencil printer, and the third stencil printer, the at least one controller being configured to control loading a third electronic substrate on to the first lower track of the first stencil printer and transporting the third electronic substrate to the third lower track of the third stencil printer, the at least one controller being configured to control loading a third electronic substrate on to the first lower track of the first stencil printer and transporting the third electronic substrate to the third lower track of the third stencil printer. The at least one controller may further be configured to control removing the first electronic substrate by transporting the first electronic substrate through second and third lower tracks of the respective second and third stencil printers. The at least one controller may further be configured to control loading a fourth electronic substrate on to the first upper track of the first stencil printer. The at least one controller may further be configured to control removing the second electronic substrate by transporting the second electronic substrate through one of the first lower track of the first stencil printer and the third lower track of the third stencil printer. The at least one controller may further be configured to control loading a fifth electronic substrate on to the second upper track of the second stencil printer. The at least one controller may further be configured to control removing the third electronic substrate. The at least one controller may further be configured to control loading a sixth electronic substrate on to the upper track of the third stencil printer. The at least one controller may further be configured to control removing the fourth, fifth, and sixth electronic substrates. The at least one controller may further be configured to dynamically control a transport width of at least one of the first upper track, the first lower track, the second upper track, and the second lower track.

The modular printing system may further comprise a rework area.

In some aspects of the modular printing system, the at least one controller of the system is configured to direct an electronic substrate on which a defect is detected from a piece of equipment to the rework area. The at least one controller may be configured to control a shuttle conveyor to direct an electronic substrate on which a defect is detected from a piece of equipment to the rework area without manual intervention.

The modular printing system may further comprise a secondary remote control unit external to the first stencil printer and external to the second stencil printer, the secondary remote control unit configured to interface with a control interface of the first stencil printer, and provide the first stencil printer with the ability to control a function of the second stencil printer.

In accordance with another embodiment of the present disclosure, there is provided a modular system for manufacturing printed circuit boards. The modular system comprises a plurality of pieces of processing equipment including at least one assembly material applicator, and at least one electronic component placement machine, and a transport system configured to transport circuit boards from the at least one stencil printer to the at least one electronic component placement machine, the system including an upper track and a lower track disposed below the upper track.

The modular system may further comprise a controller configured to control at least one of the plurality of pieces of processing equipment to control the transport of circuit boards through at least one of the plurality of pieces of processing equipment. The controller may be included within at least one of the plurality of pieces of processing equipment. The controller may be a modular controller separate from the plurality of pieces of processing equipment and configured to interface with at least one of the plurality of pieces of processing equipment.

The modular system may further comprise a controller configured to control at least one of the plurality of pieces of processing equipment to control the transport of circuit boards from the at least one assembly material applicator to the at least one component placement machine along the transport system. The controller may be included within at least one of the at least one assembly material applicator and the at least one electronic component placement machine.

The modular system may further comprise a controller, wherein the controller is configured to communicate information regarding the size of a printed circuit board to be processed to the plurality of pieces of processing equipment, and wherein the transport system includes conveyor tracks with transport widths that dynamically adjust in response to the communication of information regarding the size of a printed circuit board to be processed.

In some aspects of the modular system, the at least one assembly material applicator comprises at least one of a dispenser, a direct write apparatus, and a printed circuit board inspection system. The modular system may further comprise a communications link between the printed circuit board inspection system and a controller. The controller may be configured to direct a printed circuit board from the at least one assembly material applicator to at least one of a rework station, a repair station, and an inspection station upon receipt of a signal through the communications link from the printed circuit board inspection system indicating the detection of a defect on the printed circuit board.

The modular printer system may further comprise an inspection and test database in communication with the controller, the inspection and test database configured to record the signal sent through the communications link from the printed circuit board inspection system to the controller. The inspection and test database may further be configured to record data obtained from at least one of the inspection station, the electronic component placement machine, and a rework station.

The modular system may further include a production scheduler in communication with the controller and configured to calculate a desired order of introduction of printed circuit boards into the modular system for processing. The calculation may include, as a factor, data derived from signals sent through the communications link from the printed circuit board inspection system to the controller.

In accordance with another embodiment of the present disclosure, there is provided a modular system for manufacturing printed circuit boards. The modular system comprises a plurality of pieces of processing equipment including at least one assembly material applicator, and at least one electronic component placement machine, a conveyor track configured to transport circuit boards from the at least one assembly material applicator and the at least one electronic component placement machine, at least one of a production scheduler and a production database, and a controller configured to communicate with the plurality of the pieces of processing equipment over a communications network, and further configured to communicate with the production scheduler and production database.

In some aspects of the modular system, the controller utilizes a pull-based control logic program configured to introduce circuit boards into at least one of the plurality of pieces of equipment based on a queue of circuit boards at least one of the plurality of pieces of equipment.

In some aspects of the modular system, the controller communicates with the plurality of the pieces of processing equipment using a communications protocol other than SMEMA.

The modular system may further include an inspection and test database. The inspection and test database may be configured to receive data from at least one of the plurality of pieces of processing equipment and to store said data.

In some aspects of the modular system, the controller utilizes a push-based control logic program configured to introduce circuit boards into at least one of the plurality of pieces of equipment.

In accordance with another embodiment of the present disclosure, there is provided a method of operating a piece of surface mount technology manufacturing equipment. The method comprises providing a piece of surface mount technology manufacturing equipment having a first substrate transport track disposed in a first position and a second substrate transport track disposed in a second position, moving the first substrate transport track from the first position to a third position, and moving the second substrate transport track from the second position to the first position.

In accordance with some aspects of the method, moving the first substrate transport track from the first position to a third position comprises moving the first substrate transport track in a vertical direction.

In accordance with some aspects of the method, moving the second substrate transport track from the second position to the first position comprises moving the second substrate transport track in a vertical direction.

In accordance with some aspects of the method, moving the second substrate transport track from the second position to the first position comprises moving the second substrate transport track in a horizontal direction.

The method may further comprise introducing a first substrate onto the first substrate transport track while the first transport track is disposed in the first position and may further comprise processing the first substrate while the first substrate transport track is disposed in the third position. Processing the first substrate may comprise depositing an assembly material on the first substrate. Processing the first substrate may comprise depositing an electronic component on the first substrate. Processing the first substrate may comprise performing an inspection operation on the first substrate.

The method may further comprise introducing a second substrate onto the second substrate transport track while the second transport track is disposed in the first position, and may further comprise moving the second substrate transport track from the first position to the second position while the second substrate is present on the second substrate transport track.

The method may further comprise passing the second substrate along the second substrate transport track and through the piece of surface mount technology manufacturing equipment while the second substrate transport track is disposed in the first position, and may further comprise performing an inspection operation on the second substrate while passing the second substrate along the second substrate track.

The method may further comprise passing the second substrate along the second substrate transport track and through the piece of surface mount technology manufacturing equipment while the second substrate transport track is disposed in the second position.

The method may further comprise removing the second substrate from the second substrate transport track in a direction at an angle from a direction in which the second substrate was introduced onto the second substrate transport track. Removing the second substrate from the second substrate transport track in a direction at an angle from a direction in which the second substrate was introduced onto the second substrate transport track may comprise rotating the second substrate using a cross conveyor and passing the second substrate onto an exit track.

The method may further comprise removing the first substrate from the first substrate transport track in a direction at an angle from a direction in which the first substrate was introduced onto the first substrate transport track. Removing the first substrate from the first substrate transport track in a direction at an angle from a direction in which the first substrate was introduced onto the first substrate transport track may comprise rotating the first substrate using a cross conveyor and passing the first substrate onto an exit track.

The method may further comprise transporting the first substrate into another piece of surface mount technology manufacturing equipment from the first substrate transport track while the first substrate transport track is disposed in the first position.

The method may further comprise transporting the second substrate into another piece of surface mount technology manufacturing equipment from the second substrate transport track while the second substrate transport track is disposed in the first position.

In accordance with another embodiment of the present disclosure, there is provided a system comprising a piece of equipment configured to perform an operation on an electronic substrate in a surface mount manufacturing process, a substrate support assembly configured to support an electronic substrate in a work position of the piece of equipment, the substrate support assembly including a support configured to support and secure the electronic substrate in the work position, and a sub-system configured to shuttle electronic substrates to and from the support of the substrate support assembly. The sub-system includes an upper track extending through the piece of equipment, a lower track extending through the piece of equipment and disposed below the upper track, and a displacement mechanism configured to raise the upper track relative to the lower track.

In some aspects of the system, a transport width of at least one of the upper track and the lower track may be adjustable. The transport width of at least one of the upper track and the lower track may be controlled by a controller associated with the system. The controller may be located external to the system or internal to the system.

In some aspects of the system, the lower track may be configured to be removed from the system without disrupting an operation of the assembly material applicator or disrupting an operation of the upper track. Removal of the lower track may provide an opening in the system of a sufficient size so that an alternate transport system may be coupled to the apparatus and assume a function of the lower track.

In some aspects of the system, the system is configured as at least one of an inspection system and a placement system.

In some aspects of the system, the system further comprises a second sub-system configured to shuttle electronic substrates though the system. The second sub-system may comprise a second upper track extending through the piece of equipment, a second lower track extending through the piece of equipment and disposed below the second upper track, and a second displacement mechanism configured to raise the second upper track relative to the second lower track. A transport width of at least one of the second upper track and the second lower track may be adjustable.

In some aspects of the system, the system further comprises a first opening defined a wall of the system of a sufficient size to allow transport of the electronic substrate through the system by passing through the first opening. The system may further comprise a second opening defined a second wall of the system of a sufficient size to allow transport of the electronic substrate through the system by passing through the second opening, at least one of the upper track and the lower track extending between the first opening and the second opening.

In some aspects of the system, the system further comprises a frame including a fixed frame member and a movable frame member coupled to the fixed frame member. The movable frame member may be movably secured to the fixed frame member by linear bearings. The frame may further include a mechanism to move the movable frame member with respect to the fixed frame member.

In some aspects of the system, the system further comprises an assembly material applicator coupled to the frame and configured to apply assembly material to the electronic substrate. The piece of equipment may be configured as a stencil printer and the assembly material may comprise at least one of a solder paste and a conductive ink. The assembly material may comprise an encapsulent.

In some aspects of the system, the piece of equipment is configured as a direct write printer and the assembly material comprises at least one of a solder paste and a conductive ink.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 34a-36 are schematic illustrations of a stencil printer in accordance with an additional embodiment of the present disclosure.

DETAILED DESCRIPTION

It should be understood that the disclosure is not limited in its application to the details of construction and arrangements of the components set forth herein. The disclosure is capable of other embodiments and of being practiced or carried out in various ways. Variations and modifications of the foregoing are within the scope of the present disclosure. It should also be understood that the material disclosed and defined herein extends to all alternative combinations of two or more of the individual features mentioned or evident from the text and/or the drawings. All of these different combinations constitute various alternative aspects of the present disclosure. The embodiments described herein explain the best modes known for practicing the disclosure and will enable others skilled in the art to utilize the disclosure.

The phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The present disclosure relates generally to examples of material application machines (referred to herein as "stencil printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate.

Figure 29:
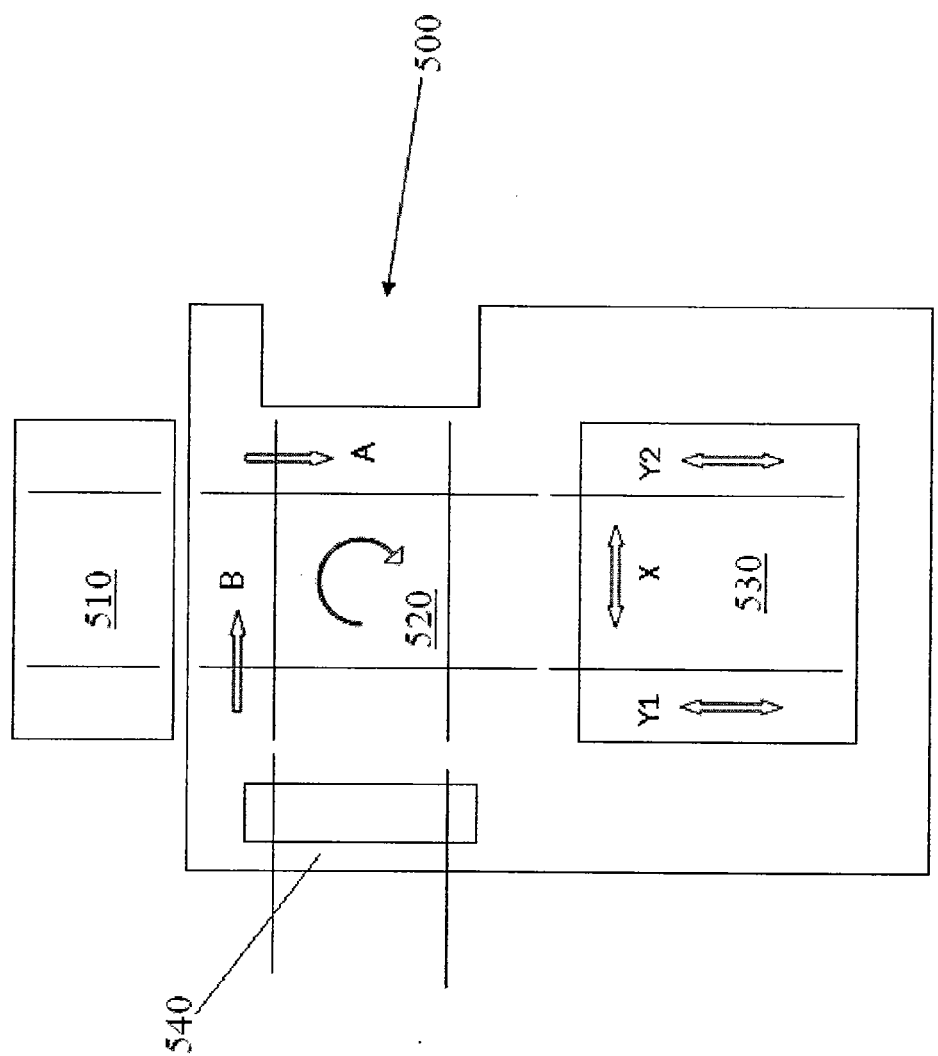
FIG. 29 is a schematic illustration of a stencil printer including a rotating cross conveyor in accordance with an alternate embodiment of the present disclosure.

In one example, a stencil printer may be configured to have a printed circuit board loader provided at the back of the stencil printer, as is illustrated in FIG. 29, which is described in further detail below. The stencil printer may be further configured to have a first conveyor to shuttle printed circuit boards to and from the board loader to an alignment table or other support mechanism in the stencil printer. The stencil printer may further include a second conveyor to shuttle printed circuit boards side to side—to and from adjacent processing equipment through the machine. The stencil printer may be further configured with a rotating cross conveyor disposed beneath the first and/or second conveyors, or both, to rotate or otherwise orient printed circuit boards prior to being processed by the stencil printer or transferred by the one of the conveyors or to orient a processed circuit board to be transferred onto an exit conveyor that is non-parallel (e.g. disposed at a 90 degree angle) with a direction in which the circuit board was loaded into the stencil printer. The cross conveyor may be configured to rotate one or more conveyor tracks within a stencil printer or other piece of surface mount technology processing equipment in a horizontal plane. The rotating cross conveyor may also be moveable in a vertical axis (a Z-axis) such that it can place the boards on and off adjacent conveyors at varying heights. Various process steps, such as aligning the printed circuit board with a stencil, printing material on the substrate, inspecting the printed circuit board, and wiping excess material from the stencil may also be performed by the stencil printer. Any of these process steps may be performed while other such process steps are being performed in parallel on a second board within the stencil printer.

In another example, the stencil printer may be configured with a conveyor provided below the alignment table, in front of the alignment table or behind the alignment table. This conveyor may be retractable during the use of another conveyor (e.g. the primary conveyor) for passing circuit boards through the stencil printer. This configuration may enable pass through of printed or non-printed circuit boards through the stencil printer for processing by a different piece of equipment of for other process purposes as a parallel process, such as inspection, or for other reasons, such as for balancing out other line requirements.

Further aspects of this disclosure are directed to one or more of the following features: (1) controlling multiple printers with a production line control system; (2) controlling pieces of equipment adjacent to a printer system with the printer; (3) a pull or push control system that manages a process line based upon the limitations of either a printer or a placement machine or both simultaneously; (4) a board rejection process that rejects all bad products at a consolidation area after the process that caused the rejection; (5) a control system for printers using communication protocols other than SMEMA; (6) dynamic conveyor track sizing; (7) auxiliary control for conveying product through malfunctioning machines by adjacent printers or other equipment; (8) parallel processing of printed circuit boards; (9) using architecture of the printer equipment as an inspection machine; (10) in addition to inspection, using printer system architecture for dispensing and/or direct write (a process where solder paste or conductive ink is applied to a substrate such as a circuit board using a device other than a head that prints through a stencil such as squeegee blades or a pump head, for example, a process using a print head similar to that which may be found in ink jet computer printers) operations; (11) the inclusion of alternate processes within printer machines, e.g. dispensing, direct write, and inspection, which could be used in a parallel processing mode or in serial mode; and (12) control systems and methods of control for board loaders and board magazines.

A software product for controlling printed circuit board printers is also disclosed herein. In some embodiments, this software may make the decisions on what quantities and/or types of circuit boards to print or transport based upon a desired throughput as well as restrictions of the printing process, such as levels of work in progress and the status (operational or non-operational) of the various pieces of equipment in the production line as well as the consumables associated with those other pieces of production equipment, such as the availability of the specific chips that the placement machines need to place. This software package may be capable of residing on a computer installed on a printing machine or other piece of equipment with in the production line, or may reside on a separate computer system which could be remote from equipment in the production line and which may communicate with printing machines and/or other equipment over a network.

In some embodiments, a printer may include a controller having the capability of controlling board loaders and board shuttles on the upstream and downstream sides of the printer or of a printer group including the printer. In some embodiments, a monitoring and control system may include a bar code setup that identifies what type of printed circuit board is being fed into the printers or other pieces of equipment in a printed circuit board production line. The monitoring and control system may also be used to take feedback from or control equipment in a production line downstream of a printer, such as an inspection device or a placement machine. The control system may control the start of new product based in part on the production queue at a primary control point, such as a board loader, board magazine, or the printer, as opposed to a piece of placement equipment.

When a defect is detected on a board, and the board is rejected, the board may be removed from the machine where the defect was discovered, or it may be repaired in the machine itself.

In order to facilitate a reduction in space taken up by a production line, or complexity of accessing a board within a printing machine, and to facilitate a reduction in interruptions of the process line and therefore greater efficiency, some embodiments disclosed herein include a mechanism and process for rejecting defective boards after detection of a defect.

In some embodiments, a shuttle conveyor may be utilized to transport defective boards from a printing machine to a rework area. In some embodiments, this may be a completely automated process. In some embodiments, the system may deliver defective boards from the shuttle conveyor into a scrap basket or an inspection or repair station for cleaning, repair, or disposal at a later time. This may facilitate the reduction in instances where manual intervention may be required to remove a defective board from a printing machine, which could result in a line down situation, which causes lost production time and inefficiency.

A control system may communicate with printing machines and other types of equipment in a production line, including, but not limited to, inspection machines, dispensers, placement machines, board shuttles, and board loaders, using a communications protocol other than, or in addition to, SMEMA, e.g., Ethernet, TCP/IP, http, or html communication protocols. In some embodiments, the control system may utilize an Ethernet, RS-232 port, or other network type of connection, including, for example, wireless communication, to communicate with production equipment. The control system may be programmed to dynamically inform one or more machines in the production line which operations to perform and when.

The control system may also be utilized in conjunction with dual-lane printers where it may be used to provide adjacent printers or other types of equipment information regarding the transport speed or size of a circuit board to pass through the piece of equipment. Some pieces of equipment, such as direct write or inspection equipment, may also provide board identification data so that the piece of equipment would process the circuit board properly.

In some embodiments, a spacing between rails (i.e., a transport width) of a conveyor track associated with a printer machine or other piece of equipment in a printed circuit board production line may be changed to accommodate different board sizes that may be processed on or passed through the piece of equipment. This may be performed dynamically on one or more conveyors associated with a printer or other piece of equipment.

A production line may, in some embodiments, be configured with the ability to run printed circuit boards through a partially operational or malfunctioning machine. This may facilitate a reduction in instances wherein a down machine may cause a production line down situation until the malfunctioning machine is removed and replaced by a functional machine or by a conveyor. In one implementation, a long leaded connection for input and output conveyors in a printing machine may be provided. If the machine becomes non-operational or partially operational, a functional conveyor within the down machine can be attached to a printer on the upstream or downstream side of the non-operational machine to allow control of that conveyor to take place and for product to pass through the non-operational machine.

In some embodiments, a printing machine may be provided with a cross conveyor which lends itself to parallel processing. Operations, such as board inspection, dispensing, or board identification, may be provided on the printing machine in addition to printing operations. For example, in some embodiments, a cross conveyor may be utilized to move a board to a portion of the printing machine where an operation such as inspection or dispensing may be performed while another board is being printed on the printing machine. In some embodiments, a printing machine architecture may be modified in order to perform different or additional operations. For example, the architecture may be modified to perform inspection, dispensing, and/or direct write operations.

The configurations disclosed herein may be employed while performing a single act upon the board, and should not be limited to a parallel processing scenario. The technology disclosed herein may be employed in other technologies, such as printing, dispensing, 2-D inspection, and 3-D inspection tied into the same machine architecture.

In certain embodiments, raw boards may be fed into a printing machine by a board loader. Printed circuit boards may be fed into a machine by a conveyor, a magazine, a vertical shuttle from an overhead conveyor, or from a horizontal shuttle through the machine.

Figure 26:
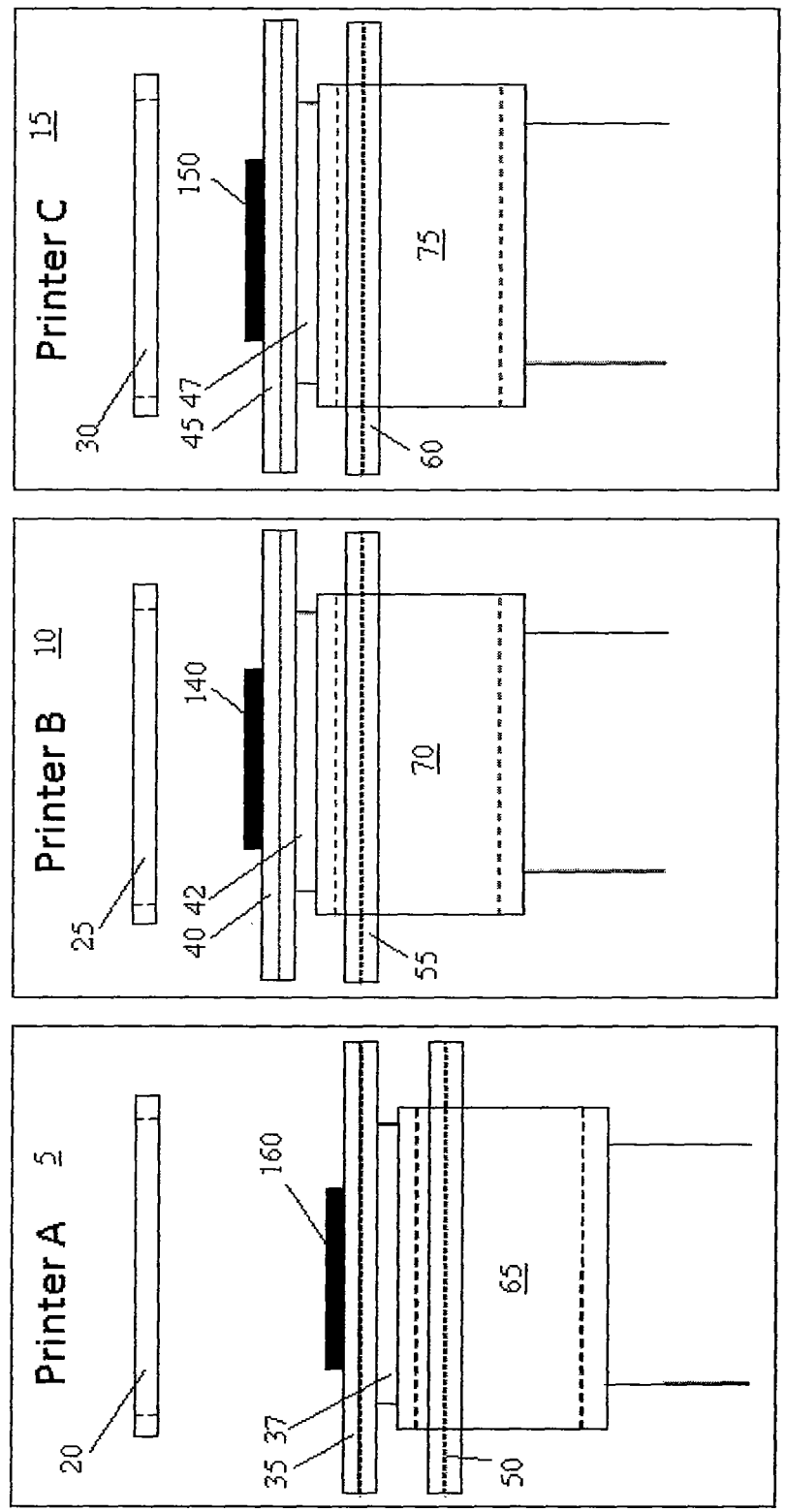
Figure 27A:
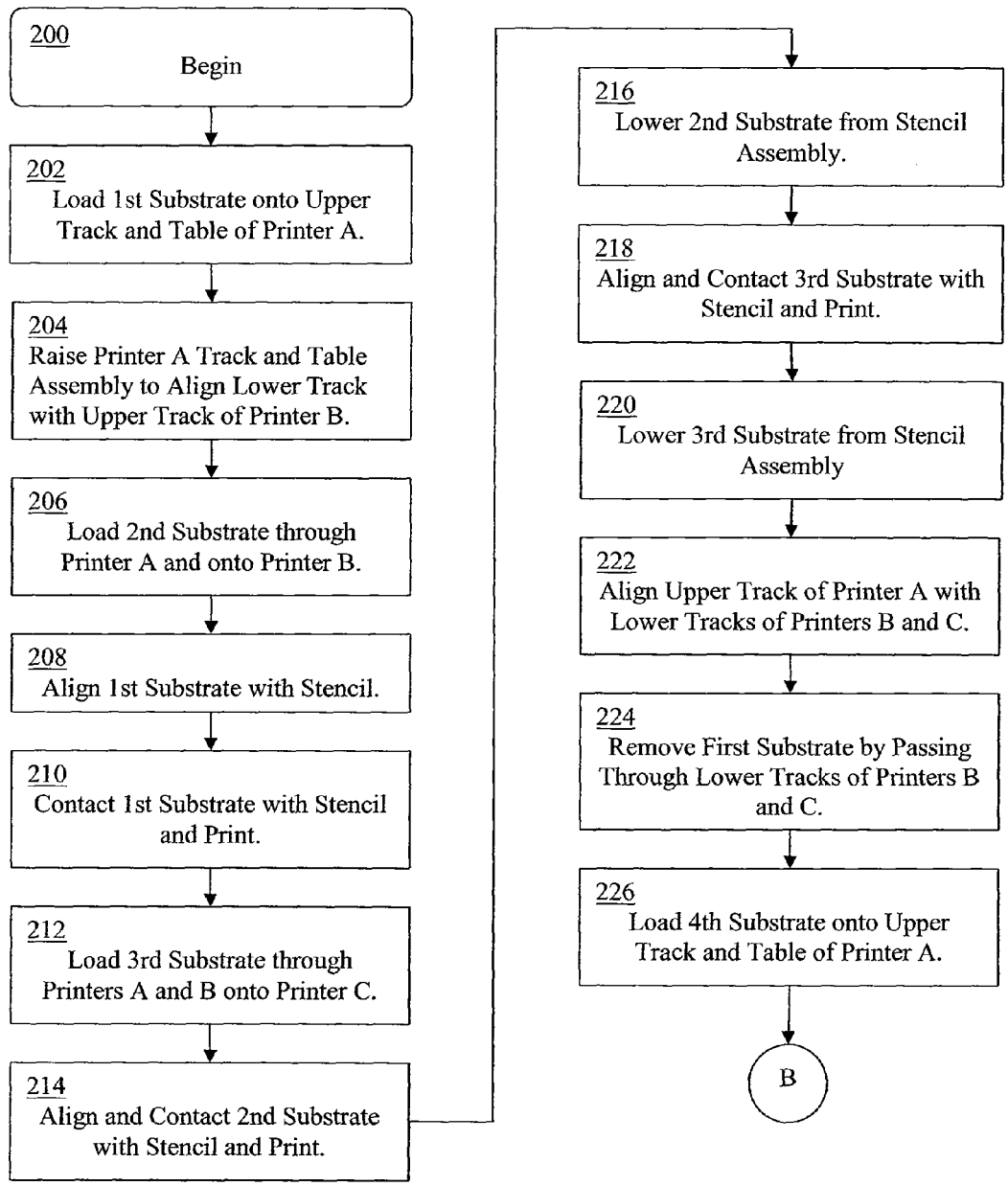
FIG. 27A is a flow chart of a method of operating the series of stencil printers of FIGS. 1-26 in accordance with an embodiment of the present disclosure.
Figure 27B:
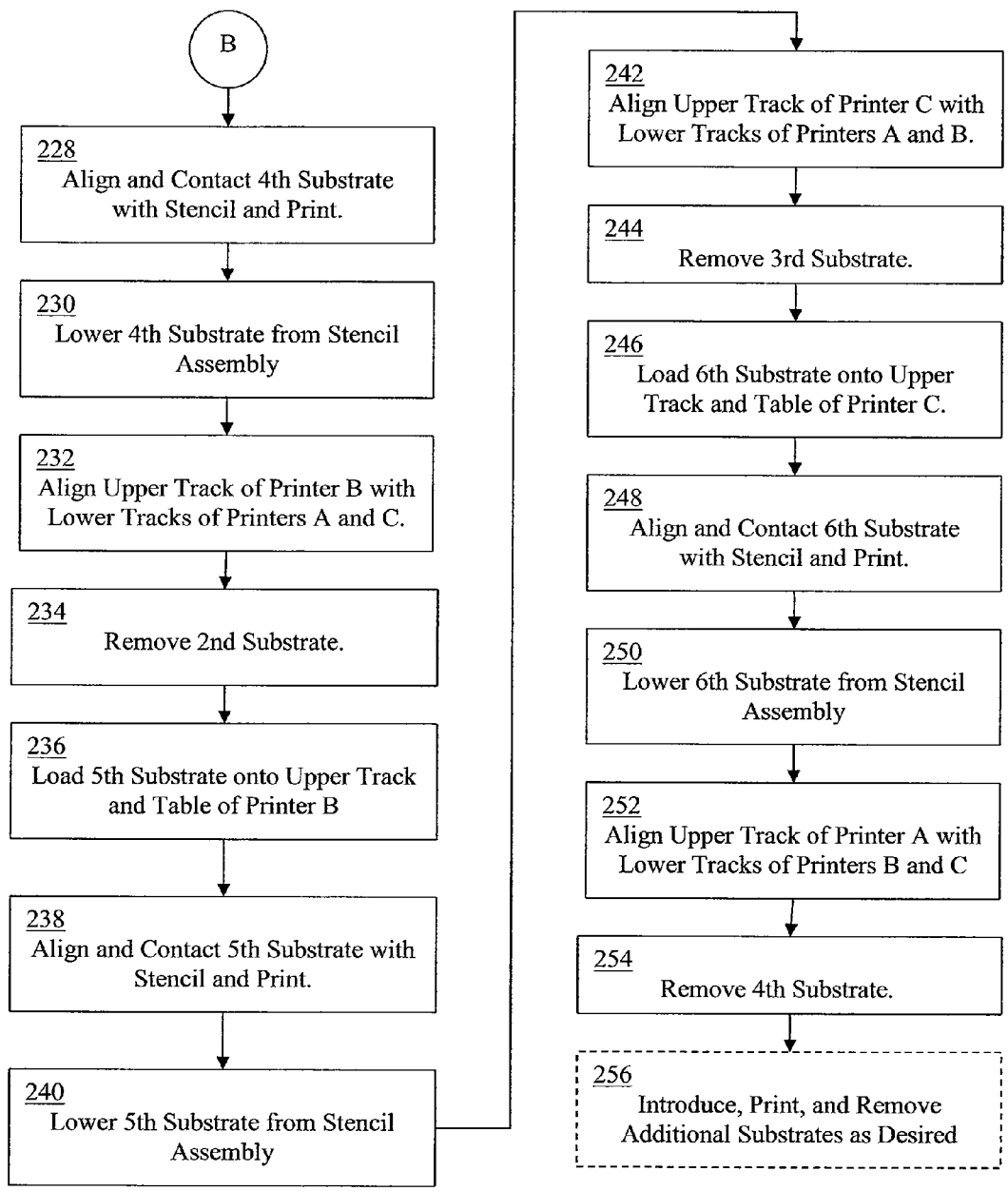
FIG. 27B is continuation of the flow chart of FIG. 27A.

FIGS. 1-26 and the flowchart of FIGS. 27A and 27B illustrate the concept of a modular printer system using an example of three printer modules or stations in series. This example involves three printers, printers A, B, and C, designated at reference numerals 5, 10, and 15 respectively. Exemplary platforms, which may be modified to perform print operations in accordance with the methods disclosed herein, may include, but are not limited to the ACCELA® and MOMENTUM™ stencil printers offered by Speedline Technologies, Inc. of Franklin, Mass., the assignee of the present disclosure. Each of printers 5, 10, and 15 may include stencil assemblies 20, 25, and 30, upper conveyor tracks 35, 40, and 45, lower conveyor tracks 50, 55, and 60, alignment tables and associated tooling 37, 42 and 47 (referred to hereforth as the alignment tables), and elevators 65, 70, and 75 (referred to as "z-axis"), respectively. The stencil assemblies 20, 25, and 30 may include stencils, which may be different from another so that each of printers 5, 10, and 15 may print a different pattern. In other embodiments, two or more of printers 5, 10, and 15 may be configured with similar or identical stencils so as to print similar or identical patterns. Each of printers 5, 10, and 15 may also include a table or other support mechanism onto which the upper conveyor tracks 35, 40, and 45 or another loading conveyor may place a PCB substrate, either directly or in cooperation with a load/unload assembly, for aligning and/or supporting and/or securing the substrate. Each of printers 5, 10, and 15 may include one or more cameras for use in aligning and/or inspecting PCBs that are introduced into the printers. The details of the cameras and stencil printing systems have been omitted from FIGS. 1-26 for clarity.

Upper and lower conveyor tracks 35, 40, and 45 and 50, 55, and 60 are sufficiently closely spaced that they may pass PCB substrates from one to another, e.g., from conveyor track 50 to conveyor track 55, from conveyor 35 to conveyor 55, or from any conveyor on one machine to any conveyor on another machine when the applicable conveyor tracks are vertically aligned and set at the appropriate transport width for the substrate being conveyed. Elevators 65, 70, and 75 are capable of moving their respective upper and lower conveyor tracks upward or downward in a vertical direction. The upper and lower conveyor tracks on a printer may be moved in a vertical direction by the elevator associated with the printer either independently or together, or both with a semi dependent range of motion which may have varying levels of control at different positions of motion. In some embodiments, additional conveyor tracks may be provided on one or more of the printers 5, 10, and 15, displaced vertically, horizontally, or both from the conveyor tracks illustrated. Further, in some embodiments there may be one or more transport paths through the machine either horizontally or vertically displaced from one another.

At block 200 of FIG. 27A (corresponding to FIG. 1) the process begins. At this time all of printers 5, 10, and 15 are empty of PCB substrates. At block 202, a PCB substrate, designated at reference numeral 100 in FIG. 2, for example, is loaded onto printer 5 along upper conveyor track 35 and placed onto the alignment table 37 of printer 5. The PCB substrate 100 may be introduced to printer 5 from another conveyor track leading from an upstream piece of equipment, such as, in some embodiments, another printer, a rework or repair station, an inspection station, a reflow or cure station, or a placement machine. The PCB substrate 100 may in other embodiments be introduced to printer 5 from a board loader, conveyor, or shuttle, or may be manually loaded onto the conveyor track 35.

Figure 1:
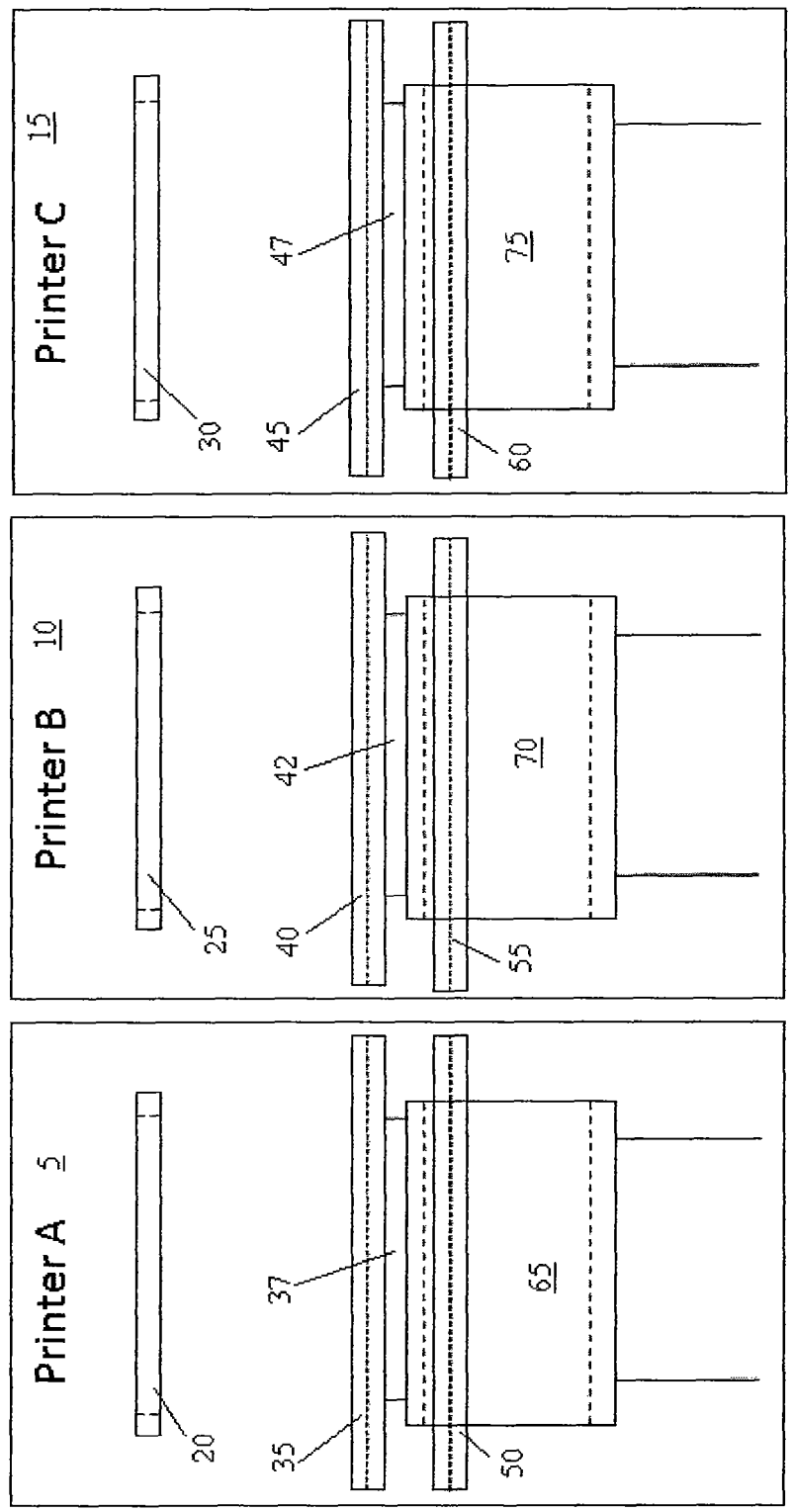
FIG. 1 is a schematic of a series of stencil printers in accordance with an embodiment of the present disclosure with conveyor tracks in a first configuration.
Figure 2:
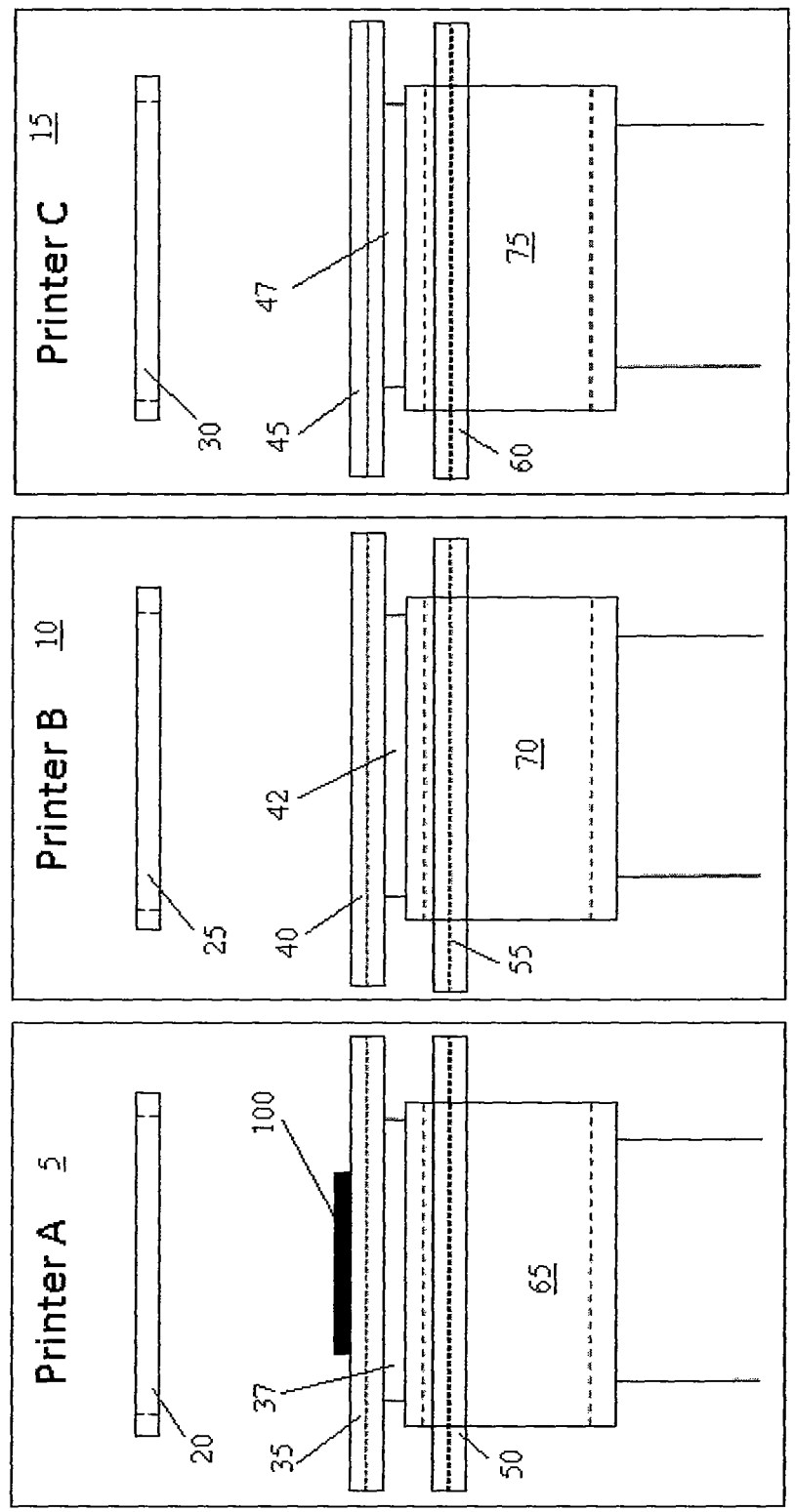
FIGS. 2-26 are schematics of the series of stencil printers of FIG. 1 with the conveyor tracks and circuit boards being processed in a variety of configurations.
Figure 3:
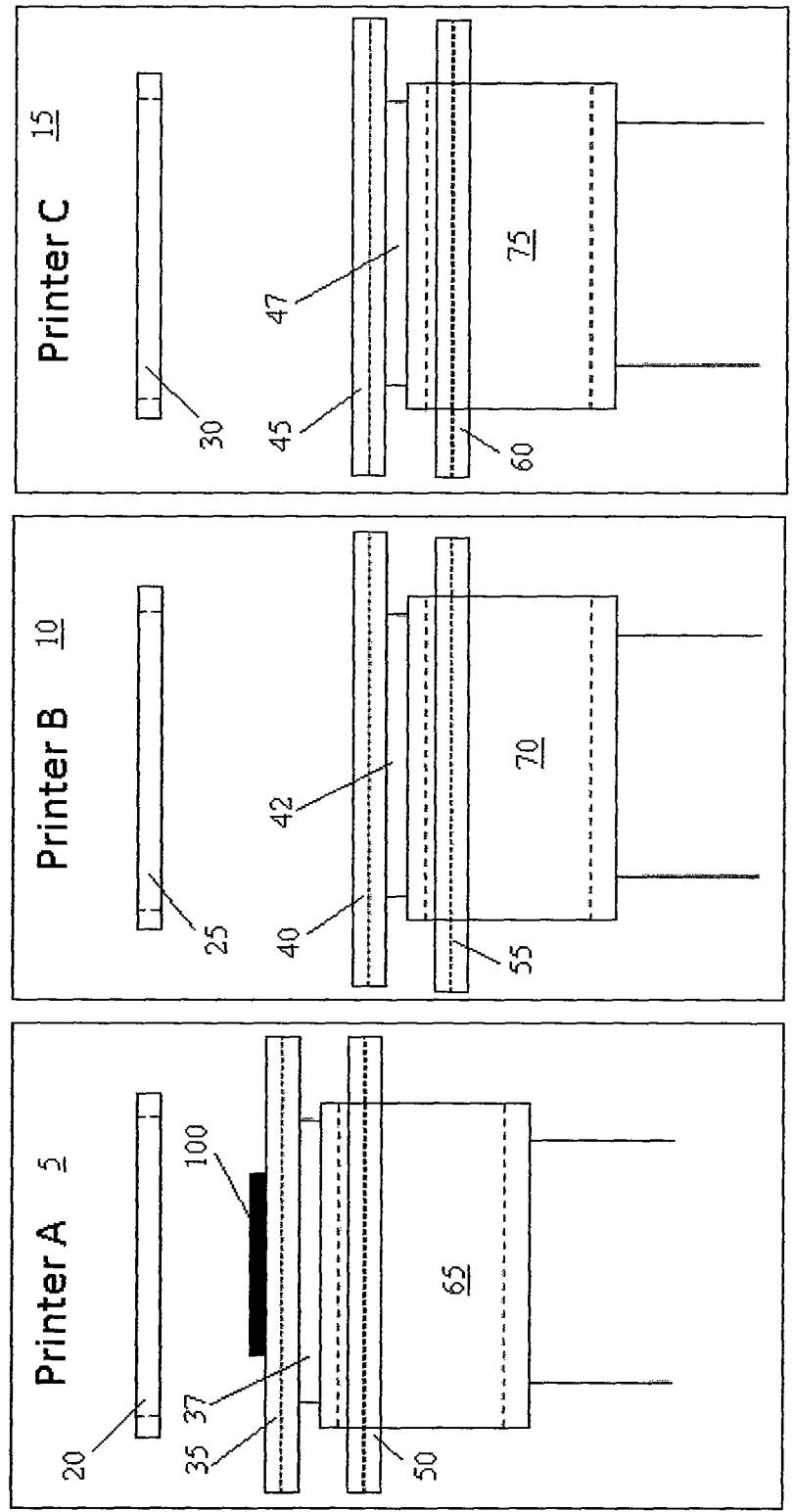
Figure 4:
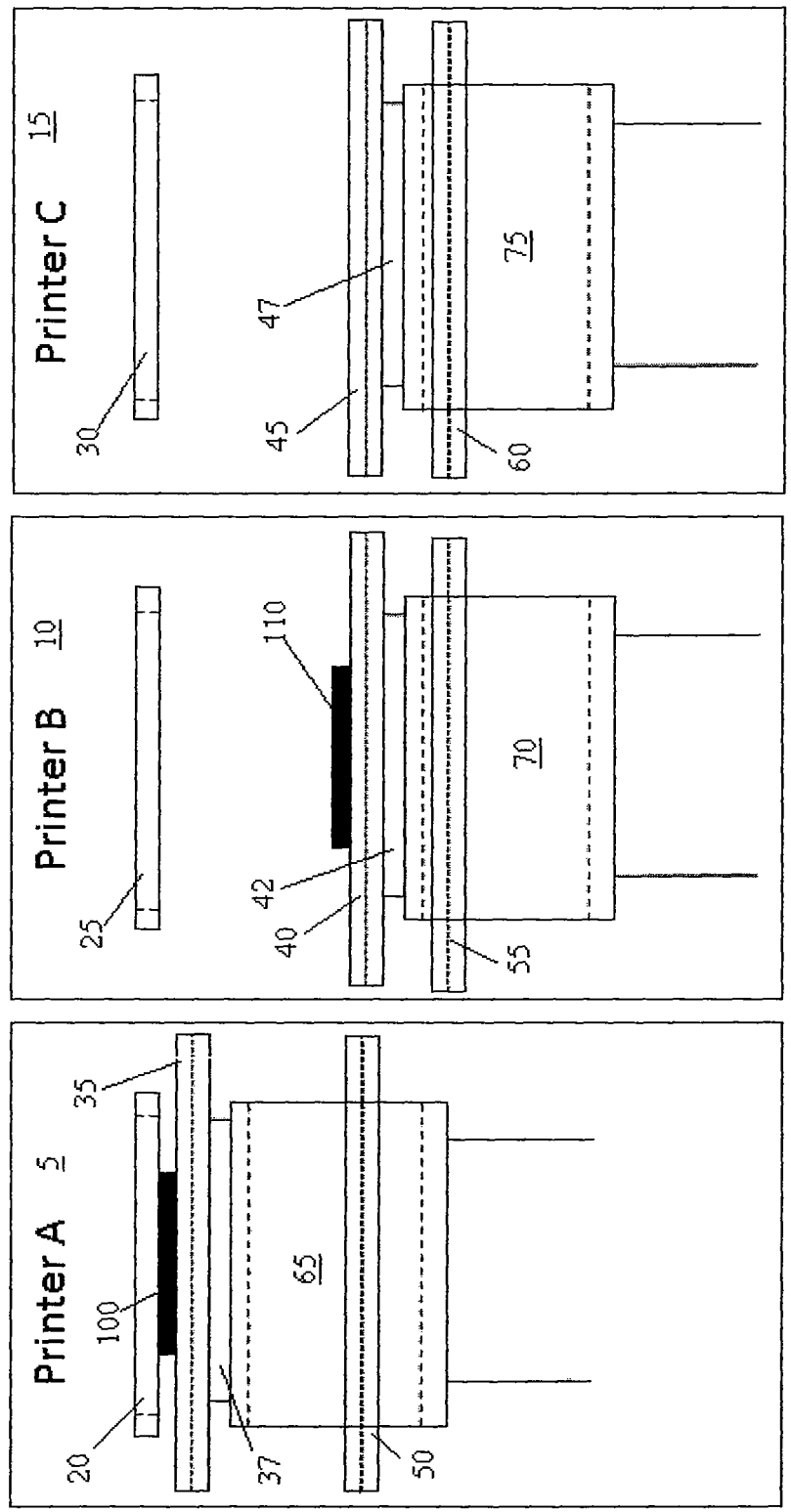
Figure 5:
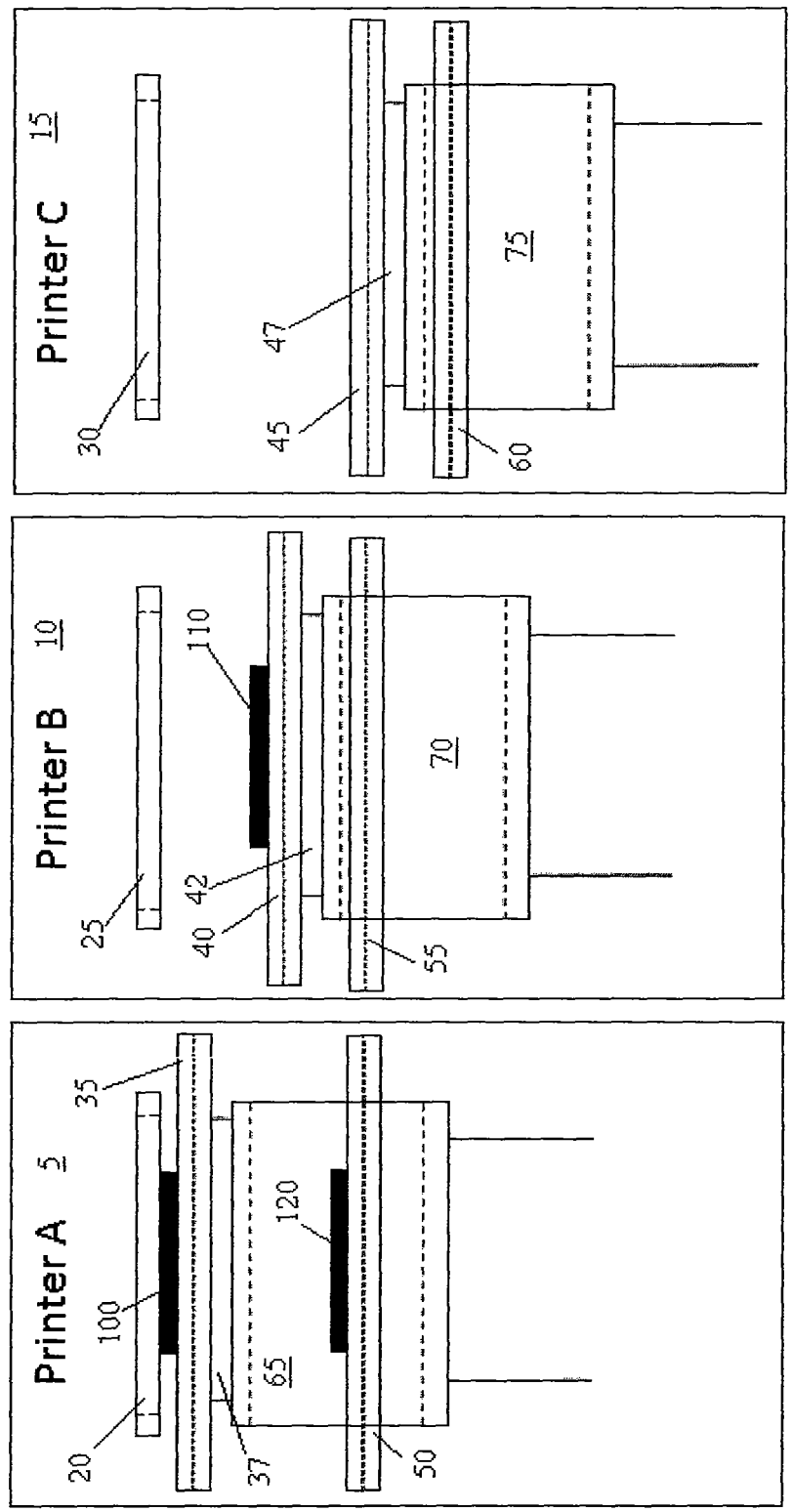

At block 204, the elevator 65 of printer 5 raises the upper and lower conveyor tracks 35 and 50 and the alignment table 37 of printer 5, such that the lower conveyor track 50 is vertically aligned with the upper conveyor track 40 of printer 10 (FIG. 3). Then, in block 206, a second PCB substrate 110 may be introduced onto the lower conveyor track 50 of printer 5, conveyed through printer 5, transferred to the upper conveyor track 40 of printer 10, and deposited on the alignment table 42 of printer 10. Alternatively, the second PCB substrate 110 may be passed through printer 10 along conveyor track 40, and onto conveyor track 45 of printer 15, with a corresponding alteration to the steps described below.

In block 208, the alignment table 37 of printer 5 aligns the PCB substrate 100 with a corresponding stencil assembly 20 and the elevator 65 of printer 5 raises the alignment table 37 to place the PCB substrate in contact with the stencil assembly 20. This results in the configuration illustrated in FIG. 4. At block 210, the substrate 100 is printed by a solder paste dispensing mechanism and squeegee associated with stencil assembly 20 (not shown). In other embodiments, solder paste or conductive ink depositing or patterning systems other than a stencil and squeegee, for example, a direct write printing head or other deposition system may be utilized on any or all of printers 5, 10, or 15.

Figure 6:
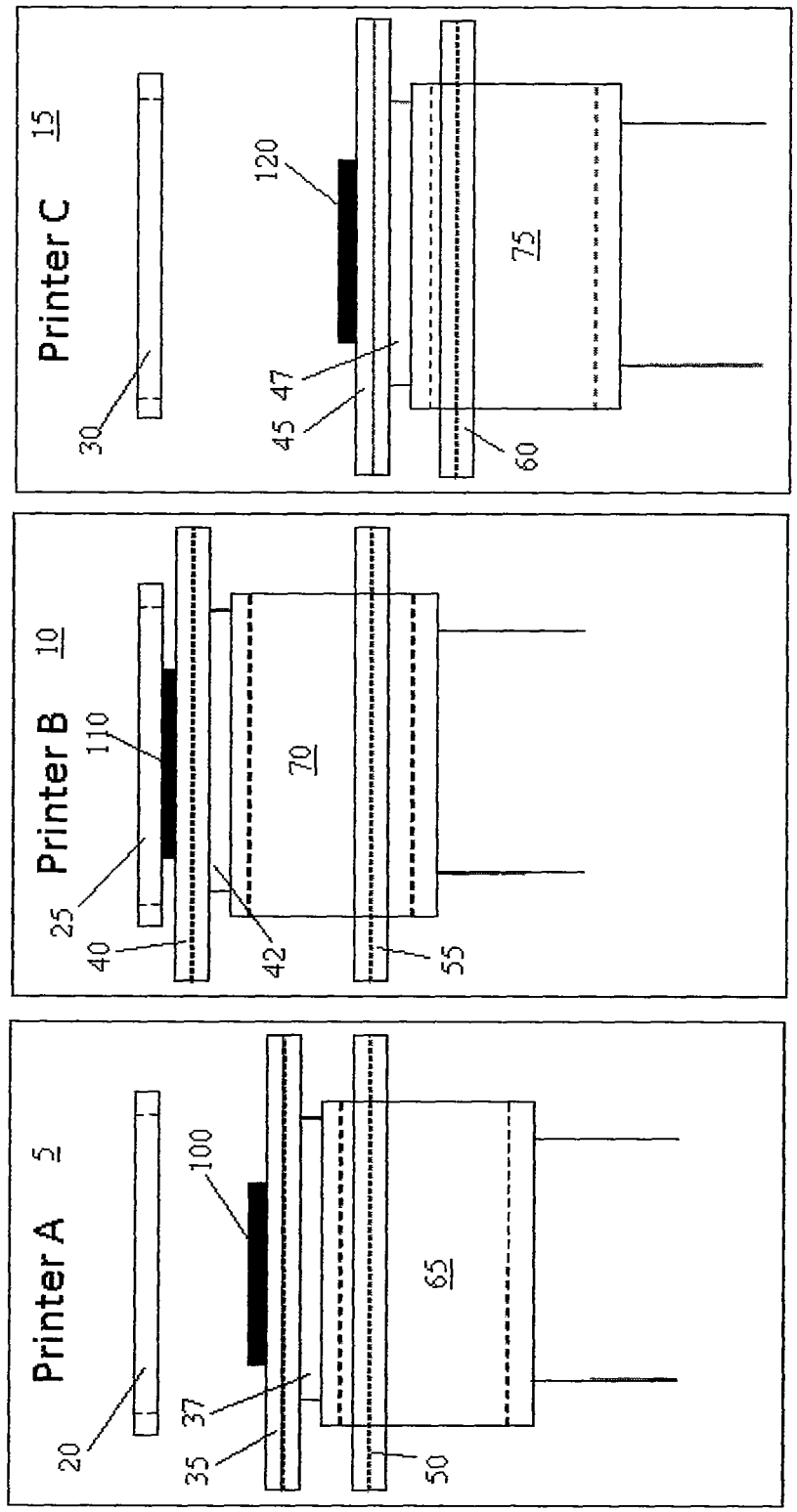

After, or in some embodiments, at the same time as, or before the substrate 100 is printed, the elevator 70 of printer 10 raises the conveyor track and alignment table assembly of printer 10 so that the lower conveyor track 55 of printer 10 is vertically aligned with the lower conveyor track 50 of printer 5 and the upper conveyor track 45 of printer 15. This allows for a third PCB substrate 120 to be loaded onto the conveyor track 45 and deposited on the alignment table 47 of printer 15 by being transferred through printers 5 and 10 by conveyor tracks 50 and 55, respectively (block 212 and FIGS. 5 and 6). Once the third substrate 120 is delivered to printer 15, the first substrate 100 may be lowered from the stencil assembly 20, and the second PCB substrate 110 may be aligned and raised into contact with the stencil assembly 25 for printing (FIG. 6 and block 214).

Figure 7:
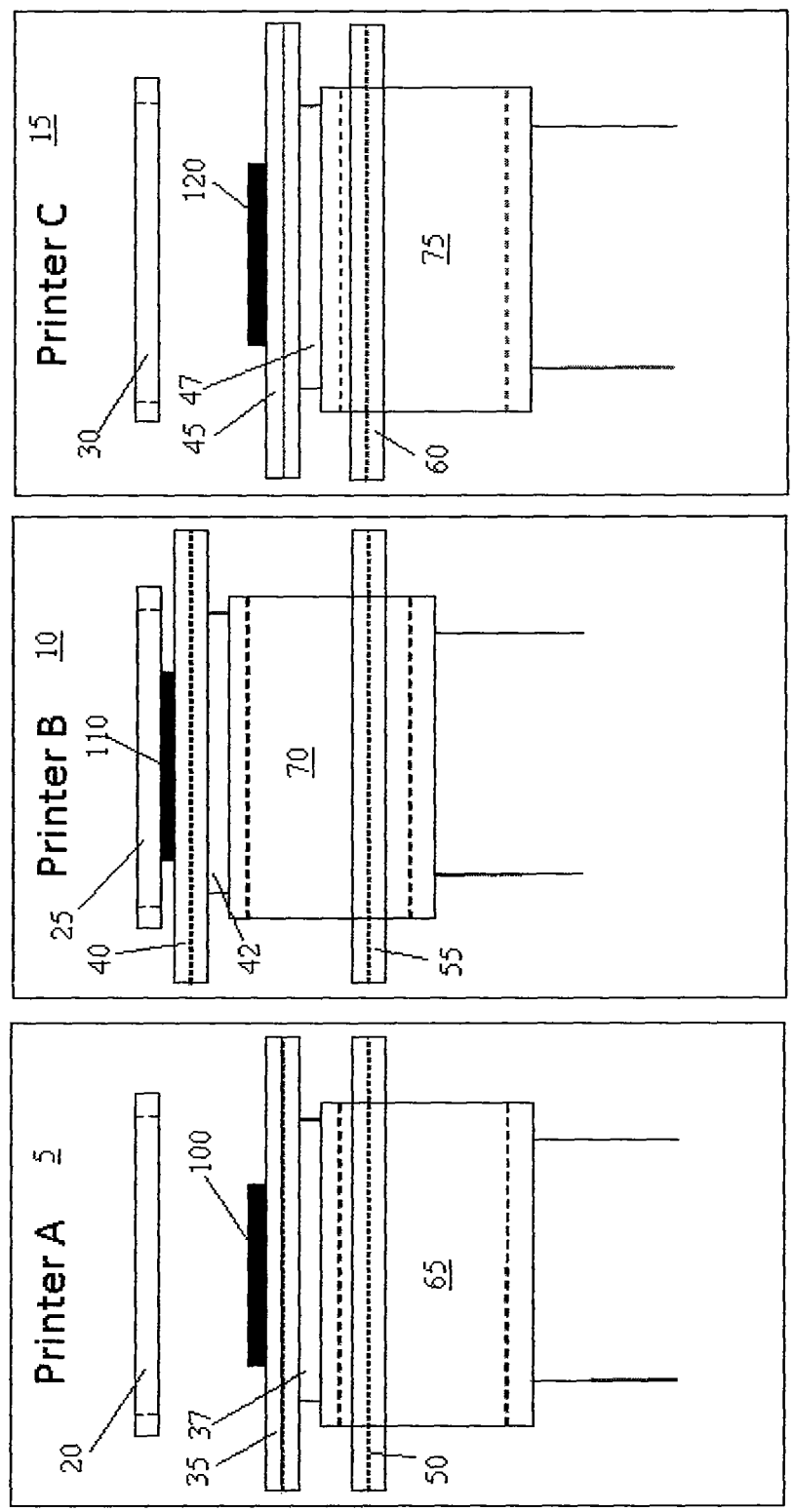
Figure 8:
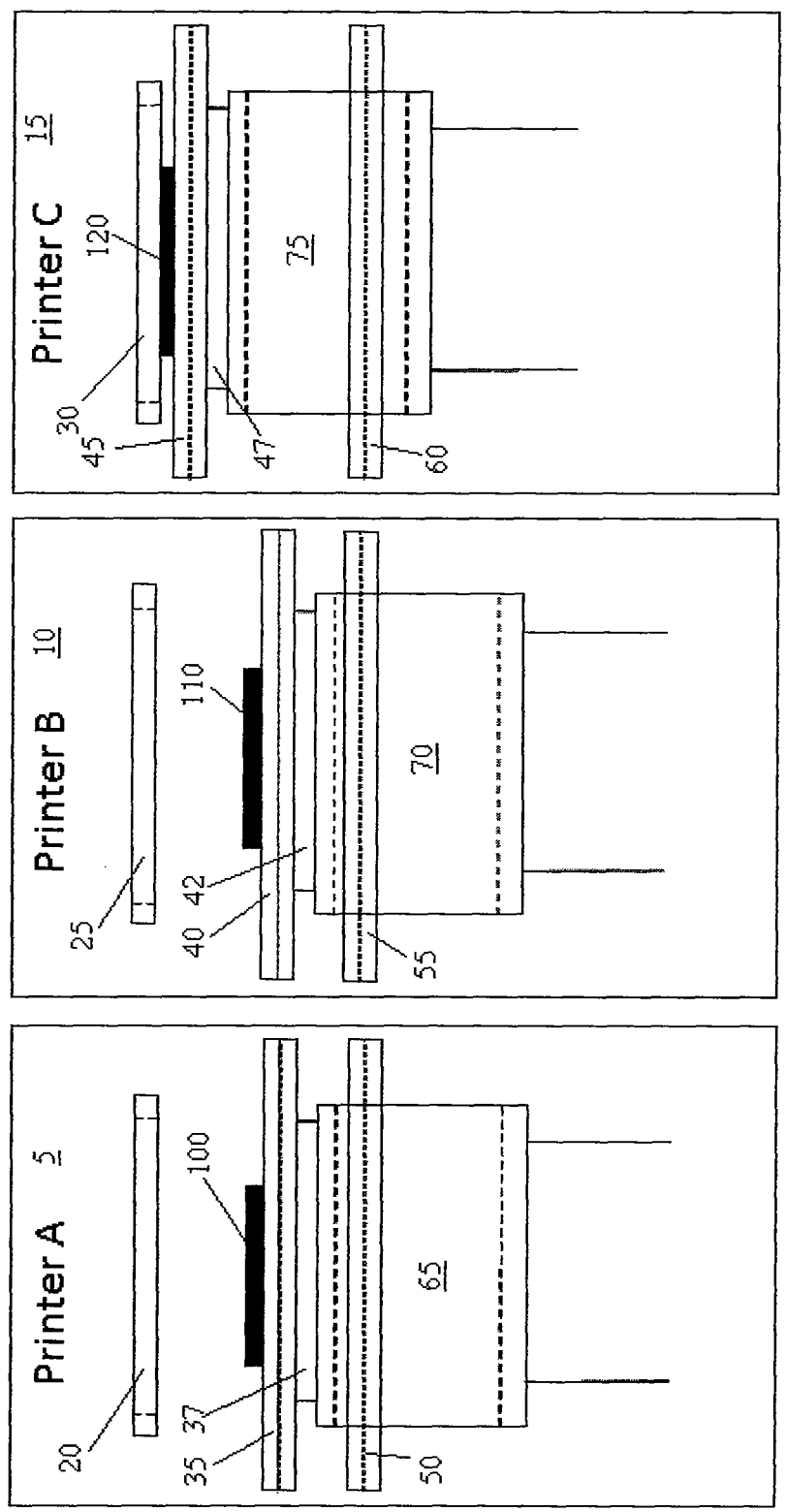

Next, the third PCB substrate 120 may be aligned and raised into contact with the stencil assembly 30 for printing. Before, during, or after alignment, raising, or printing of the third PCB substrate 120, the second PCB substrate 110 may be lowered from the stencil assembly 25 (FIGS. 7 and 8 and blocks 216 and 218).

Figure 9:
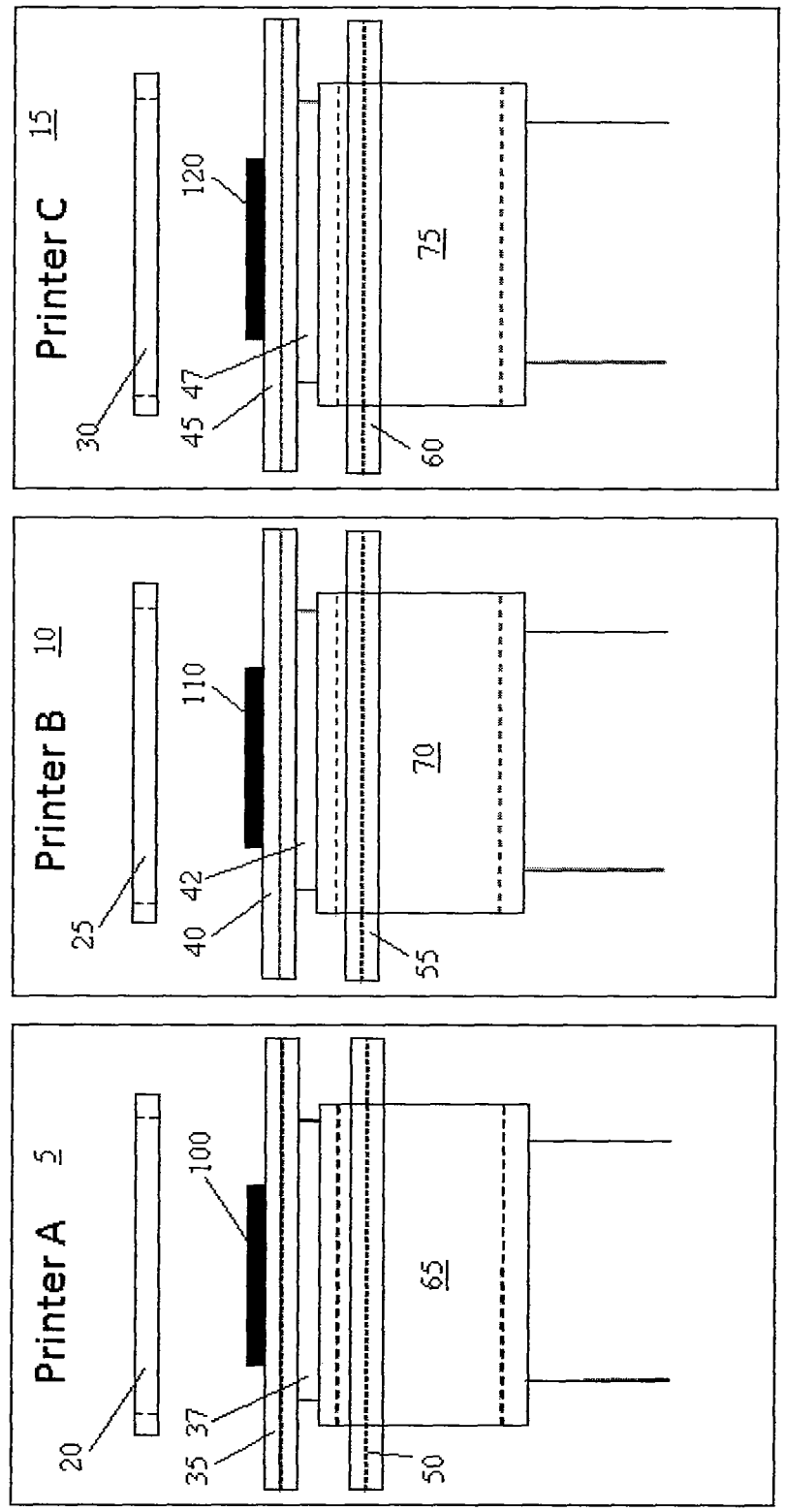
Figure 10:
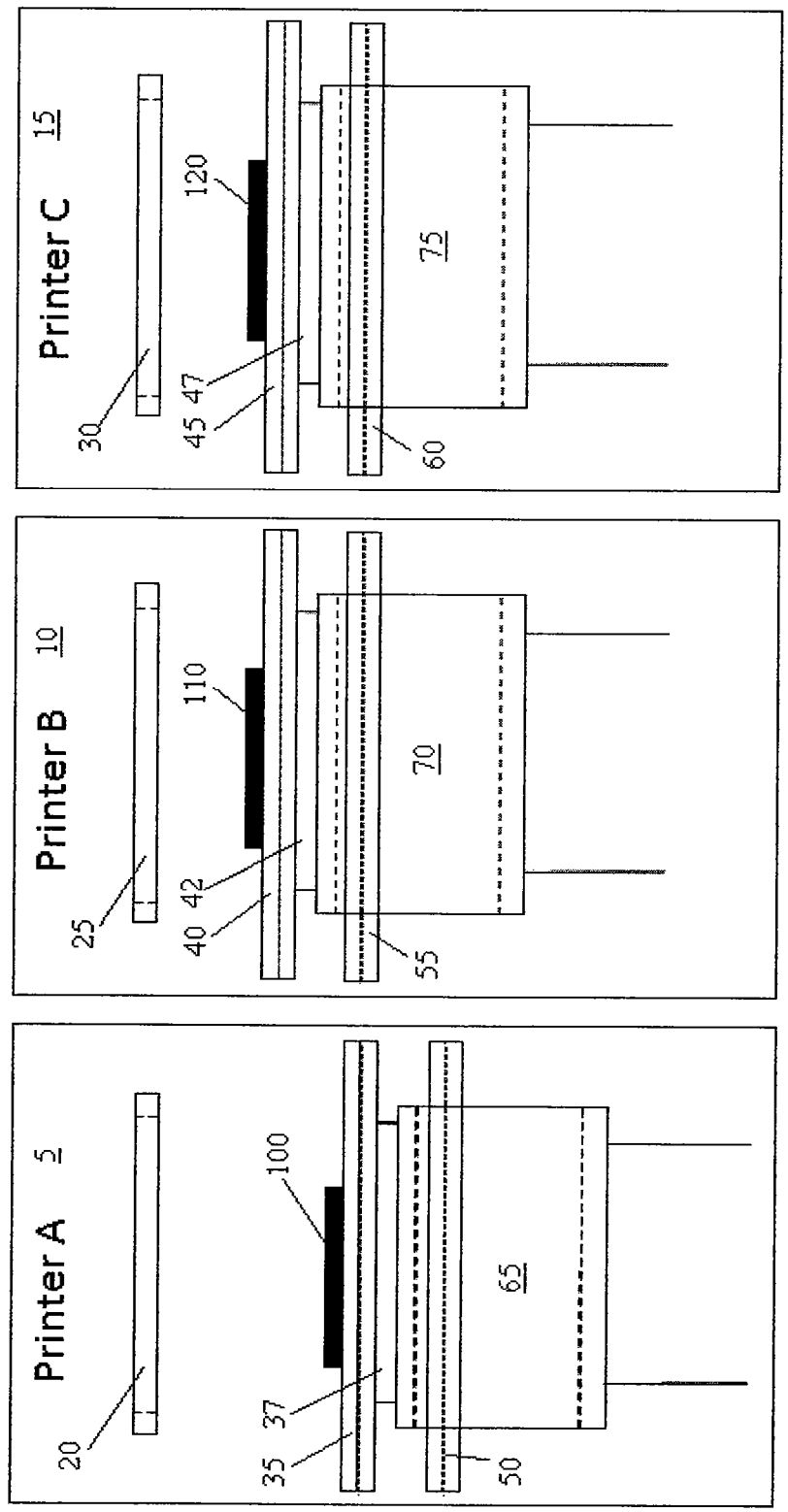

After printing of the third PCB substrate 120, the third PCB substrate 120 is lowered from the stencil assembly 30 such the lower conveyor track 60 of the third printer 15 is vertically aligned with the lower conveyor track 55 of the second printer 10 (FIG. 9 and block 220). Concurrent with, before, or after the lowering of the third PCB substrate 120, the elevator 65 of the first printer 5 lowers the upper and lower conveyor tracks 35 and 50, such that the upper conveyor track 35 is vertically aligned with the lower conveyor tracks 55 and 60 of printers 10 and 15, respectively (FIG. 10 and block 222). At this point the first PCB substrate 100 may be removed from the printer 5 and carried through printers 10 and 15 on lower conveyor tracks 55 and 60, respectively (block 224). In alternate embodiments, the first PCB substrate 100 may be removed in a different direction along a conveyor track other than conveyor tracks 55 or 60. The first substrate 100 may then proceed to another downstream piece of equipment, for example, a pick and placement machine or an inspection or rework station. In alternate embodiments, the first PCB substrate 100 may be removed from printer 5 in the same direction it was introduced (an upstream direction). In some embodiments, if defects are detected on the PCB substrate by an inspection system associated with the printer 5, the PCB may be sent to a manual inspection or a repair station instead of proceeding normally through the rest of the production line. Any subsequently processed PCBs printed and removed from any printer may also be removed from the printer in a forward or reverse direction or onto a different piece of equipment, using, e.g., a cross conveyor for redirecting the path of the PCB substrate to, for example, an inspection or a repair station.

It is noted that the sequence of steps described above is only exemplary, and in different embodiments, these steps may be performed in different orders, or with different timing, and one or more steps may be added or eliminated from the process flow described. Also, the raising and lowering of the various elevators described herein may be performed in different orders and with different timing than described. The same holds true for the remaining steps described below.

Figure 11:
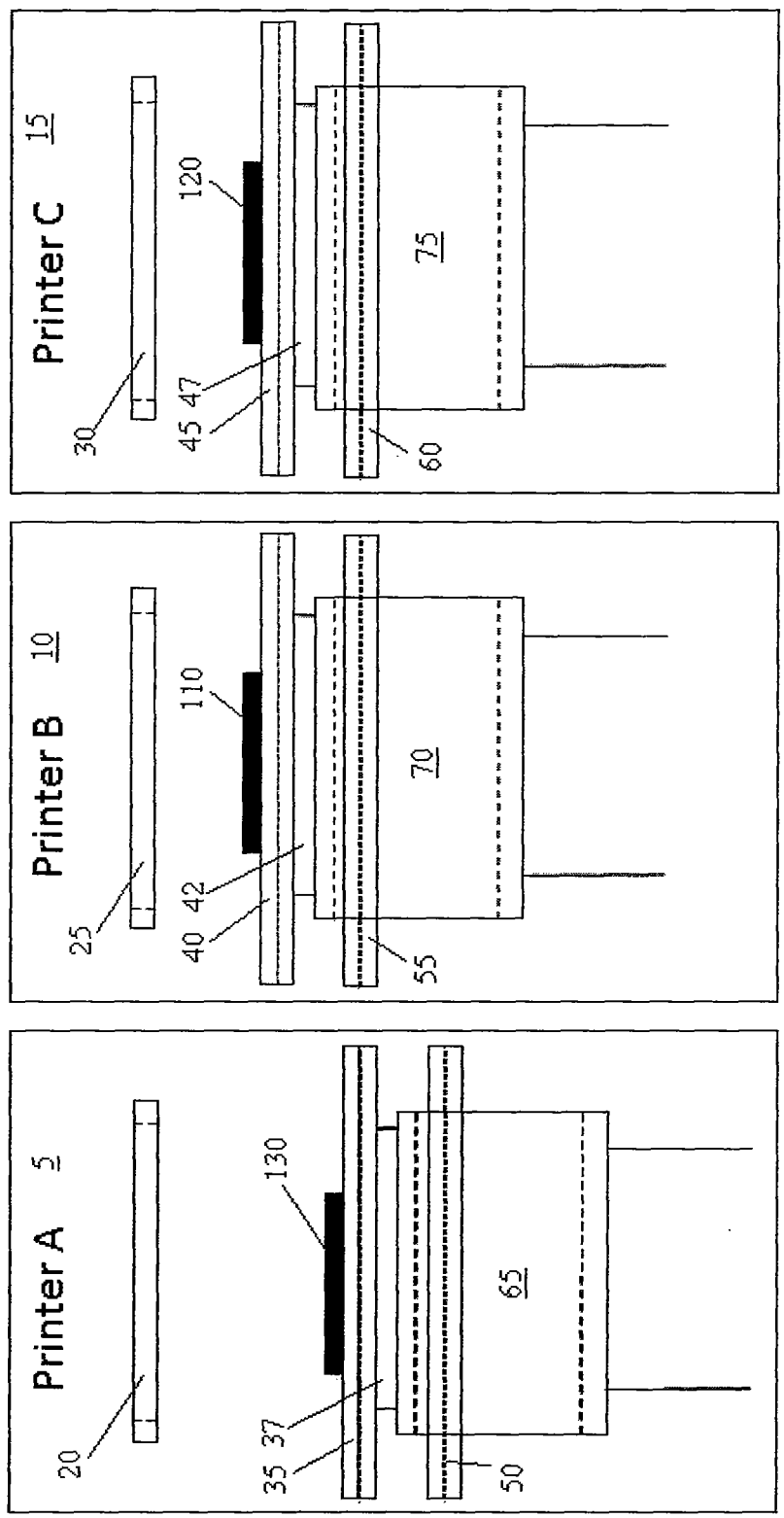
Figure 12:
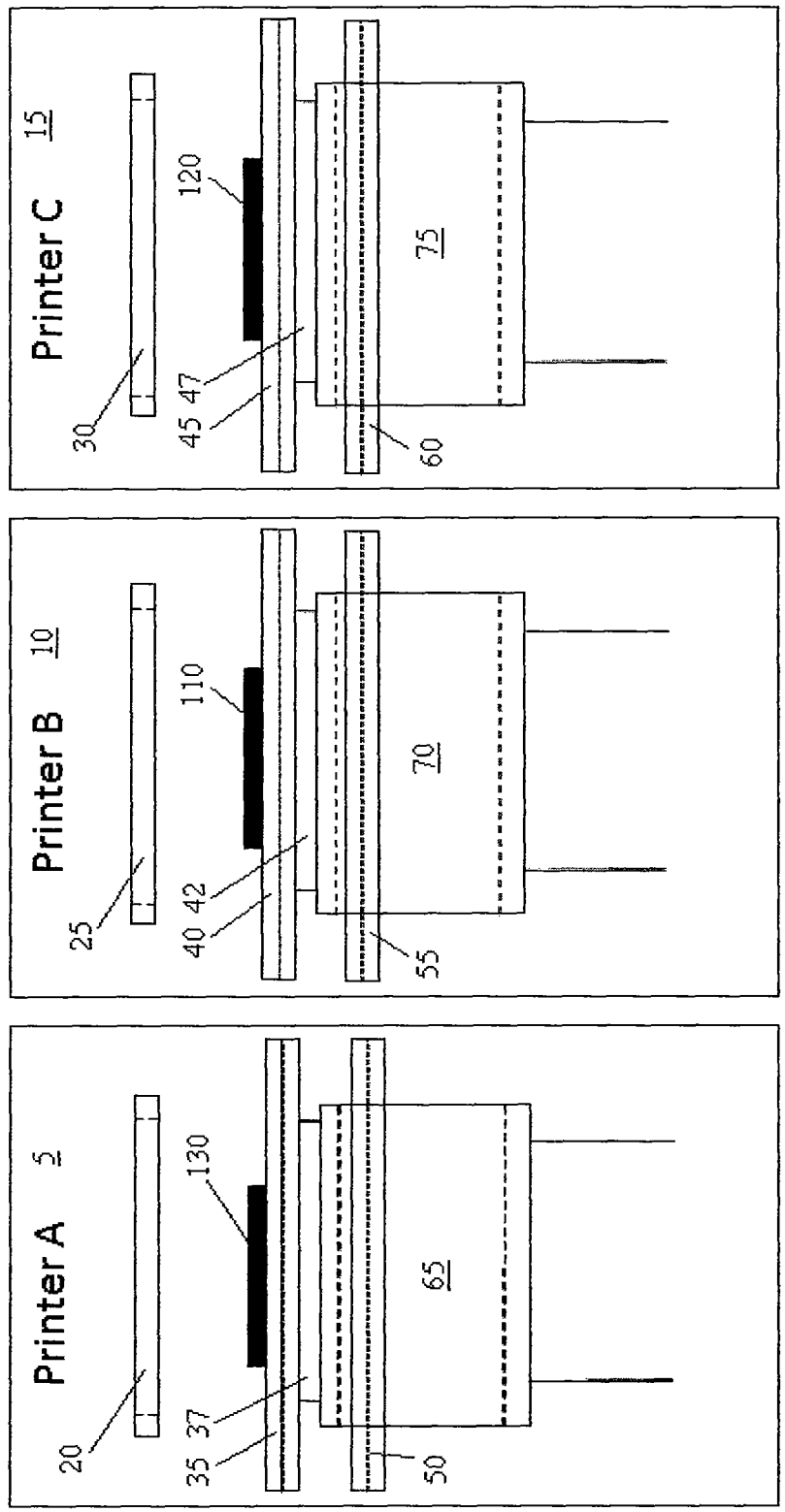
Figure 13:
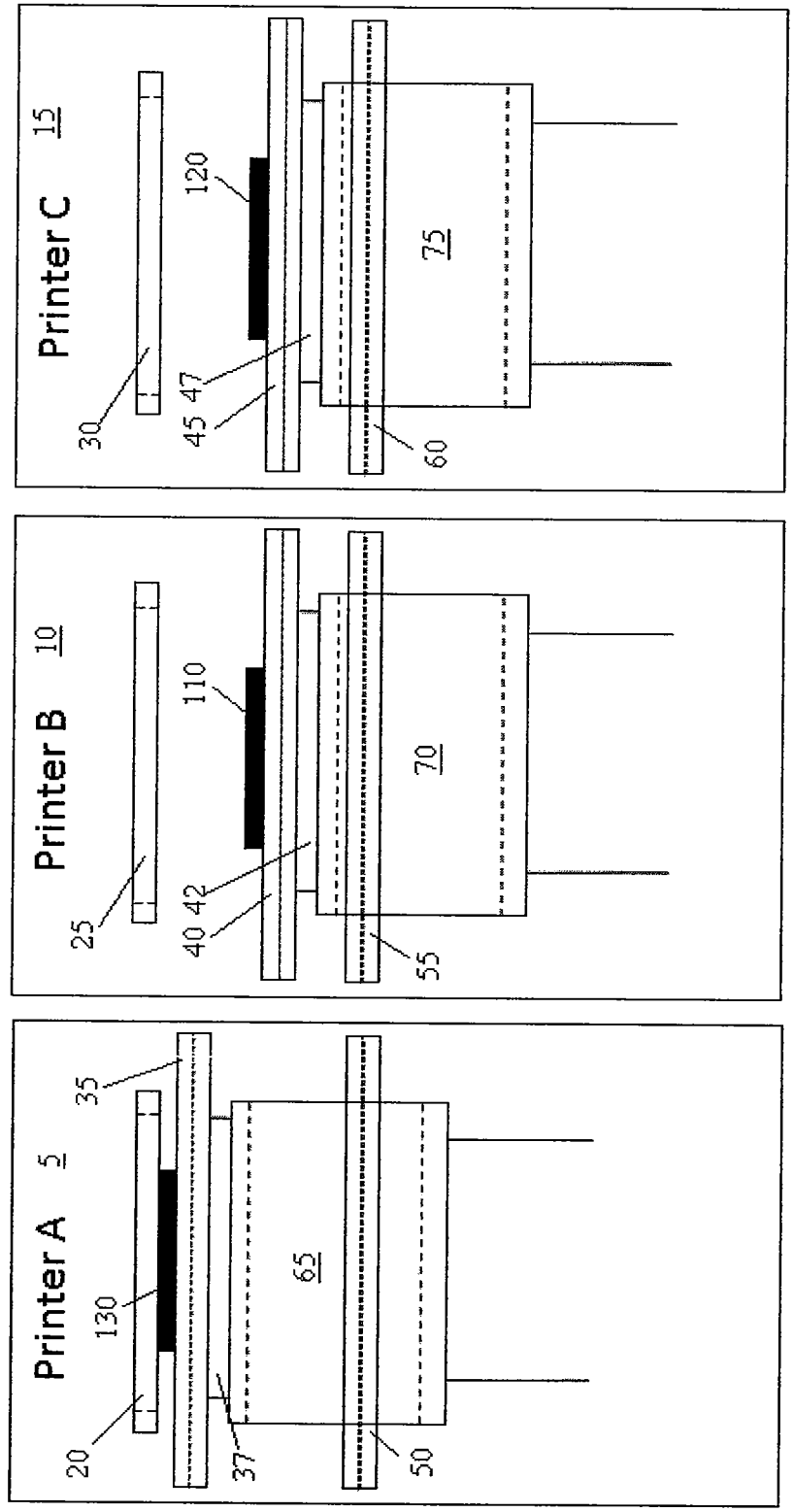
Figure 14:
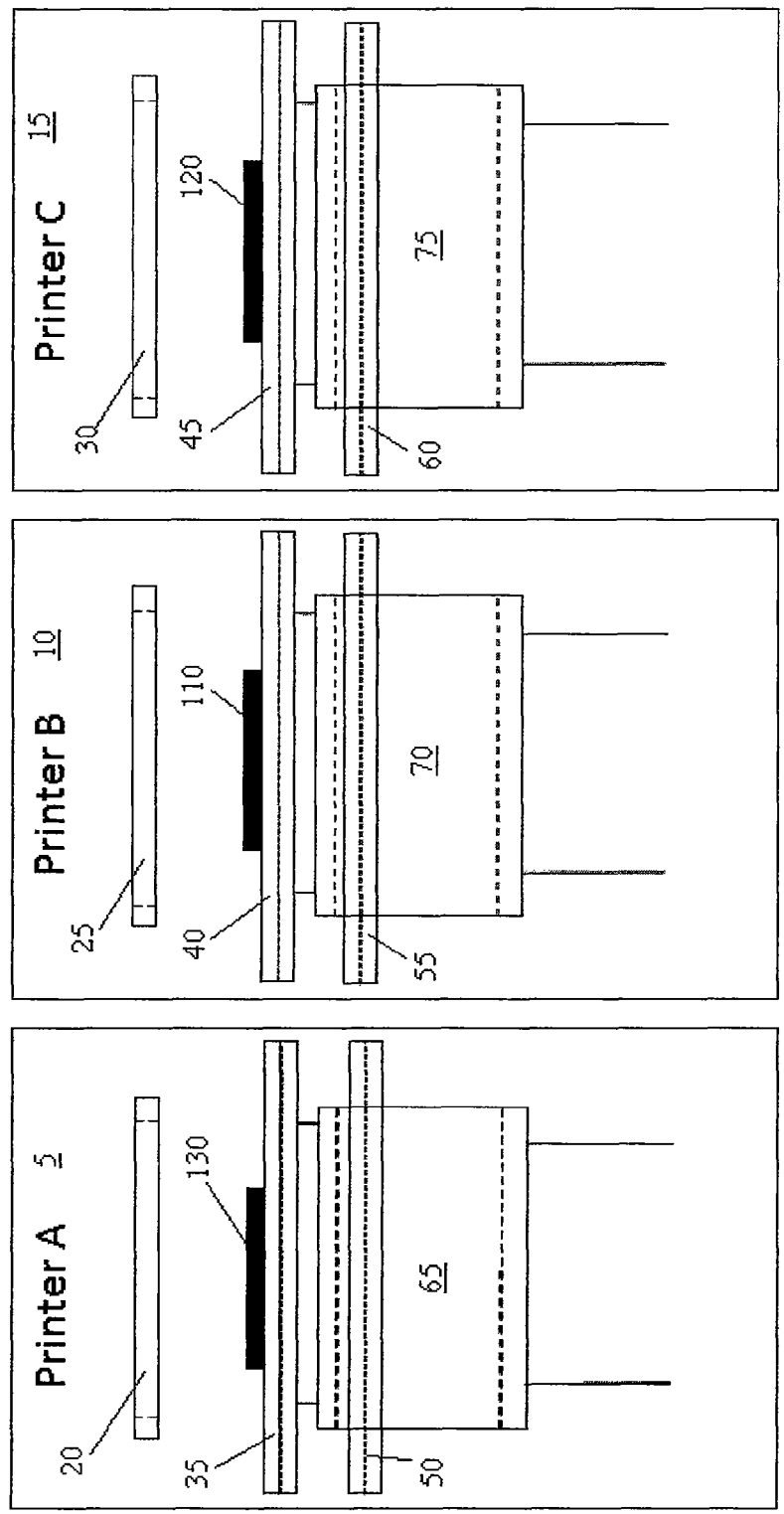
Figure 15:
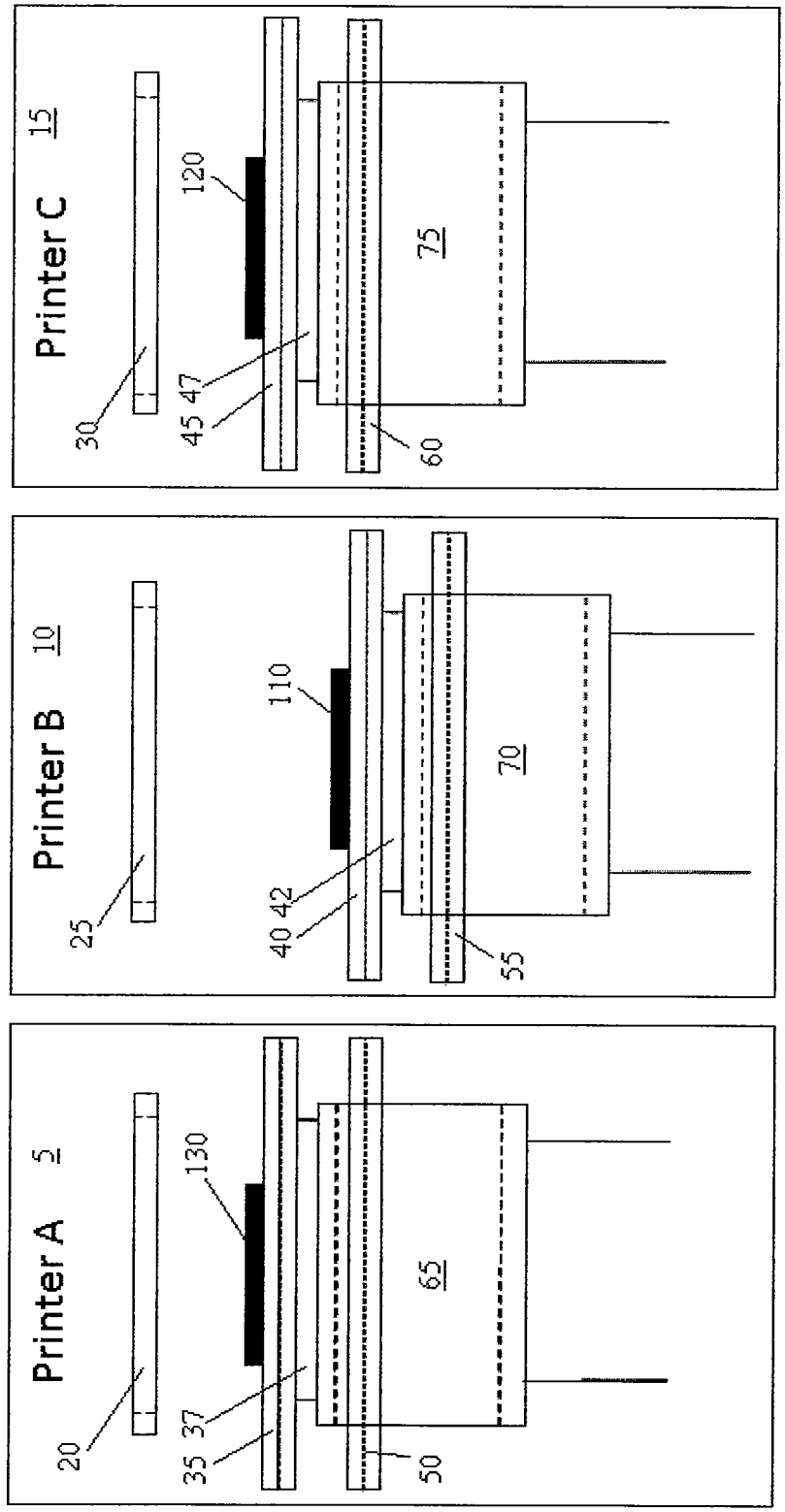

Once the first PCB substrate 100 is removed from the first printer 5, or in some embodiments, during the process of removal of the first substrate 100, a fourth PCB substrate 130 may be introduced to printer 5 along conveyor track 35 in a similar manner as the transfer of PCB substrate 100 to printer 5 (FIG. 11 and block 226). The fourth PCB substrate 130 may then be aligned, raised into contact with the stencil assembly 20 of printer 5, printed upon, and lowered (FIGS. 12-14 and blocks 228 and 230). Before, during, or after the printing of the fourth PCB substrate 130, the elevator 70 of the second printer 10 may lower the upper and lower conveyor tracks 40 and 55, such that the upper conveyor track 40 is vertically aligned with the lower conveyor tracks 50 and 60 of printers 5 and 15, respectively (FIG. 15 and block 232). At this point, the second PCB substrate 110 may be removed from the printer 10 by being carried through one of printers 5 and 15 on one of lower conveyor tracks 50 and 60, respectively (block 234). The second PCB substrate 110 may then proceed to another piece of equipment, for example, a pick and placement machine or an inspection or rework station. In alternate embodiments, the second PCB substrate 110 may be removed in a different direction along a conveyor track other than conveyor tracks 50 or 60 and/or onto a different piece of equipment using, e.g., a cross conveyor for redirecting the path of the PCB substrate to, for example, an inspection or a repair station.

Figure 16:
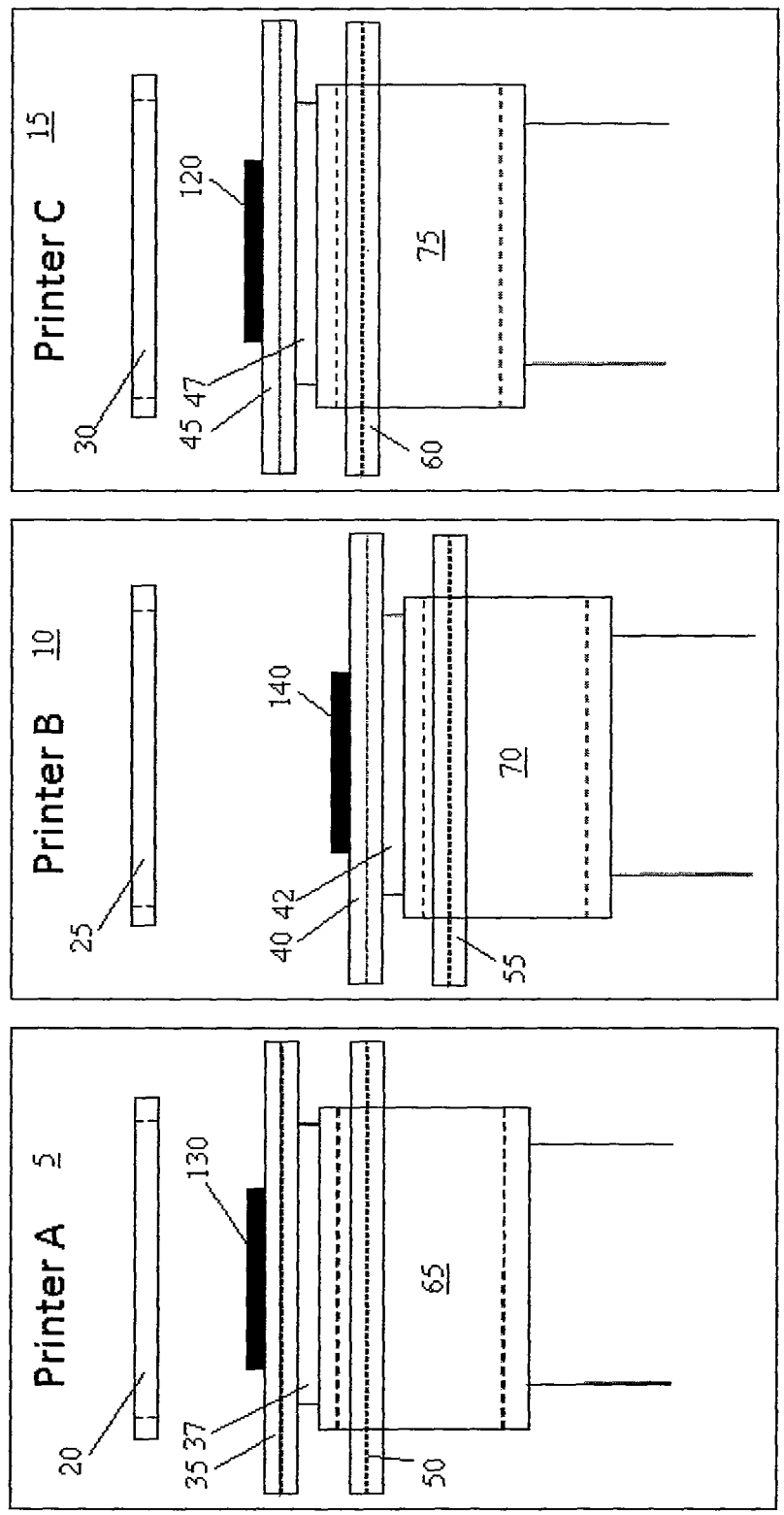
Figure 17:
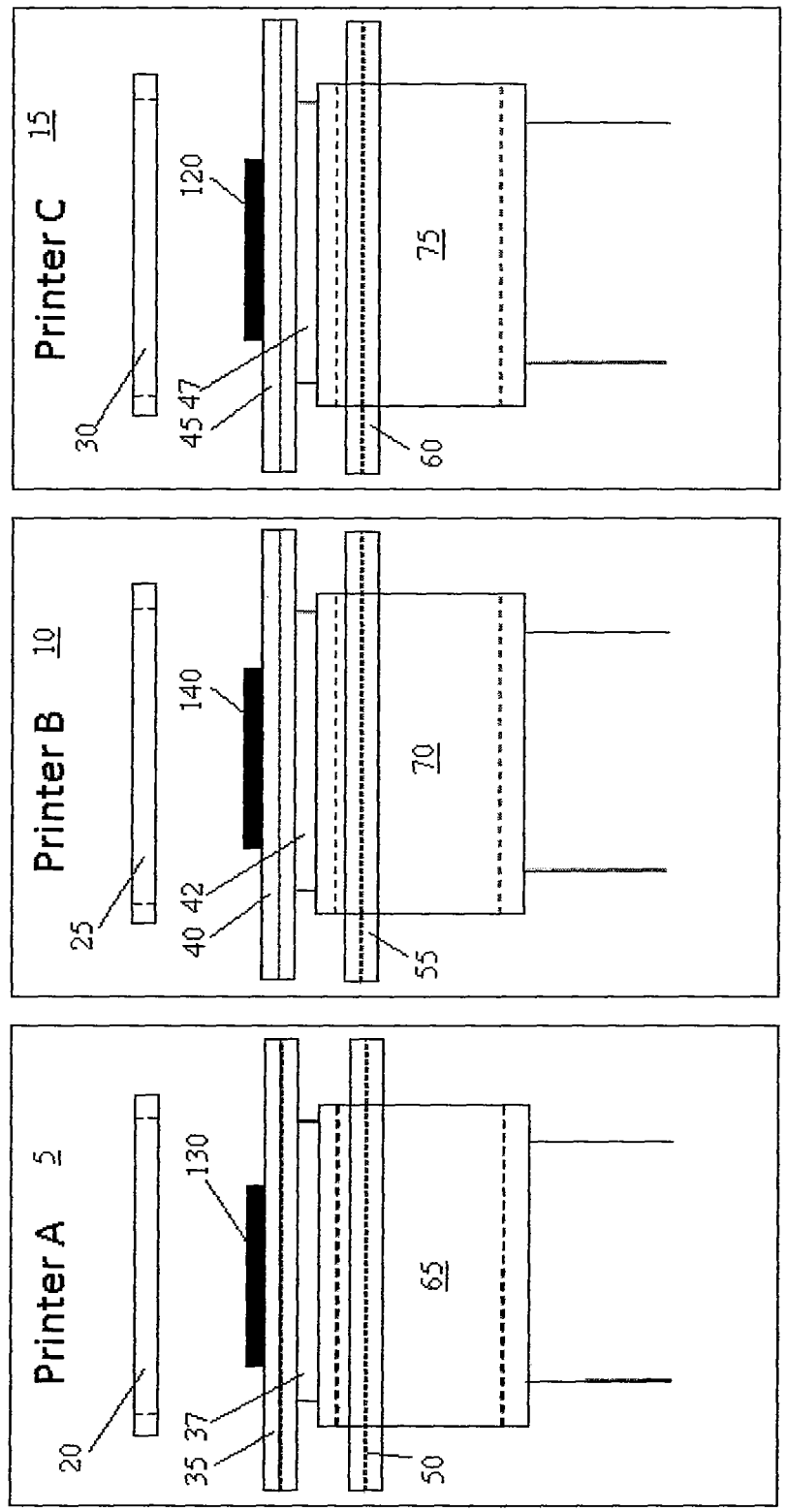
Figure 18:
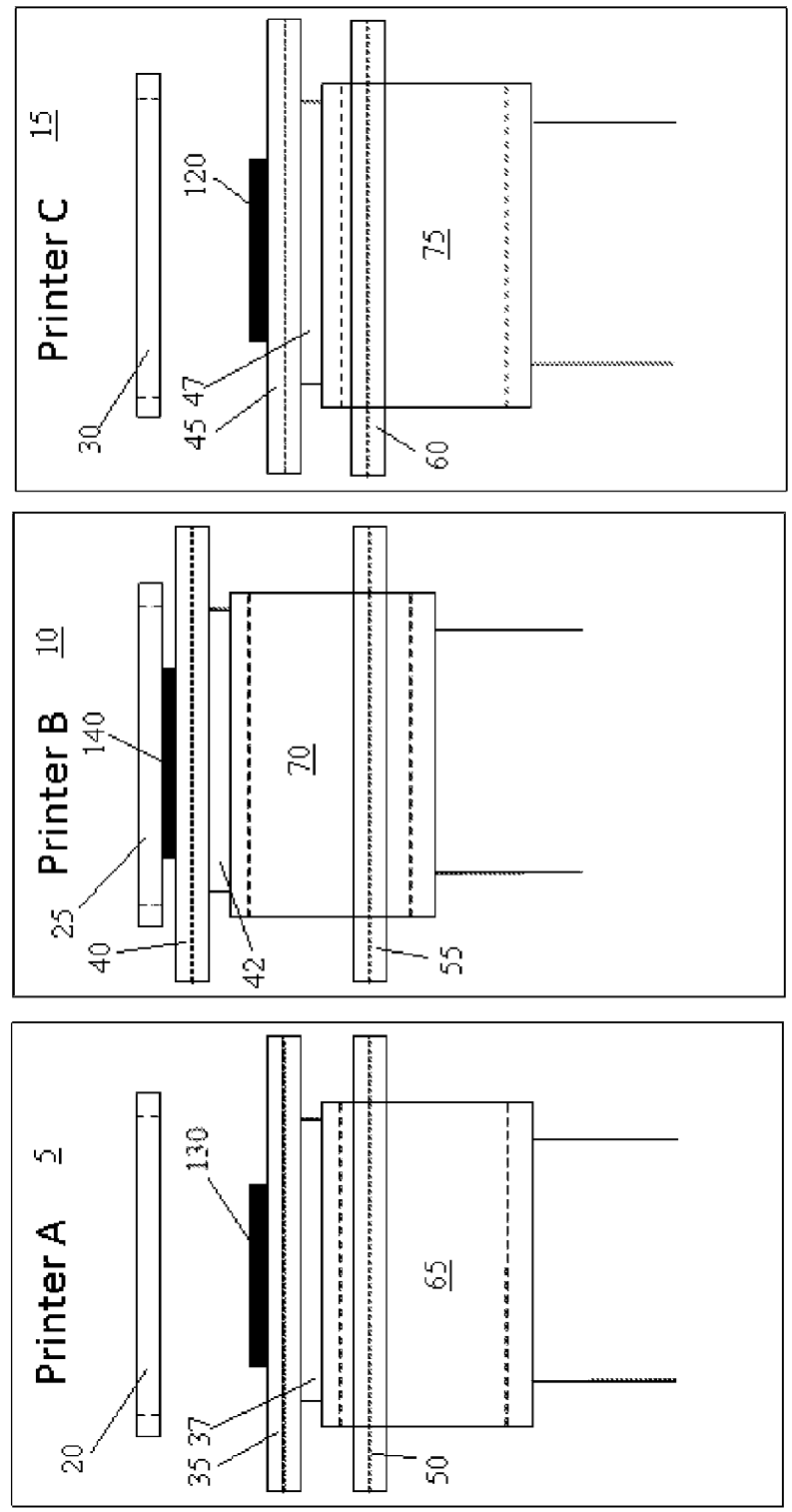
Figure 19:
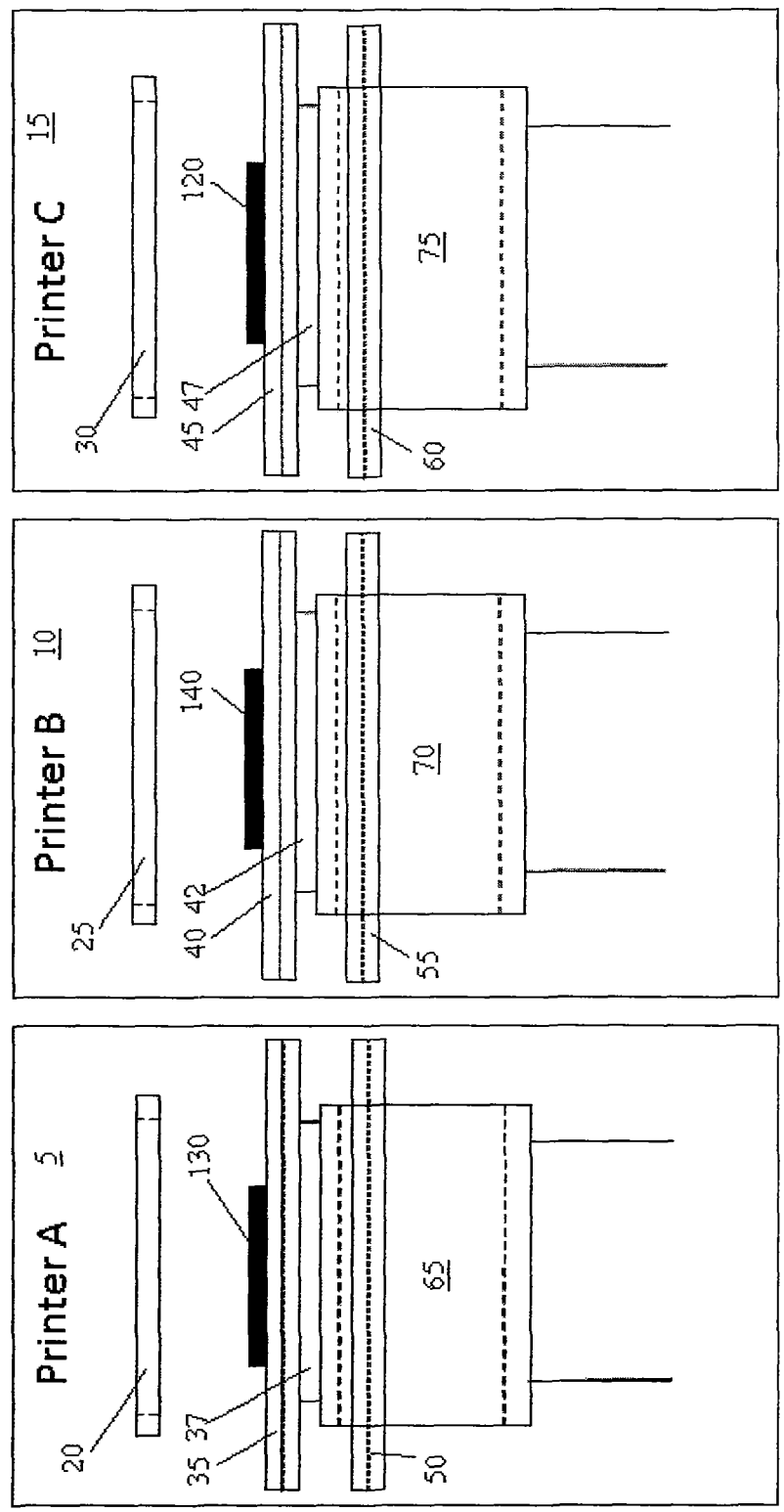
Figure 20:
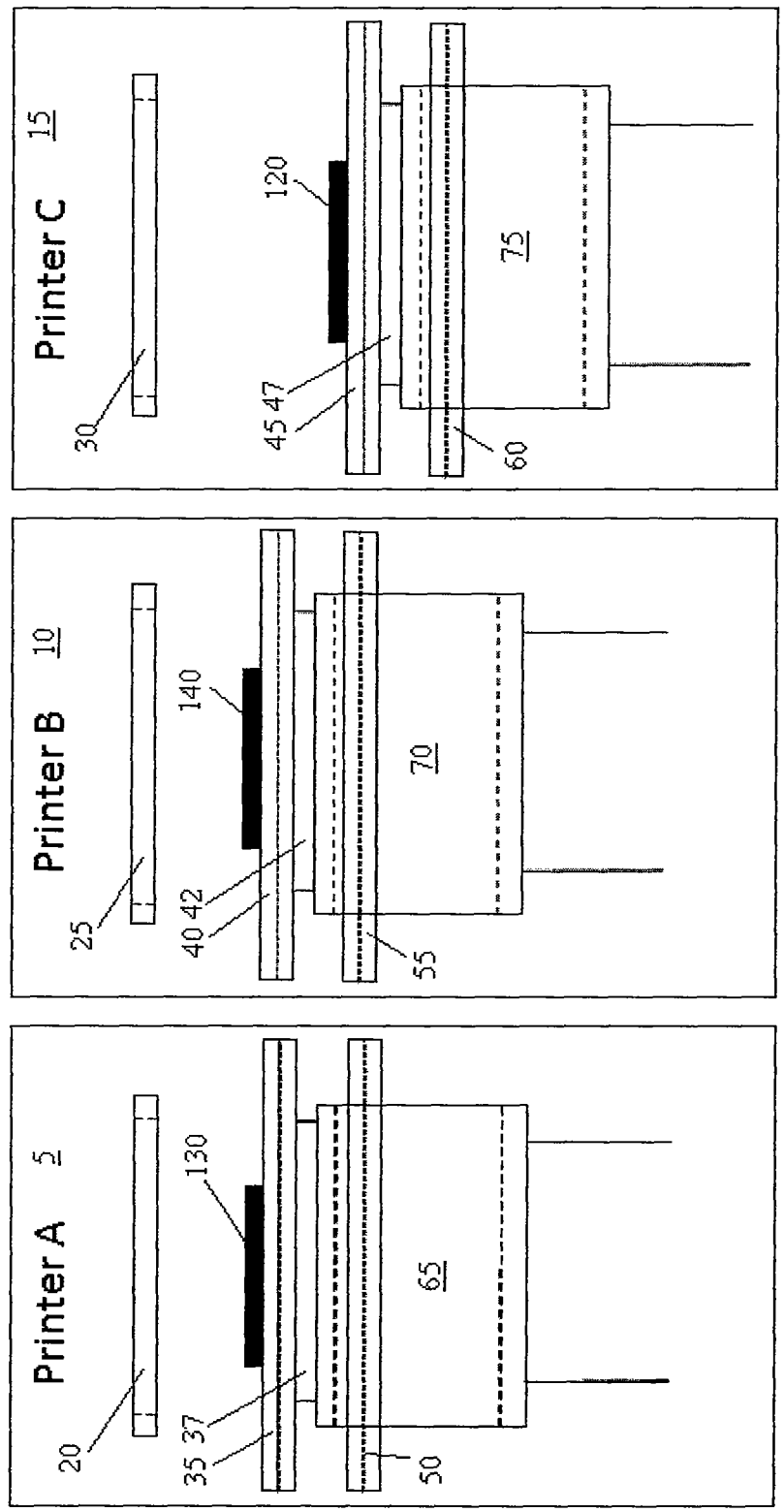

Once the second PCB substrate 110 is removed from the second printer 10, or in some embodiments, during the process of removal of the second substrate 110, a fifth PCB substrate 140 may be introduced to printer 10 along conveyor tracks 50 and 40 (FIG. 16 and block 236). The fifth PCB substrate 140 may then be aligned, raised into contact with the stencil assembly 25 of printer 10, printed upon, and lowered (FIGS. 17-19 and blocks 238 and 240). Before, during, or after the printing of the fifth PCB substrate 140, the elevator 75 of the third printer 15 may lower the upper and lower conveyor tracks 45 and 60, such that the upper conveyor track 45 is vertically aligned with the lower conveyor tracks 50 and 55 of printers 5 and 10, respectively (FIG. 20 and block 242). At this point, the third PCB substrate 120 may be removed from the printer 15 along conveyor track 45 onto a downstream piece of equipment or by being carried through printers 5 and 10 on lower conveyor tracks 50 and 55, respectively (block 244). The third PCB substrate 120 may proceed to another piece of equipment, for example a pick and placement machine or an inspection or repair station. In alternate embodiments, the third PCB substrate 120 may be removed in a different direction along a conveyor track other than conveyor tracks 50 or 55 and onto a different piece of equipment, for example an inspection or repair station.

Figure 21:
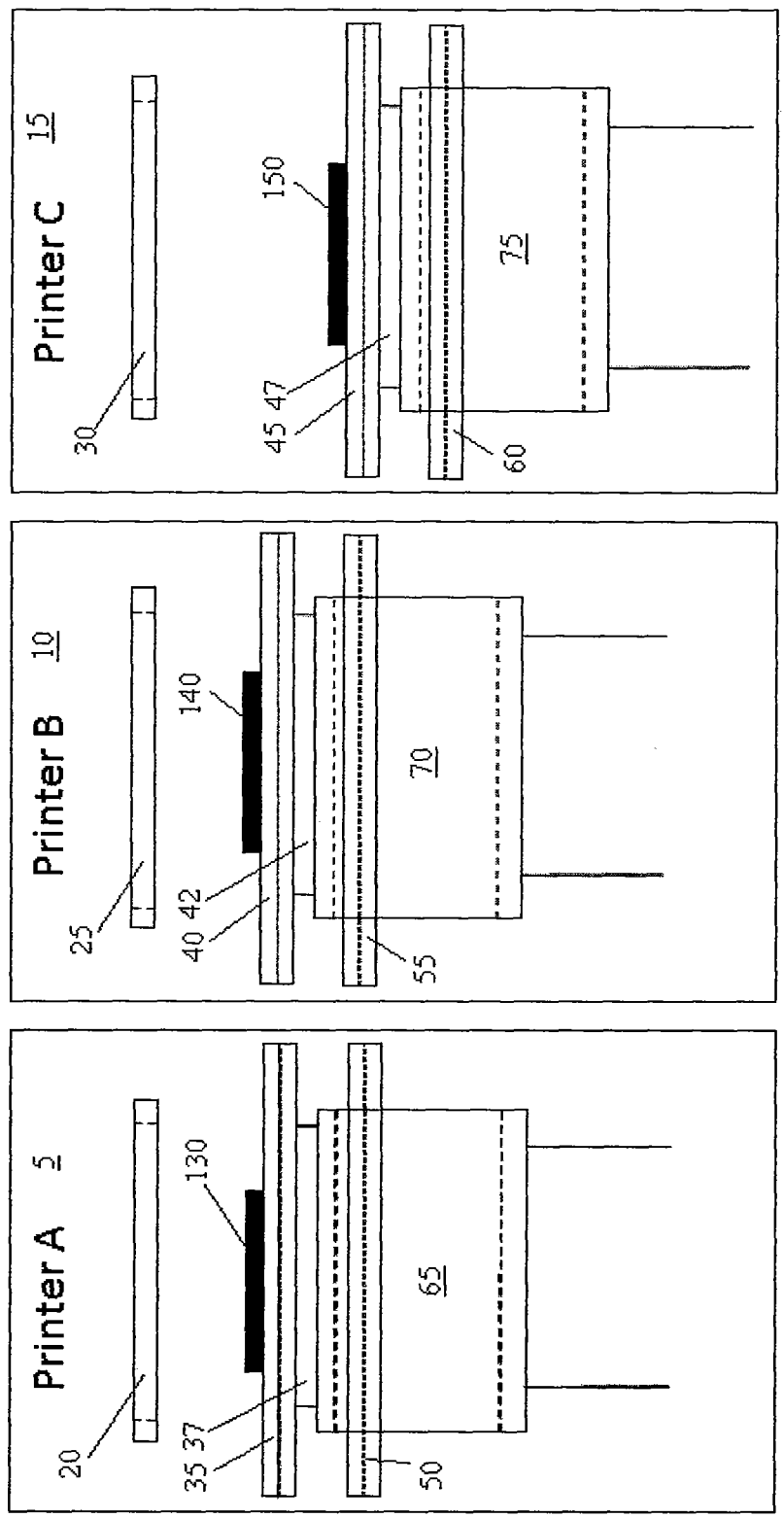
Figure 22:
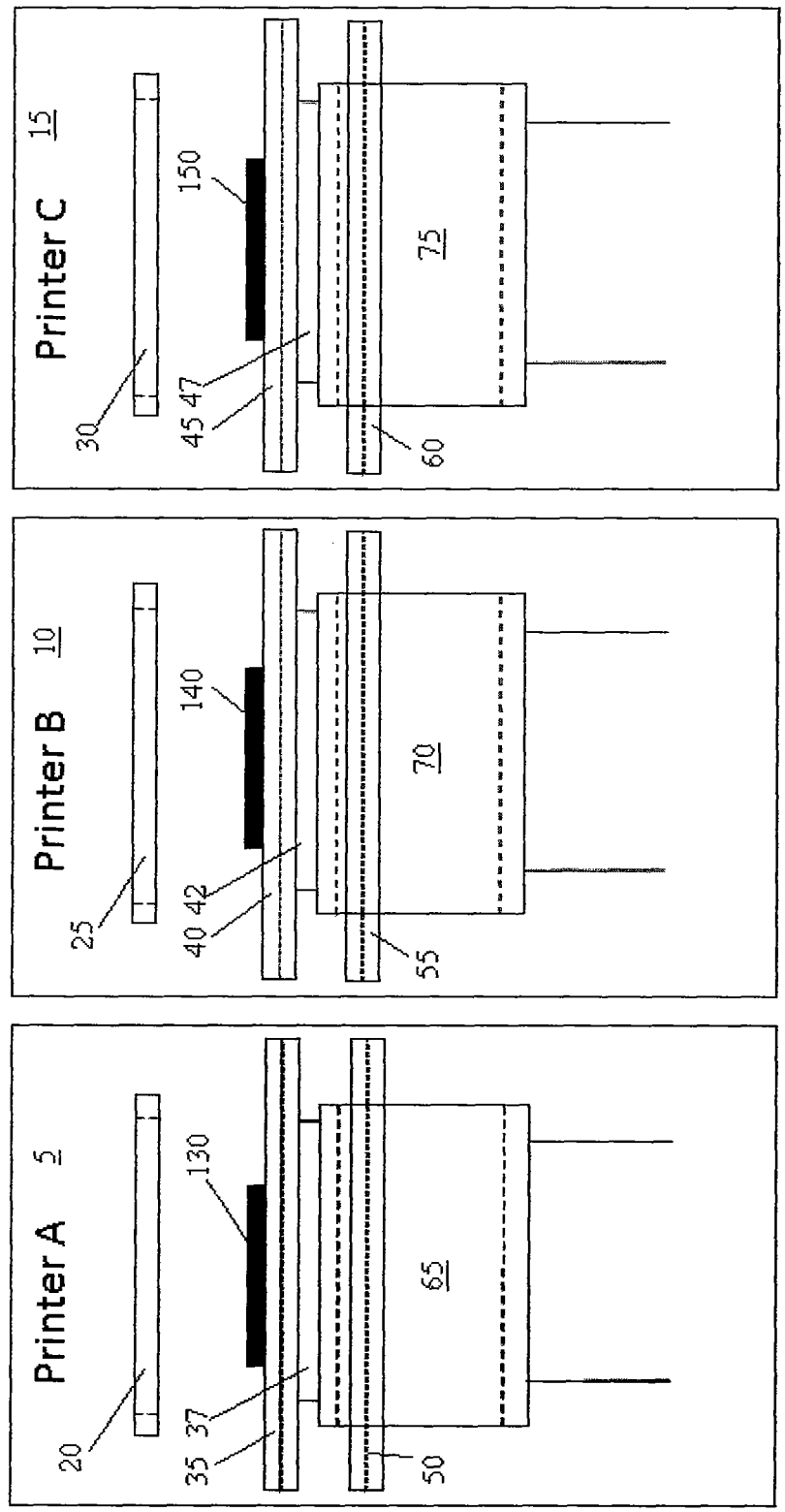
Figure 23:
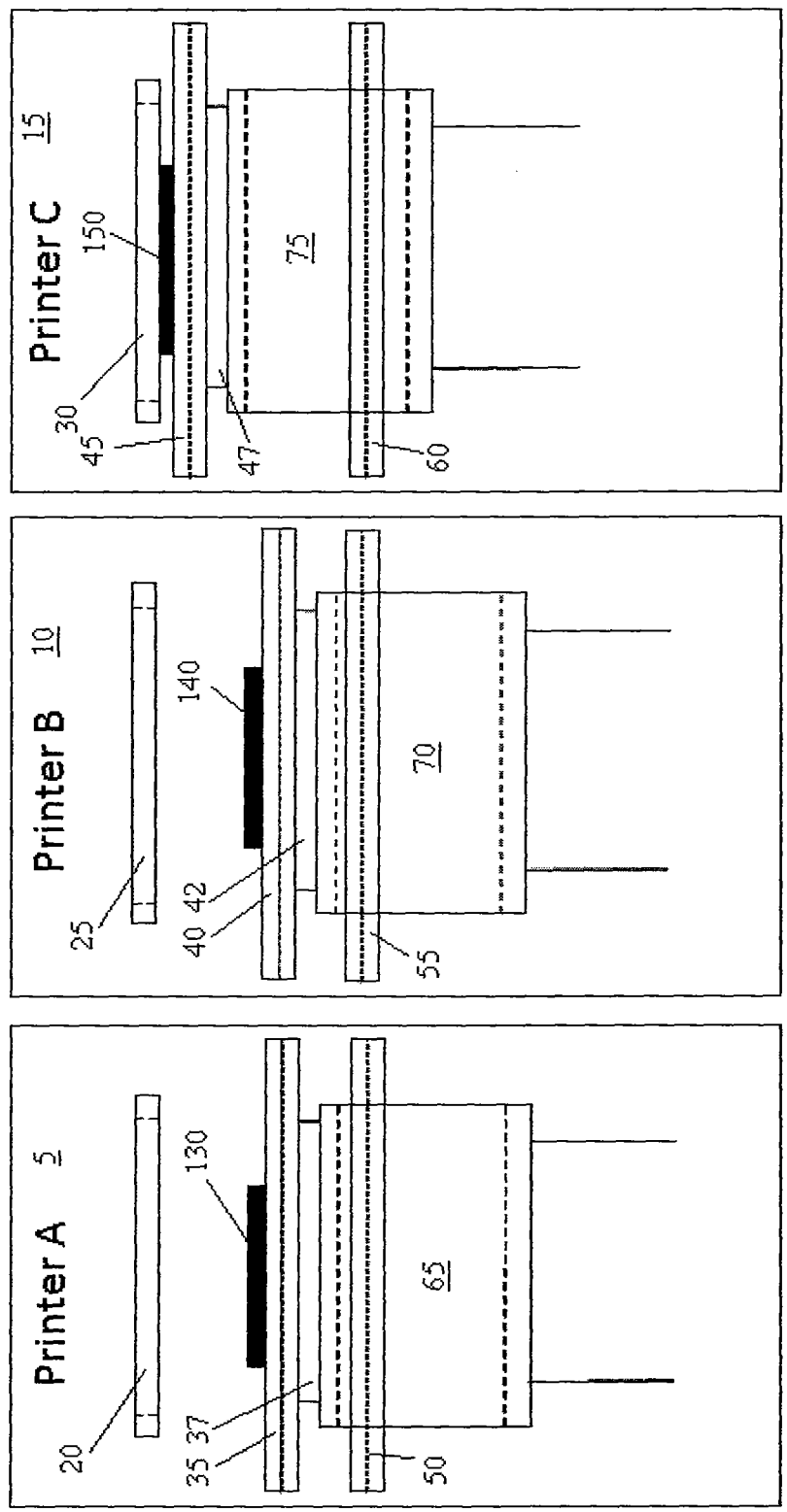
Figure 24:
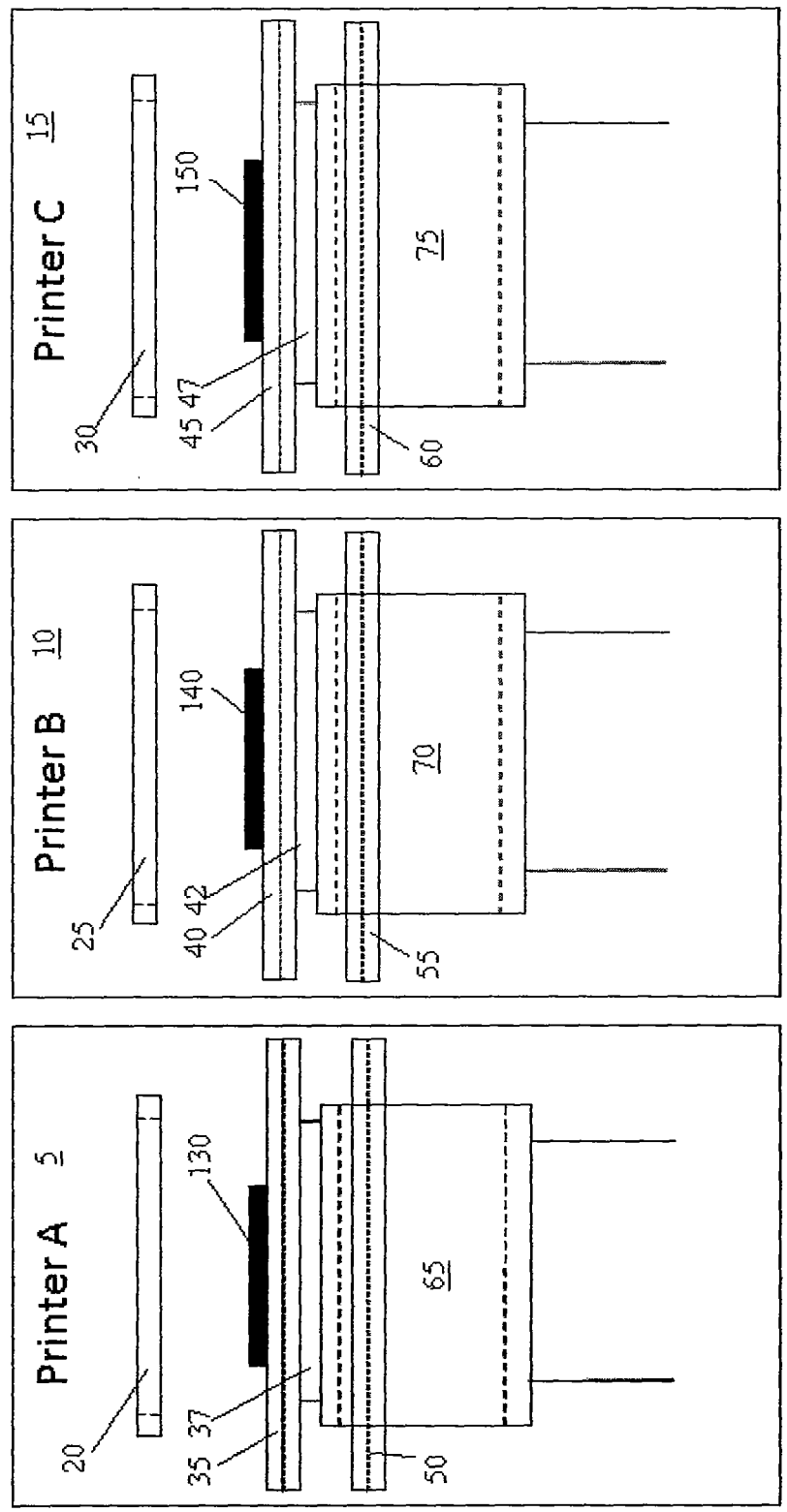
Figure 25:
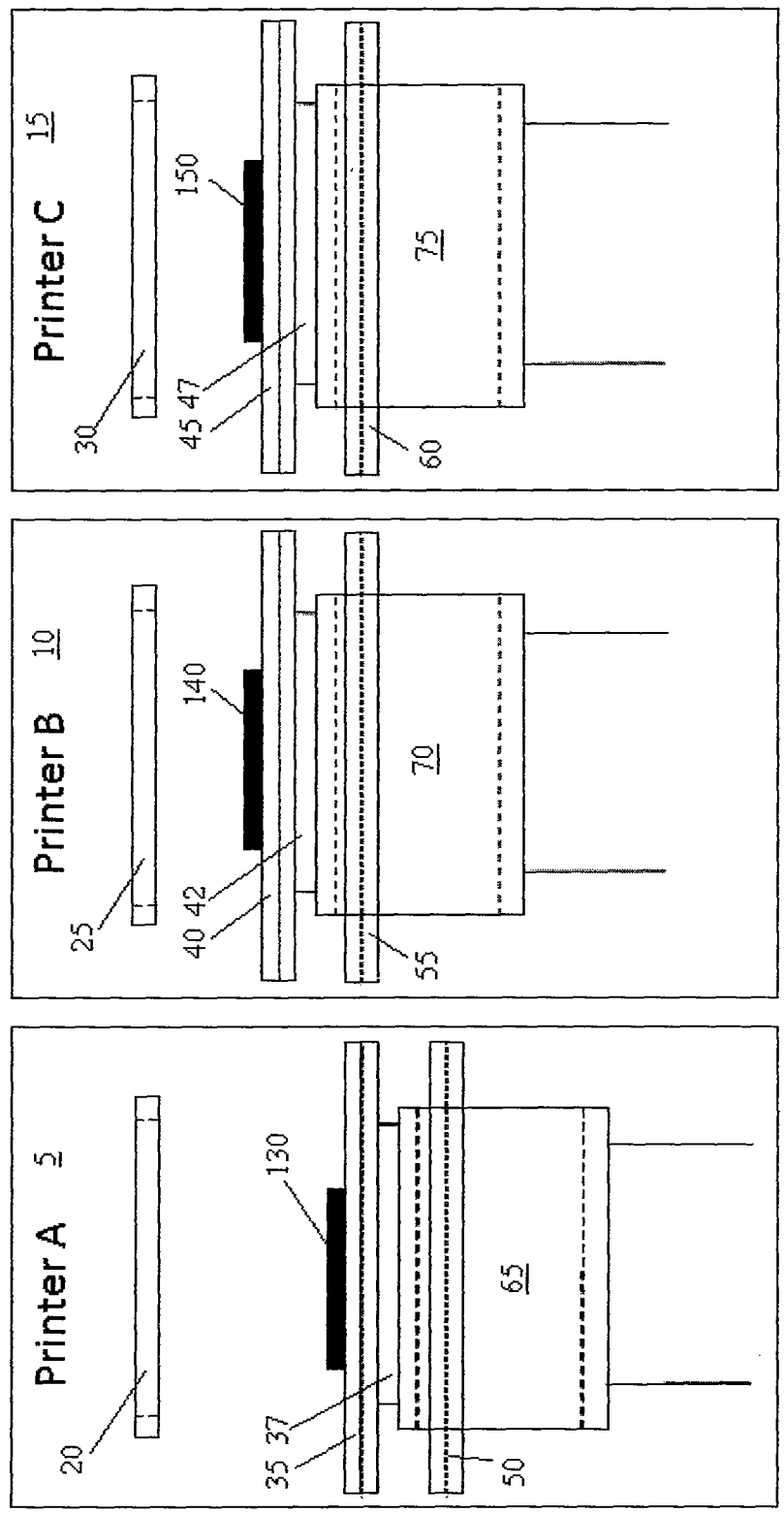

Once the third PCB substrate 120 is removed from the third printer 15, or in some embodiments, during the process of removal of the third substrate 120, a sixth PCB substrate 150 may be introduced to printer 15 along conveyor tracks 50, 55, and 45 (FIG. 21 and block 246). The sixth PCB substrate 150 may then be aligned, raised into contact with the stencil assembly 30 of printer 15, printed upon, and lowered (FIGS. 22-24 and blocks 248 and 250). Before, during, or after the printing of the sixth PCB substrate 150, the elevator 65 of the first printer 5 may lower the upper and lower conveyor tracks 35 and 50, such that the upper conveyor track 35 is vertically aligned with the lower conveyor tracks 55 and 60 of printers 10 and 15, respectively (FIG. 25 and block 252). At this point, the fourth PCB substrate 130 may be removed from the printer 5 along conveyor tracks 55 and 60 onto a downstream piece of equipment or by being carried back out of printer 5 on conveyor track 35 (block 254). The fourth PCB substrate 130 may proceed to another piece of equipment, for example, a pick and placement machine or an inspection or repair station. In alternate embodiments, the fourth PCB substrate 130 may be removed in a different direction along a conveyor track other than conveyor tracks 35, 55, or 60 and onto a different piece of equipment, for example an inspection or repair station. Once the fourth PCB substrate 130 is removed from the first printer 5, a seventh PCB substrate 160 may be transferred to printer 5 along conveyor track 35 in a similar manner as the first PCB substrate 100 was introduced (FIG. 26 and block 256).

The process of transferring PCB substrates into and out of the printers may be repeated for as many additional PCB substrates as are desired.

It should be understood that embodiments of methods as illustrated in FIGS. 1-26, 27A and 27B are not limited to the order of steps or the timing illustrated. In alternate embodiments, different steps may be performed in different orders. Also, in different embodiments, one or more steps may be eliminated or added. Further, in different embodiments, cross conveyors could be used in any or all of the printers illustrated, or in other equipment in the production line, to rotate a processed board and direct it to an exit conveyor positioned at an angle, for example, perpendicularly, to the direction in which the board was introduced into the printer or other piece of equipment.

Further, in the method described above, there is not necessarily a dependency between acts being performed on any one printer and acts being performed on another printer. As long as a printer has raised a lower conveyor into its transfer position (e.g., an upper position of a lower conveyor), a board may be conveyed through the machine regardless of actions being performed on the alignment table or upper conveyor. For example, a printer may wait indefinitely until a board is fully printed before being utilized to pass a board through. In other embodiments, a printer may simply allow a board to pass through using either a lower or an upper conveyor, without performing any print or other operation on the board. In some embodiments, boards passing through a conveyor using either a lower or an upper conveyor, without performing any print operation, may be subject to an inspection operation wherein a 2-D or 3-D scanner or other imaging device inspects the board as it passes through the printer.

Additionally, a printer may hold a board on a lower conveyor while processing or allowing another board to pass through the printer on an upper conveyor should it be desirable to do so. A lower conveyor, an upper conveyor, or both could be dynamically sized to provide a transport width appropriate for the transport of any size of circuit board.

In further embodiments, additional conveying paths through the printers may be provided. These conveying paths may be in the form of further conveyor tracks in addition to those illustrated. These conveying paths may be disposed vertically displaced, horizontally displaced, or both from those illustrated.

Embodiments of methods as illustrated in FIGS. 1-26, 27A and 27B may include three printing stations; however, it should be appreciated that other embodiments could be adapted to include fewer or more printing stations should such a modification be desired. In some embodiments, other types of equipment, for example dispensing equipment, inspection equipment, placement equipment, or multi-lane printers may also be configured to perform methods similar to that described above.

An example of a stencil printer including a cross conveyor that may be utilized with the methods described above is illustrated in FIG. 29. A stencil printer 500, as schematically illustrated in FIG. 29 may include a board loader 510, a rotating cross conveyor 520, an alignment table 530, and an exit conveyor 540 (sometimes referred to as a buffer conveyor). The exit conveyor may nest into an adjacent machine (not shown). In some embodiments, a single rotating cross conveyor 520 may be utilized to adjust the orientation of boards on both of an upper and a lower conveyor track. In alternate embodiments, one or more conveyor tracks may be mounted on a horizontally rotating axis. Cross conveyors similar to that illustrated in FIG. 29 may be included in other types of process equipment as well, for example, inspection stations, dispense stations, repair or rework stations, reflow or cure stations, and placement machines.

Figure 30:
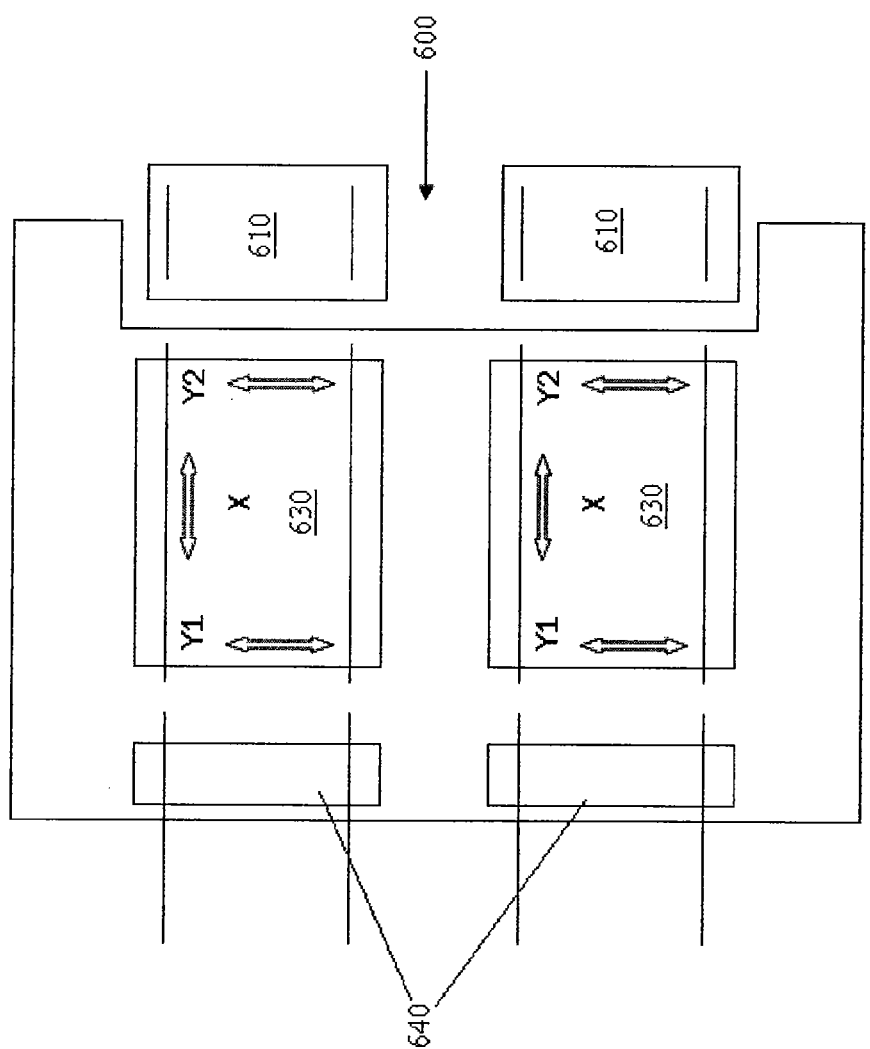
FIG. 30 is a schematic illustration of a dual-lane/dual print stencil printer in accordance with an alternate embodiment of the present disclosure.
Figure 31B:
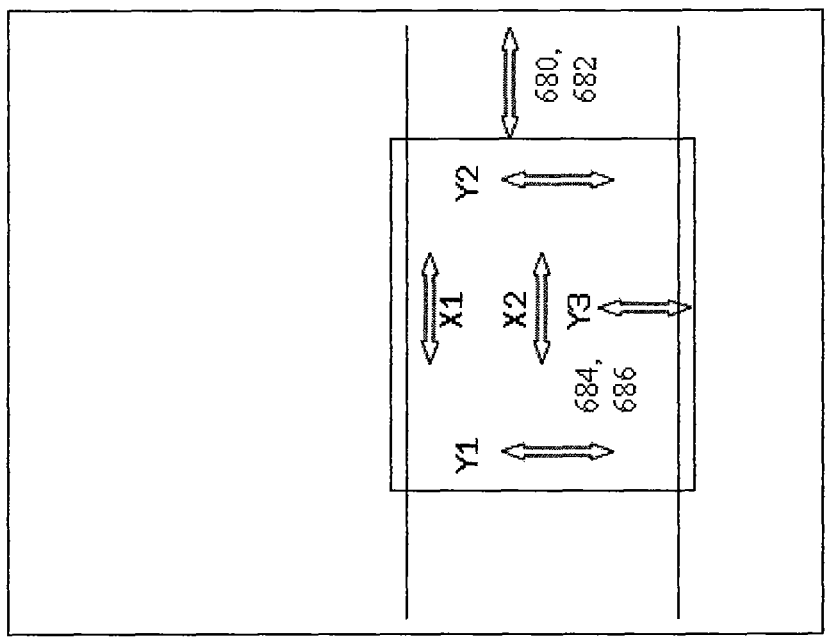
FIGS. 31a-33 are schematic illustrations of a stencil printer in accordance with an additional embodiment of the present disclosure.
Figure 31A:
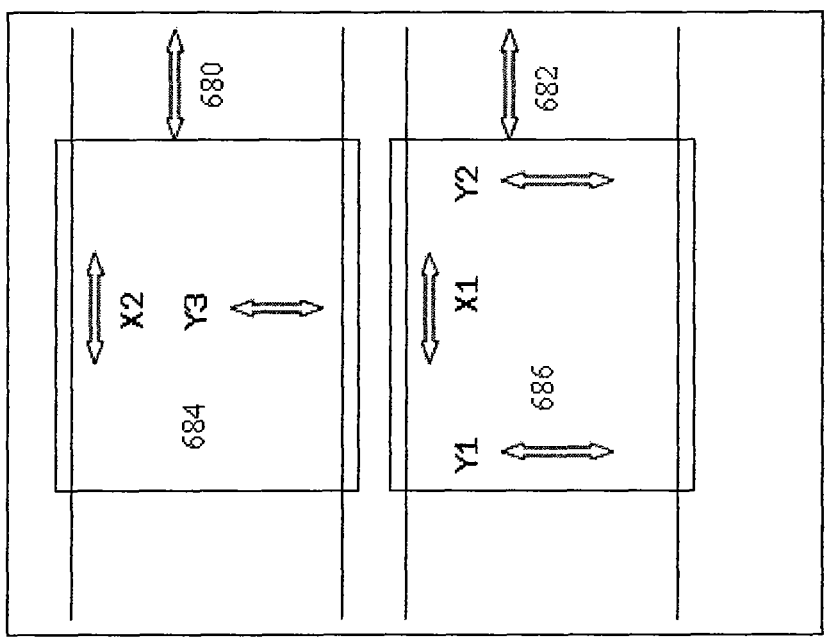
Figure 32:
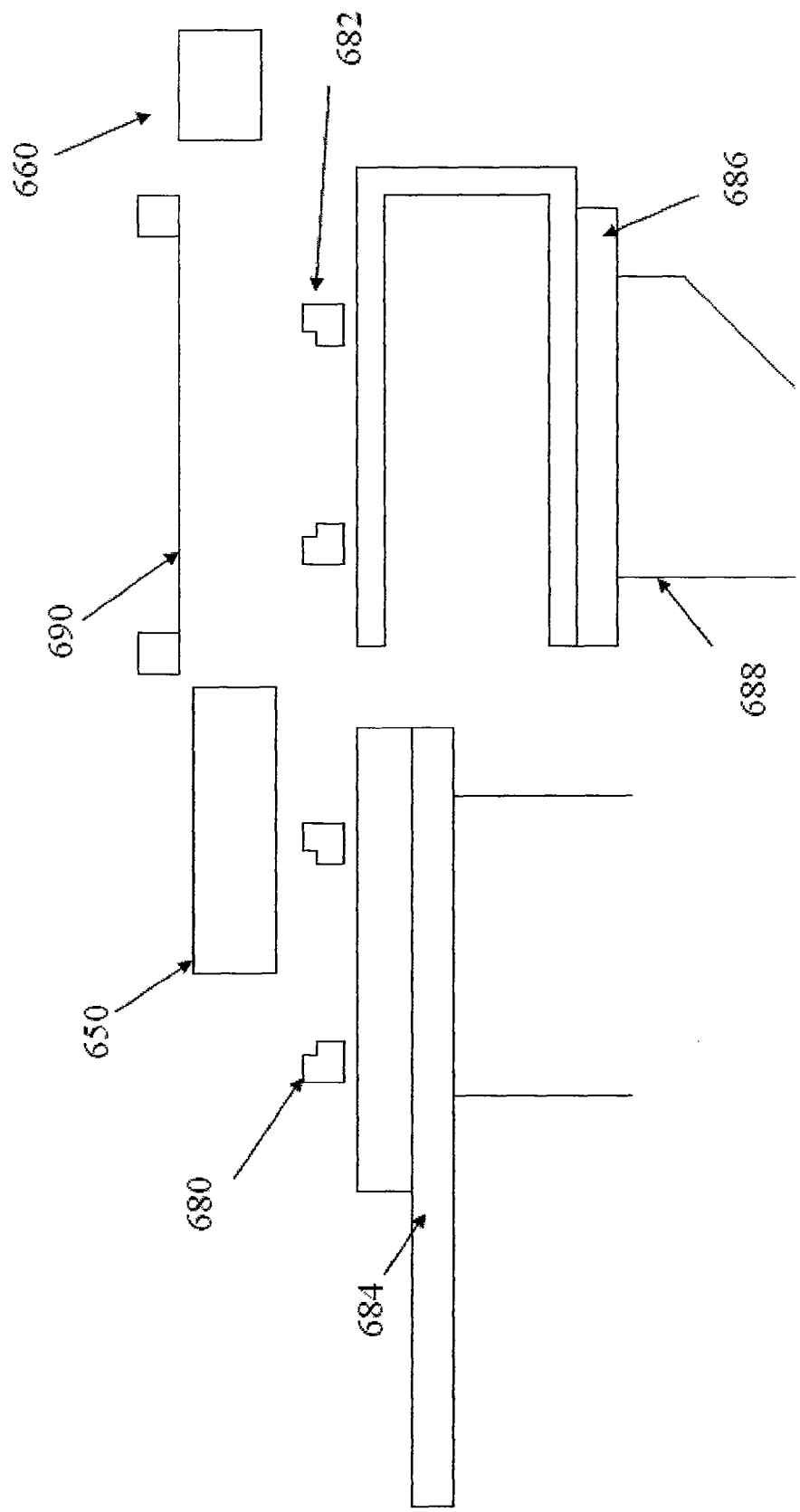

An example of a dual-lane/dual print printer that may be utilized with the methods described above is illustrated schematically in FIG. 30. In some embodiments the dual lane/dual print printer would not include two print stations as illustrated, but rather would include a lane for simply passing a substrate through the machine. In this case, the printer would be referred to as simply a dual-lane printer. The dual-lane/dual print printer 600 may include a pair of board loaders 610. In alternate embodiments, transport rails from an upstream piece of equipment may take the place of one or more of these board loaders 610. The dual-lane/dual print printer 600 may also include a pair of alignment tables 630, and a pair of exit conveyors 640 (a.k.a. buffer conveyors). Some embodiments may also include a cross conveyor similar to cross conveyor 520 of FIG. 29. In some embodiments, a dual-lane printer may include upper and lower conveyor tracks on one or both lanes. Other pieces of equipment, for example inspection or placement machines, may also be provided with a dual-lane configuration.

It should also be noted that although only two conveyor tracks are illustrated on each of printers 5, 10, and 15, one vertically displaced from another, embodiments of methods according to the present disclosure may be adapted to include multiple printing stations with three or more separate conveyor tracks. These multiple conveyor tracks may be vertically or horizontally displaced from each other and independently movable in a vertical or horizontal direction, or in some embodiments, movable in any one or more of a vertical, horizontal, or rotational direction.

In some embodiments, printers according to the present disclosure may have multiple conveyor tracks arranged with a horizontal displacement between different conveyor tracks and/or with conveyor tracks oriented in different directions. In some embodiments one or more conveyors may be displaced from one or more other conveyors in any one or more of a horizontal, vertical, and rotational direction.

Figure 33:
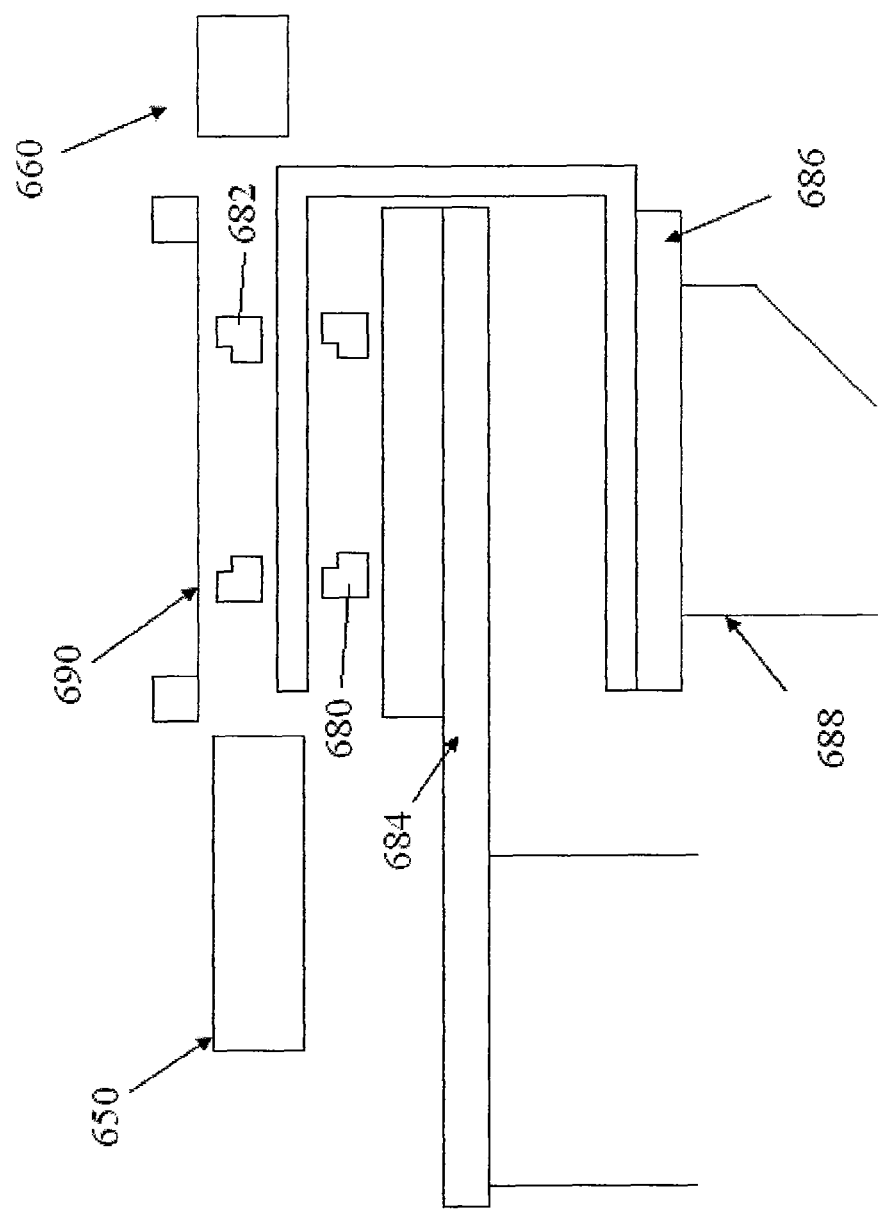
Figure 34:
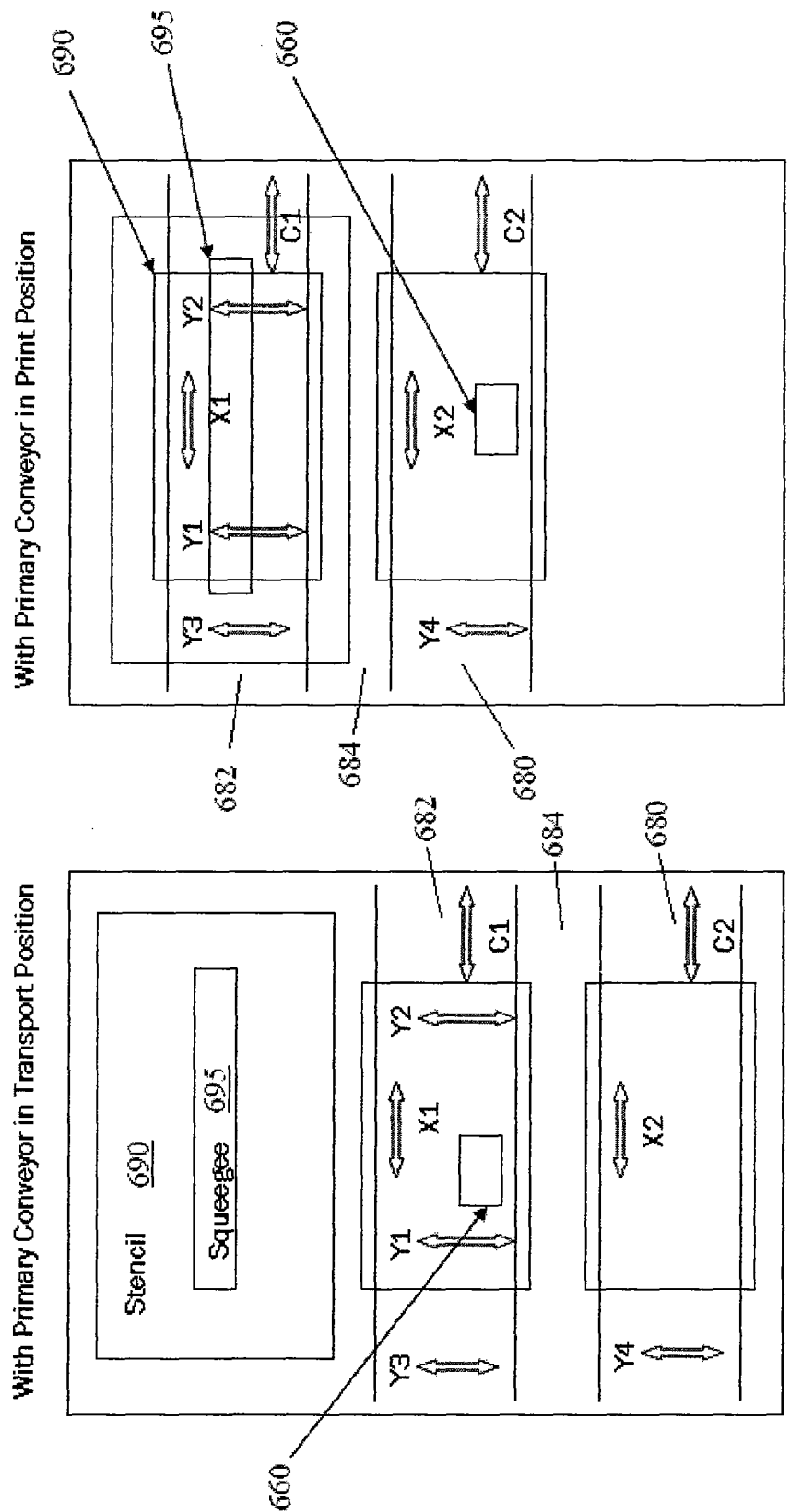
Figure 35:
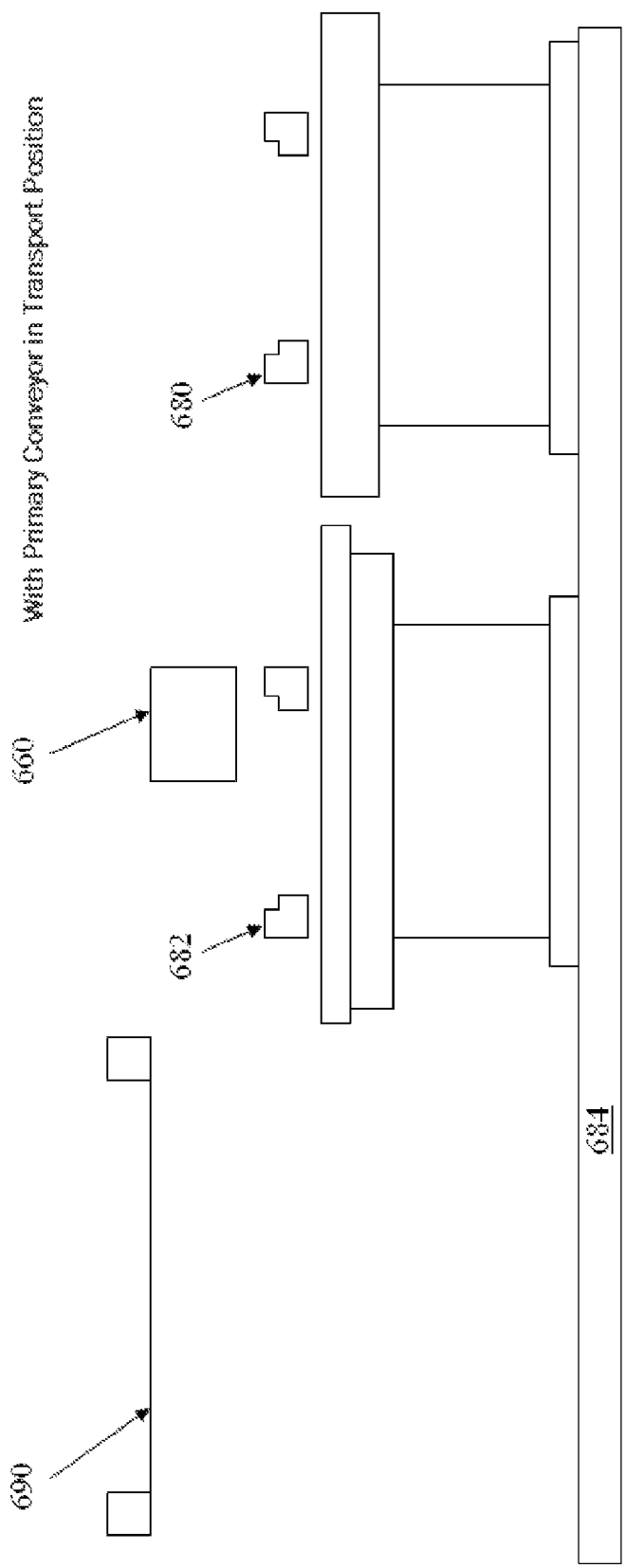
Figure 36:
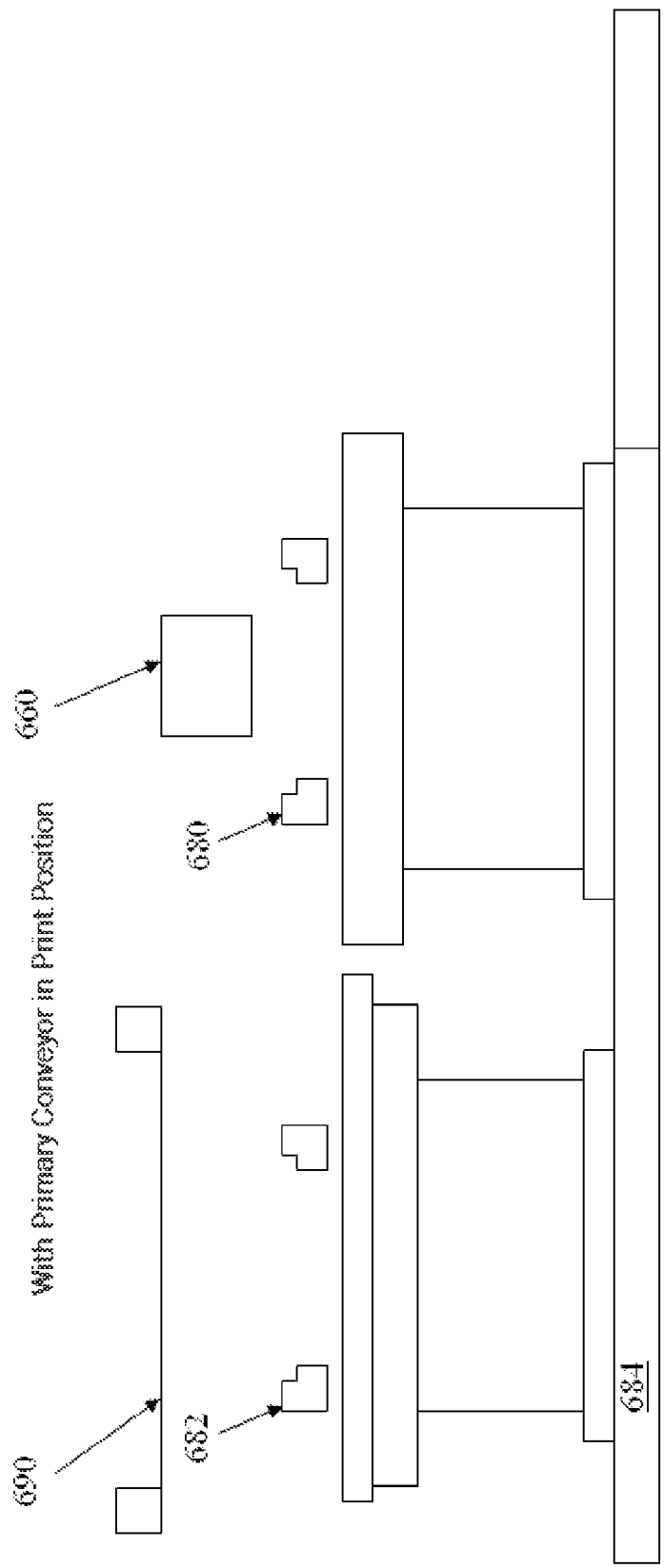

FIGS. 31a-33 illustrate a printer which includes a pair of conveyor tracks 680, 682 mounted to a single stencil printer, but horizontally displaced from one another. The conveyor track 680 may be utilized to pass circuit board substrates through to another downstream piece of equipment while other circuit board substrates are deposited on an alignment table 686 or other securing device within the printer for printing. As such, the printer of FIGS. 31a-33 may act similar to a dual-lane printer. However, the conveyor track 680 may also be coupled to a horizontally moving platform 684. The moving platform 684 may be used to position the circuit board substrate and portion of conveyor 680 on the horizontally moving platform 684 below the conveyor track 682 after the conveyor track 682 (and any substrate present on this track) is raised out of the way using a moving z-axis 688, by horizontally displacing the moving platform 684 and the conveyor track 680 and any substrate which may reside thereon, as shown in FIG. 33. A substrate present on the conveyor track 680 coupled to the horizontally moving platform 684 may then exit the printer through an exit conveyor previously aligned with conveyor track 682. In alternative embodiments, the arrangement of conveyors illustrated in FIG. 33 could be used to pass circuit board substrates through the printer along conveyor track 680 while another substrate which had been delivered along conveyor track 682 was being printed using, for example the stencil 690, camera gantry 660 and wiper 650.

Further, in alternate embodiments, such as that illustrated in FIGS. 34a-36, both the first conveyor track 680 and the second conveyor track 682 may be positioned on a horizontally moving platform 684 that may enable both conveyor tracks 680 and 682 to simultaneously move in a horizontal direction to position the conveyor track 680 in a position previously occupied by conveyor track 682. A substrate present on conveyor track 682 could then be processed, for example printed using squeegee 695 and stencil 690, while conveyor track 680 was used as a pass-through conveyor for the printer.

Like the printers of FIGS. 1-26, an inspection of boards passing through the printers of FIGS. 31a-33 and 34a-36 on conveyor 680 could be performed while other operations, such as printing were being performed on a substrate that had been delivered to the printer along conveyor 682.

The horizontally displaced conveyor track arrangements illustrated in FIGS. 31a-33 and 34a-36 could also be implemented in other types of processing equipment, such as dispensers, inspection equipment, rework equipment, or placement equipment.

In some embodiments, one or more printers may include one or more cameras or other inspection or quality testing mechanisms capable of performing statistical post-print inspection of PCB substrates. If defects are detected, a PCB substrate may be sent to a dedicated inspection machine for a more thorough inspection. If the flaws may be rectified, the PCB substrate may be reprinted or sent to a direct write piece of equipment or another form of repair station or equipment for repair. This repair could take place before running the PCB board through a pick and placement machine, avoiding time consuming rework after the pick and place operation had been performed. If the PCB substrate was determined to be acceptable at a dedicated inspection station, it may be reintroduced and continue flowing through the production line without production backing up.

Solder paste printers in accordance with embodiments of the present disclosure may incorporate dynamic line sizing for the conveyor tracks included therein in order to allow for flexible processing of multiple different sized PCBs. Using printers 5, 10, and 15 described above as an example, printer 5 may be configured to print four inch PCB boards, while printers 10 and 15 may be configured to print five and six inch PCB boards, respectively. When printer 5 is printing a four inch board, the conveyor track 50 can be sized to pass-through a five inch board to printer 10, and then resized again to pass-through a six inch board to printer 15. When the four inch board is completed, the conveyor tracks 55 and 60 on printers 10 and 15 may be resized to allow that board to pass through them and into, for example a placement machine.

It should be appreciated that one or more conveyor tracks in printers according to different embodiments of the present disclosure may include dynamic line sizing to allow for the transport of any number of sizes of PCBs, not just four, five, and six inch PCBs. The provision of dynamic line sizing in the conveyor tracks of printers in accordance with the present disclosure may reduce or eliminate the need to panelize products to a standard size to get the benefits of modular printing. With dynamic line sizing, PCB boards may be reduced in size to the smallest possible size desired to accommodate a preferred set of components. This may facilitate cost savings on boards, packaging, shipping, waste and many other aspects of cost involved in making PCBs. With dynamic line sizing, PCB boards may be reduced in size to be no larger than they inherently need to be to incorporate a desired set of components.

Dynamic line sizing may also be useful in job shops that may require frequent changes to the size of boards that require processing. Excess capacity in one production line could be used to process short production runs of differently sized boards without requiring a full line reconfiguration to be performed.

Printers and other pieces of SMT processing equipment, including, for example, dispensers, placement machines, optical inspection machines, reflow stations, cure stations, repair stations, and board loaders or shuttles according to the present disclosure may include one or more conveyor tracks with adjustable lane widths to facilitate the transport of different sizes of PCB boards through these pieces of equipment. These pieces of equipment may be controlled by a control system that provides data to the equipment as to how and when to adjust conveyor track (which may also be referred to as transport lane) sizes to properly accommodate different PCB boards. This control system may be centralized in the sense that it is not dedicated to any one piece of equipment. An example of such a production line control system is illustrated schematically in FIG. 28.

Figure 28:
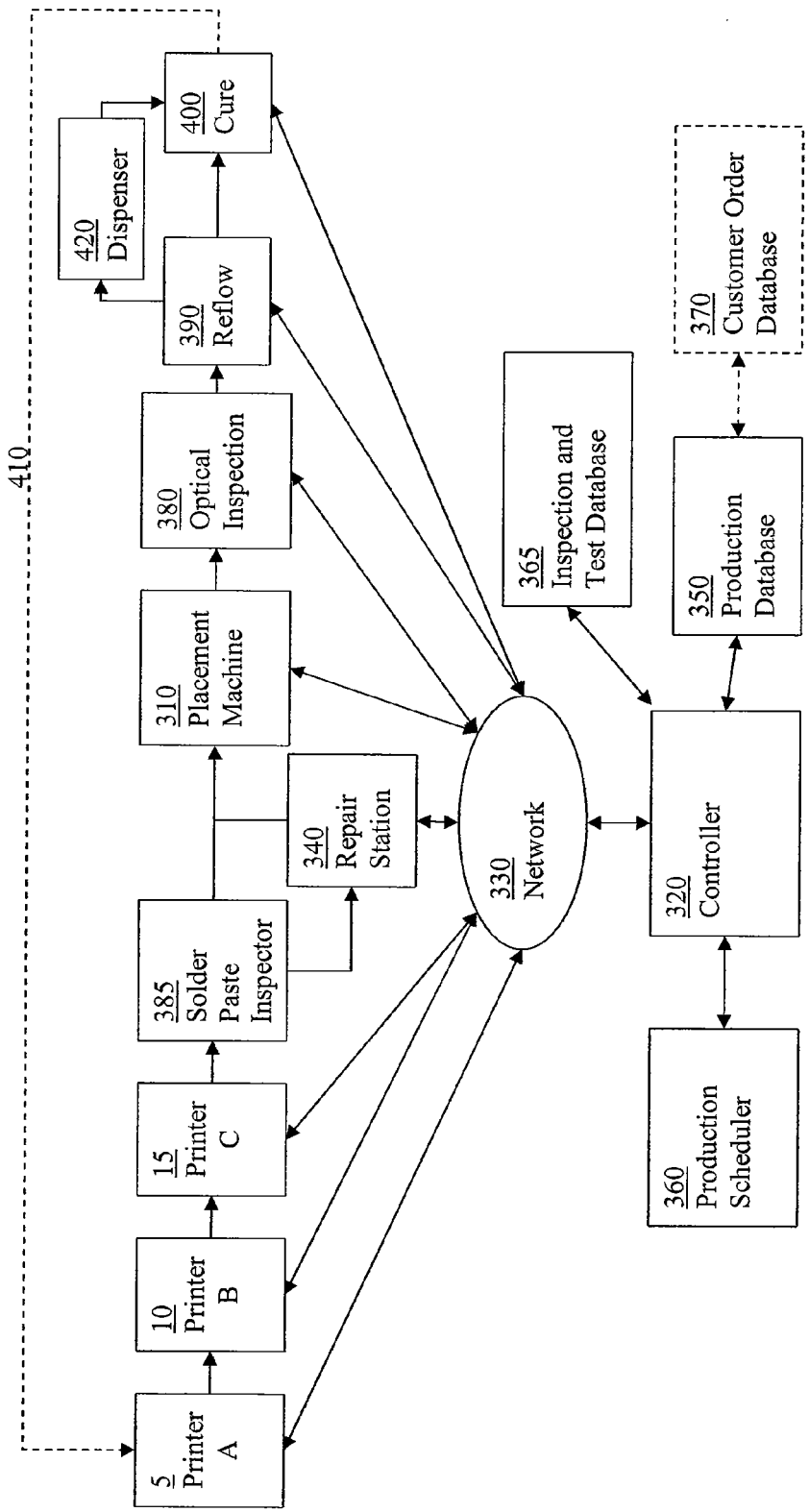
FIG. 28 is a schematic of a printed circuit board production line in accordance with an embodiment of the present disclosure.

FIG. 28 illustrates a plurality of printers 5, 10, and 15, a pick and place machine (a placement machine) 310, a solder paste inspector 385 which may be present between one or more repair stations 340 and/or printers and the pick and placement machine 310, and an automated optical inspection station 380, which may make up a portion of a manufacturing line for PCBs. Additional processing equipment, such as one or more reflow stations 390 with one or more process lanes, one or more cure stations 400 with one or more process lanes, one or more dispenser stations 420 for performing underfill and/or encapsulation operations with one or more process lanes, which may be present between the reflow and cure stations 390 and 400, additional automated optical inspection stations, additional solder paste inspectors, additional printers in series with printers 5, 10, and 15, or additional series of printers running parallel production lines may also be present. Shuttle loaders may also be present to transfer substrates passing through the manufacturing line to tracks on downstream pieces of equipment which may not necessarily be horizontally or vertically aligned with exit conveyors from upstream pieces of equipment.

There may also be present a rework station or line to which PCB boards failing inspection at the solder paste inspector 385 or at the automated optical inspection station 380 may be sent. The rework line may include, for example a repair station that may dispense solder paste onto a substrate. The repair station 340 illustrated may also in some embodiments include this feature. One or more cleaning stations (not illustrated) may also be present at various positions in the production line.

These pieces of process equipment may be present in a production line in the order illustrated in FIG. 28, or, in other embodiments, the order of these pieces of process equipment may be different from that illustrated. In some embodiments, more than one series of printers may feed a single placement machine. In other embodiments, a series of printers sharing a same product flow path may feed product to multiple placement machines. In further embodiments, a manufacturing line may be set up so that a PCB may make a pass through a printer or a series of printers to have one side printed, and then be returned to the front of the production line, on a conveyor 410 or by other means, such as manual conveyance, for reintroduction into a printer or a series of printers (either the same or different printer or series of printers) for further printing of the same or another side of the PCB.

A computerized controller 320 may communicate directly to any or all of printers 5, 10, and 15, placement machine 310, automated optical inspection station 380, reflow station 390, cure station 400, and conveyor system 410, or may communicate to any or all of these pieces of equipment through a network 330, such as an Ethernet network or LAN. The controller 320 may also be in communication with a repair station 340 at which defective PCB boards are repaired prior to being introduced into the placement machine 310. The controller 320 may also be in communication with a production database 350, a production scheduler 360, and an inspection and test database 365.

The controller 320, production database 350, production scheduler 360, and inspection and test database 365 may in some embodiments be part of a single computer system. In alternate embodiments, the controller 320, production database 350, production scheduler 360, and inspection and test database 365 may be separate and in communication with one another over a communications network, such as network 330.

The production database 350 may contain information related to the number and types of PCB product that is desired to be produced. This information may be updated periodically or on a real time basis either manually, for example through entry of information into an interface of the production database 350, or automatically, by for example, communicating with a customer's order database 370. The production database 350 may also contain information regarding raw materials required for the production of the printed circuit boards (e.g., various electronic components, or consumables such as solder paste or encapsulent) and the transit status and location of those materials.

The production scheduler 360 may monitor the output of the production line and the information in the production database 350, and dynamically adjust the queue of new PCBs to be started for production, taking in to account, for example, the amount of work in progress, the amount of defective product detected, and the operational state of the various pieces of equipment in the production line. The controller 320 may schedule production in a pull mode or in a push mode based on a product queue or output at any particular piece of equipment, or set of equipment in the production line or a set of dynamic circumstances that may take place within the line, e.g. jams, the lack of availability of some of the consumables for the process line, or inspection failures.

The inspection and test database 365 may be utilized to store inspection and test data to be useable for closed loop inspection decisions (such as questionable print issues resulting in test failures) and/or later for reliability analysis of fielded goods (such as questionable print results resulting in field reliability issues). This data may be provided to the inspection and test database 365 directly from inspection equipment in the production line, such as optical inspection station 380 or inspection mechanisms present in any of the printers or other pieces of equipment, or may be provided indirectly through the controller 320, or through the network 330.

In some embodiments, the controller 320 may be configured to receive signals from inspection apparatus associated with one or more printers in a production line. Upon the detection of a defect by the inspection apparatus, the controller 320 may instruct the printer to direct the defective circuit board onto a conveyor system which brings the defective board to, for example, a manual inspection station (not shown) or to a board repair station 340. In this manner, defective boards may be cleaned and reintroduced into the process or removed from the production line so that they do not hold up production of other boards. Defective boards removed from the production line may be further inspected and/or repaired when an operator or technician becomes available.

In a certain embodiment, the controller 320 may be configured to use a personal computer having a Microsoft DOS or Windows XP operating system with application specific software to control the operation of the various pieces of equipment in the production line. In other embodiments, the controller may utilize other operating systems, including, for example, UNIX or Linux. The controller 320 is not limited to any particular form of computer architecture or operating system. The controller 320 may include a processor, memory for storage data and control programs to carry out the programmed procedures described herein. Also, a display associated with the controller 320 may be accompanied by interactive user inputs including a keyboard and a mouse that are used to manipulate the controller 320. Other user interfaces, such as a touch screen could be utilized in alternate embodiments.

In some embodiments, a production line may be provided which includes multiple printers and one or more pick and placement machines. Different printers may be configured with different stencils to print different images on PCBs passing through them. In some embodiments, a production line may be designed such that the printers may have a higher throughput capacity than the pick and placement machine(s). This may be the case because printing equipment is typically less expensive than pick and place equipment. Also, the pick and place equipment may run slower than a printer because of the large number of components that may be applied to a printed circuit board by a pick and placement machine. Operations management principles dictate that it may be desirable to have sufficient capacity in the cheaper equipment in a production line to keep the more expensive equipment running at a high percentage of its potential capacity.

With excess printing capacity and numerous images in the printing area, a centralized control system could increase the throughput efficiency of the overall printing and placing operation and/or the manufacturing process line as a whole. Decisions can be made early on in the process for better optimization. Rejected boards can be eliminated from the process and time can be found to replace them without impacting the operation of the placement equipment. Inspection considerations and rework considerations can be taken into account and processes can be put together with the greatest level of focus on overall quality and throughput. Individual needs for each machine (such as stencil cleaning, paste replenishment, and paper replenishment) can be taken into consideration, and sacrifices and tradeoffs could be made to provide a more highly efficient production system than might otherwise be achievable.

In production lines where printing is the bottle neck, a control system capable of reacting to all line process needs will also enable for a more efficient line as interruptions in other processes such as placement will not put the print line down A centralized production line control system not only lends itself to increasing overall line efficiency, but also to the collection of data and the use of the data for higher levels of decision making. This data may potentially be helpful in establishing overall production line improvement decisions, such as product selection and production line reconfiguration to provide for capacity improvements. This data might also be useful in performing reliability analysis which could influence design decisions which could take into account the process capability of the production line.

A control system in accordance with some embodiments of the present disclosure may be configured to control other pieces of equipment in addition to printers and placement machines, such as inspection machines, dispensers, and direct write machines.

A manual interface defect rejection station may be included in some systems in accordance with the present disclosure. The manual interface defect rejection station may provide the ability to direct rejected boards for disposal or to queue them up for manual intervention. This may facilitate the reduction in the amount of time that a production line spends down due to the need for manual intervention and inspection of rejected boards. If rejected boards can be put aside until an operator frees up, the process cycle time can be maintained without impact.

In some embodiments, there is provided a system for allowing one printer to control a second printer in the case that the second printer experienced a failure. In other embodiments, the system may provide for any type of equipment, e.g., dispensers, pick and place machines, inspection stations, etc., to assume control of any other type of equipment that had experience some form of failure. This system may facilitate keeping a manufacturing line including several printers or other forms of equipment in series running in the case of failure of a single printer or other piece of equipment.

In some embodiments, the system may comprise a secondary remote control unit that may be placed in or attached to a functioning piece of equipment and that may be capable of running the pass-through conveyor (or a primary conveyor with the tooling removed) on a malfunctioning machine, such as a stencil printer. In some embodiments, if a stencil printer or other piece of equipment experiences a failure, the secondary remote control unit may be connected to an operational upstream or downstream piece of equipment. The operational piece of equipment may be configured to interface with the malfunctioning machine through the secondary remote control unit and operate functional portions of the malfunctioning machine.

In some embodiments, this configuration may occur automatically upon the connection of the secondary remote control unit to the operational and the malfunctioning pieces of equipment. In other embodiments, manual configuration of the operational piece of equipment may be performed to enable the interface and communication between the operational and the malfunctioning pieces of equipment through the secondary remote control unit. In some embodiments, a control interface for a conveyor track from the malfunctioning machine may be connected to the secondary remote control unit to allow the operational piece of equipment to control the conveyor track of the malfunctioning machine. In some embodiments, removal of tooling from the malfunctioning machine may facilitate operation of the conveyor track under control of the operational piece of equipment.

In some embodiments, an adjacent equipment control system would comprise a box with connectors through which communication between the adjacent equipment may take place. In some embodiments, this box would be small and portable. This box could be plugged into the power supply of an upstream or downstream functioning machine and connected to a network interface for communications though for example, network 330. A control interface for the conveyor track segment from a malfunctioning machine could then be connected to the control box. Upstream or downstream interface connections (SMEMA and/or network connections) would also, in some embodiments, be connected to the machine that was to assume control of the conveyor track of the malfunctioning machine. The functional machine could then control the conveyor track segment of the malfunctioning machine as if it were an extension of its own conveyor capabilities. In some embodiments, the control box would enable communication between transport sensors of the malfunctioning machine and the controlling machine and/or network as well.

This system would, in some embodiments, enable the malfunctioning machine to remain in place waiting for repair while still allowing product to pass through it, as opposed to removing the malfunctioning machine and replacing it with either a conveyor segment or backup machine.

In some embodiments, the secondary remote control unit would allow the operational piece of equipment to take over control of communications, board transport, and conveyor track width adjustments of the malfunctioning machine. In some embodiments, the secondary remote control unit would allow the operational piece of equipment to interface with safety circuitry of the malfunctioning machine.

A secondary remote control unit could in some embodiments, also be used in conjunction with a dual-lane machine to run a pass-through conveyor if that machine was down.

In further embodiments, the secondary remote control unit could be controlled by, or integrated into the controller 320. In some embodiments, transfer of control of a conveyor track of a first machine from the first machine to a secondary machine, could be initiated by the controller. In some embodiments, the controller could be manually instructed to perform this transfer of control, and in other embodiments, the transfer of control could be performed automatically by the controller upon, for example, the controller receiving a communication of an error from a stencil printer.

In further embodiments, the controller 320 would itself be the operational piece of equipment that assumed control of functions of a malfunctioning piece of equipment.

In further embodiments, equipment and/or circuitry replicating the functionality of the secondary remote control unit may be integrated into one or more pieces of equipment, for example, stencil printers or placement machines. In these embodiments, no separate remote control unit would be needed for an operational piece of equipment to assume control of all or a portion of a malfunctioning piece of equipment. A machine experiencing a failure would be connected to an operational upstream or downstream piece of equipment which may be configured to interface directly with the malfunctioning machine and operate functional portions of the malfunctioning machine. In some embodiments, this transfer of control may be performed automatically upon a detection of an error signal from a malfunctioning piece of equipment by either another piece of equipment or by the controller 320.

An exemplary stencil printer platform upon which one or more of the methods described above may be performed is illustrated in FIGS. 37-47. As will be described in greater detail below, with respect to features of the present disclosure, the stencil printer platform may be configured to include one or more frame members or castings that support components of the stencil printer platform. The components of the stencil printer platform may include, in part, a controller, a display, a stencil, and a print head assembly or print head configured to apply the solder paste. The print head may be suitably coupled or otherwise connected to the frame members or castings. In one embodiment, the print head may be mounted on a print head gantry, which may be mounted on the frame members or castings. The gantry enables the print head to be moved in the y-axis direction under the control of the controller. As described below in further detail, the print head may be placed over the stencil and a front or a rear squeegee blade of the print head may be lowered in the z-axis direction into contact with the stencil. The squeegee blade of the print head then may be moved by means of the gantry across the stencil to allow printing of solder paste onto a circuit board.

As described herein, the stencil printer platform may also include a conveyor system of embodiments of the present disclosure having a plurality of rails or tracks for transporting a printed circuit board to a print position in the stencil printer. The rails may be configured to feed, load or otherwise deliver circuit boards to the working area of the stencil printer, which is sometimes referred to as the "print nest" or "work nest" in the art, and to unload circuit boards from the print nest. The stencil printer platform may have a support assembly to support the circuit board and secure the circuit board so that it is stable during a print operation. In certain embodiments, the substrate support assembly may further include a particular substrate support system, e.g., a solid support, a plurality of pins, or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head may be configured to receive solder from a source, such as a dispenser, e.g., a solder paste cartridge, that provides solder paste to the print head during the print operation. Other methods of supplying solder paste may be employed in place of the cartridge. For example, solder paste may be manually deposited between the squeegee blades or from an external source. Additionally, in a certain embodiment, the controller may be configured to use a personal computer as described herein having an operating system with application specific software to control the operation of the stencil printer. The controller may be networked with a master controller that is used to control a production line for fabricating circuit boards.

In one configuration, the stencil printer platform operates as follows to perform a print operation. A circuit board is loaded into the stencil printer using the conveyor rails. The support assembly raises and secures the circuit board to a print position. The print head then lowers the desired squeegee blade of the print head in the z-axis direction until squeegee blade of the print head contacts the stencil at a desired pressure. The print head is then moved in the y-axis direction across the stencil by the print head gantry. The print head deposits solder paste through apertures in the stencil and onto the circuit board. Once the print head has fully traversed the stencil across the apertures, the squeegee blade is lifted off the stencil and the circuit board is lowered back onto the conveyor rails. The circuit board is released and transported from the stencil printer platform so that a second circuit board may be loaded into the stencil printer in a manner described herein. To print on the second circuit board, the other squeegee blade is lowered in the z-axis direction into contact with the stencil and the print head may be moved across the stencil in the direction opposite to that used for the first circuit board.

In alternate configurations, the printer platform may include a stencil printing assembly or other form of material deposition system that lowers to the level of a substrate on a conveyor or other support assembly for the printing solder paste or deposition of other material. In these configurations, the substrate would remain substantially stationary (e.g. on the conveyor rails) while the printing or deposition assembly was moved to meet it. In additional configurations, a worknest and rails of a printer platform which are supporting a board may be moved below a material dispense system by movement in one or both of a horizontal and vertical direction.

Figure 37:
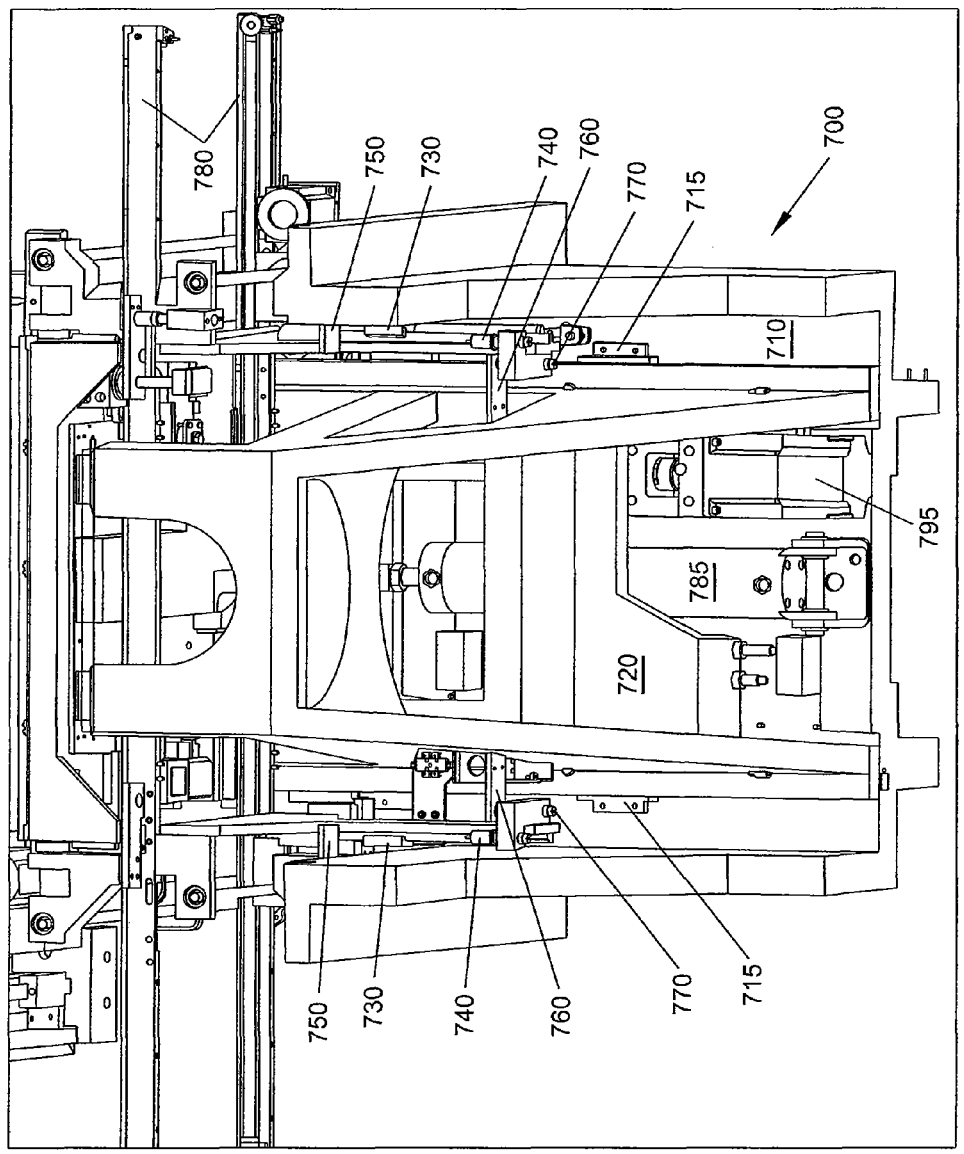
FIGS. 37-47 illustrate an exemplary printer platform upon which the method illustrated in FIGS. 27A and 27B may be performed.

As illustrated in FIG. 37, a stencil printer platform, generally indicated at 700, may include a fixed z-axis casting 710 onto which is mounted a moving z-axis casting 720. The moveable z-axis casting 720 may be coupled to the fixed z-axis casting 710 using a linear bearing rail (not shown) and bearing trucks 715. The term "casting" used herein is meant to refer to any form of frame or other support structure for supporting or connecting the various elements of the printer or other piece of equipment described. The material of construction of method of formation of these castings is not intended to be limiting. The materials of construction of the castings described herein may include such materials as metals, plastics, ceramics, or composites, formed into a desired shape by any appropriate method known in the art.

In FIG. 37, the lower conveyor 780 is coupled to the fixed z-axis casting 710 by a plate 860 (shown more clearly in FIG. 39) that is coupled with a linear bearing rail and truck assembly 730 that is mounted to a fixed mount plate 840 (shown more clearly in FIG. 39) that is in turn mounted to the fixed z-axis casting 710. An upper travel limit shock 740 coupled to the lower conveyor mount plate 860 may serve to halt the movement of the lower conveyor when the moving z-axis 720 is raised and a stop plate 750 pushes on shock 740. As the moving z-axis casting 720 is pushed upward by, for example, an air cylinder 785 and the motor 795, the movement of the lower conveyor 780 may be halted when the upper travel limit shock 740 comes into contact with a pair of stop plates 750, which are coupled to the fixed z-axis casting 710 on opposite sides of the moving z-axis casting.

Another stop plate 760, fastened to the moving z-axis casting 720, may come into contact with a lower travel limit shock 770 when the moving z-axis casting is moving in a downward direction. The moving z-axis casting may move a lower conveyor track 780, which may move up and down on the linear bearings 730, down into the machine base so that it is not aligned for product transport through the printer. The moving z-axis casting 720 may experience a constant upward force applied by air cylinder 785 to balance out the weight of the moving z-axis casting 720 to reduce the amount of force needed to be applied by the motor 795 to move the movable z-axis 720. In other embodiments, the air cylinder 785 may only be pressurized when it is desired to raise the moving z-axis casting 720. The motor 795 may be used to move the moving z-axis casting 720 in an upward or downward direction.

Figure 38:
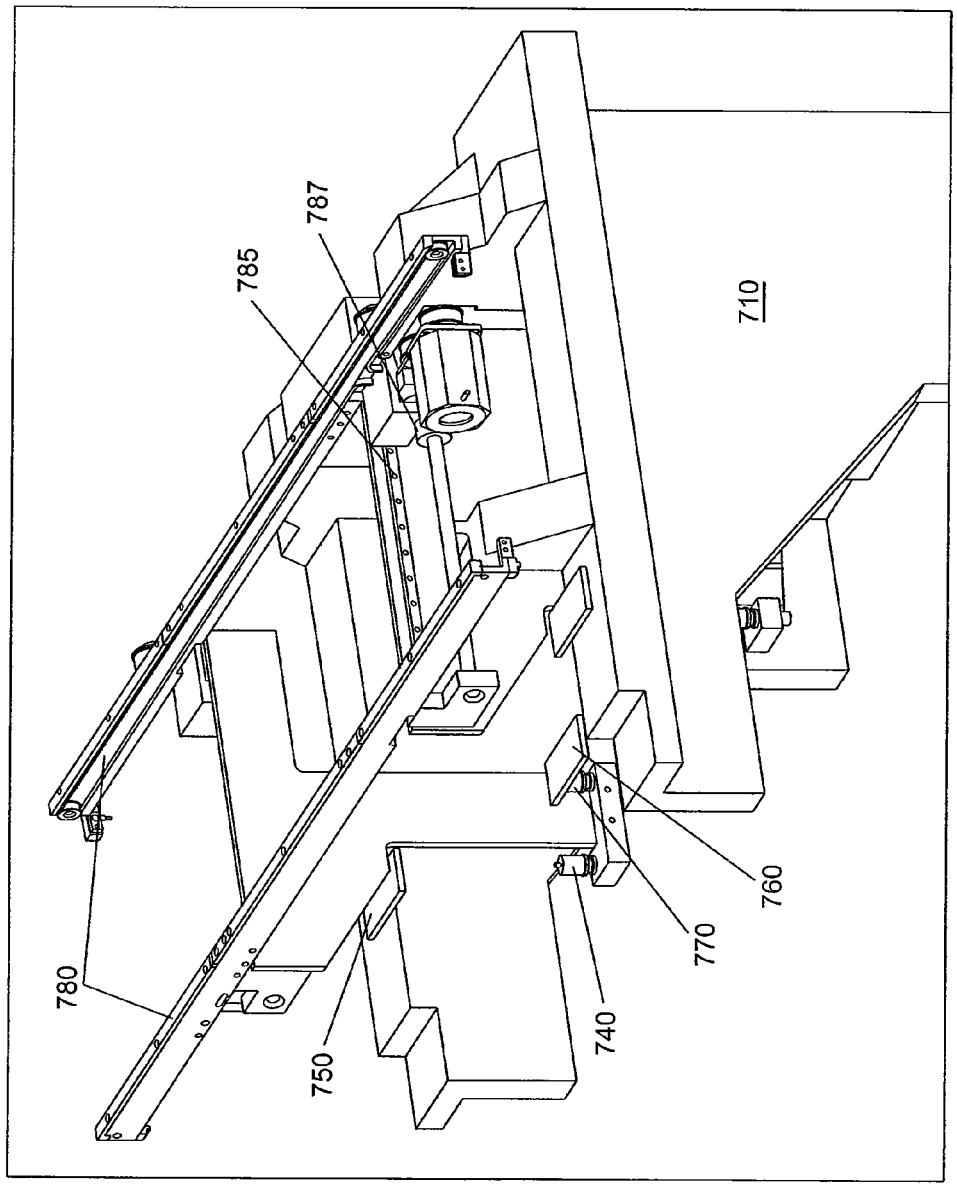

FIG. 38 illustrates the lower conveyor track 780 slidably mounted to the fixed z-axis casting 710. Stop plate 760 is illustrated floating in space in FIG. 38 since the stop plates 760 are coupled to the moving z-axis casting 720, which has been omitted from this figure for clarity. In this drawing figure, the stop plate 760 is engaging the rear shock 770 to push the lower conveyor track 780 down. When the lower conveyor track 780 is allowed to move up by raising the moving z-axis casting 720 a distance sufficient to disengage the plate 760 from the shock 770, and the moving z-axis casting 720 reaches a sufficiently high position, the stop plate 750 will become engaged with shock 740 and the lower conveyor track 780 may assume its upper position and be available for product transport. Dynamic lane sizing may be provided by providing a motor or screw, such as a ballscrew 787, to move tracks 780 together or apart along linear bearing 785. A similar mechanism may be provided for dynamic lane sizing of the upper conveyor tracks 790.

Figure 39:
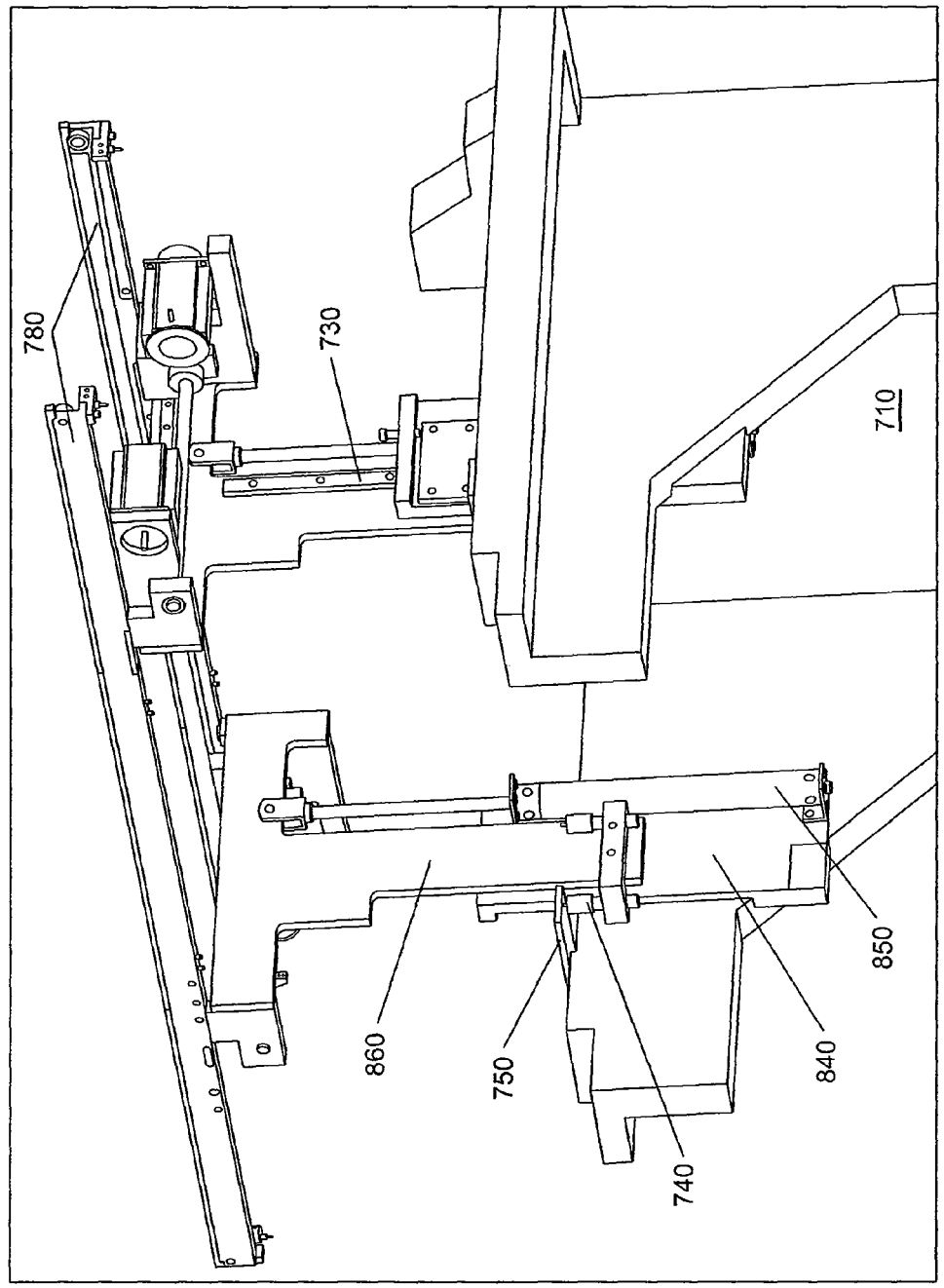

FIG. 39 illustrates the lower conveyor track 780 in its upper position, with the moving z-axis casting 720 omitted for clarity. There are two plates each indicated at 840 and two plates each indicated at 860 (with plates 840, 860 positioned at each side of the casting) with a linear bearing rail and truck assembly 730 keeping the plates in parallel and allowing for the extension of their motion. As shown, plate 840 is mounted to the fixed z-axis casting 710. The base of the air cylinder 850 is mounted to the plate 840 and the extending rod of the air cylinder 850 is mounted to the moving plate 860. In some embodiments, this air cylinder is configured to constantly push upward against the moving plate 860. In other embodiments, the air cylinder is pressurized when it is desired to raise the lower conveyor 780. In this figure, the moveable z-axis casting (not visible) is in the upper position. This configuration allows the lower conveyor track 780 to achieve its full upward stroke and seat the shock 740 against the stop plate 750.

Figure 40:
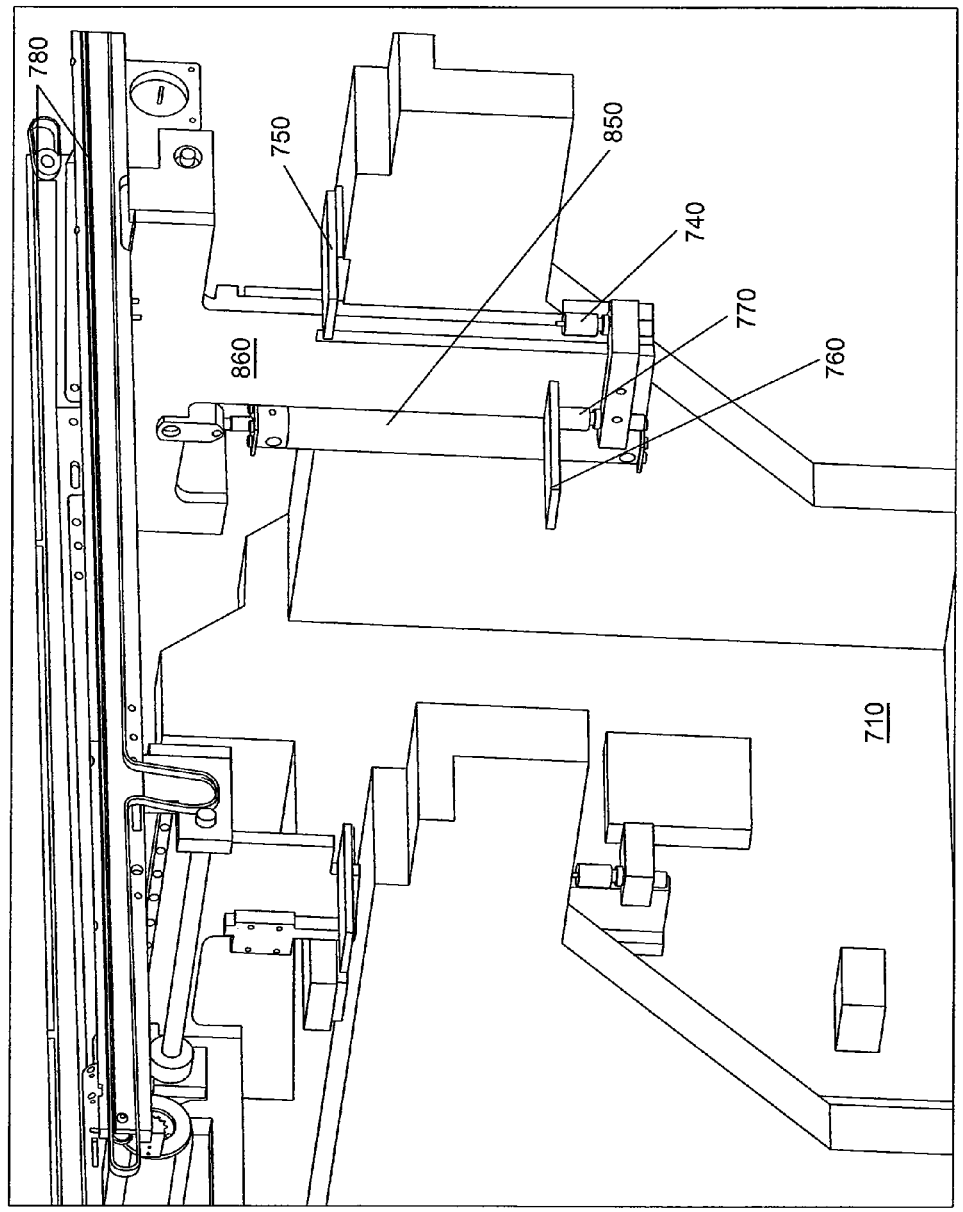

FIG. 40 illustrates the lower conveyor track 780 in a down position. The moving z-axis casting is not shown in this figure. When the moving z-axis casting moves to the lower transport position, such that the upper conveyor track 790 (illustrated in FIG. 43) is at the transport height, and circuit boards may be loaded to or from the upper conveyor track 790, the plate 760 pushes the lower conveyor track 780 from its location at the transport height down into the base of the machine and holds it in this position. The vertical position of the upper transport track 790 when the moving z-axis casting is in its lower transport position corresponds to a vertical height of an upper position of the lower transport track 780.

In some embodiments, the lower conveyor track 780 may travel about five inches between its upper and lower positions, although in other embodiments the vertical travel length of the lower conveyor track rails 780 may be greater or less than about five inches. The lower position is achieved when the moving z-axis casting pushes plate 760 into contact with shock 770 and drives the assembly down. The upper position is achieved when the moving z-axis casting 720 lifts up and the lower conveyor track 780 lifts up with it until shock 740 comes to rest on plate 750.

Figure 41:
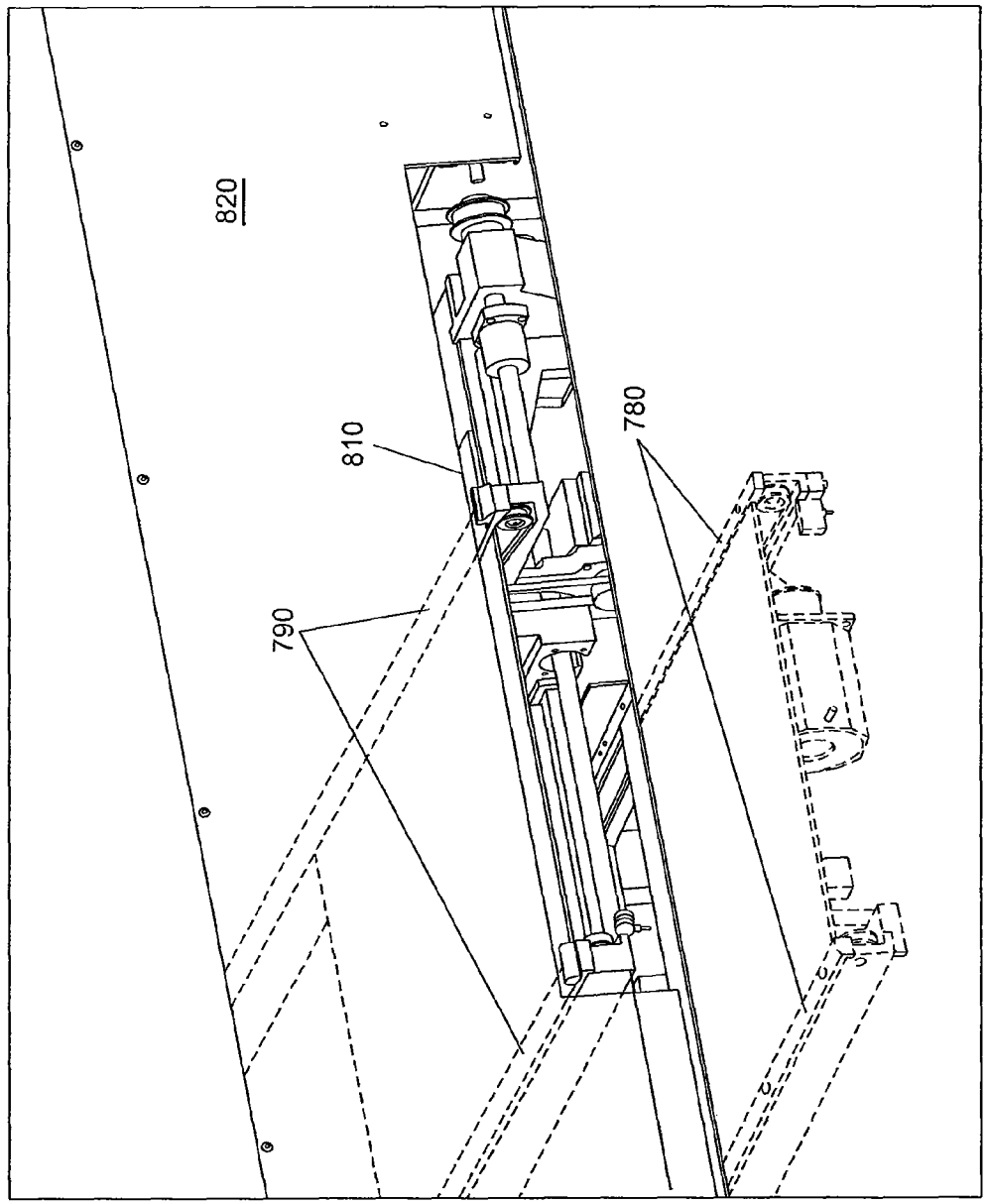

FIG. 41 illustrates an upper conveyor track 790 positioned to send a board out through a transport opening 810 formed in a cover 820 of a particular machine (e.g., a stencil printer platform or a placement machine). Cover 820 may be located on a side and/or a front and/or a back of the machine. A similar transport hole may be present in a cover (which is separate from or part of cover 820) on another side of the machine for introduction of boards into the machine. In some embodiments, the cover 820 may not be provided. The lower conveyor track 780 (shown in dotted lines) is recessed within the machine. The lower conveyor track 780 can hold a board while recessed within the machine, which provides a parking place for a board within a machine. This configuration may enable other circuit boards to pass in front of the parked circuit board, via the top conveyor, if size allows, so that the other circuit board flows through a series of printers or other processing equipment, or flows to some other destination that enables a balancing out of the production process. A control system from the production line may be configured to account and plan for this type of board parking/storage/bypass.

Figure 42:
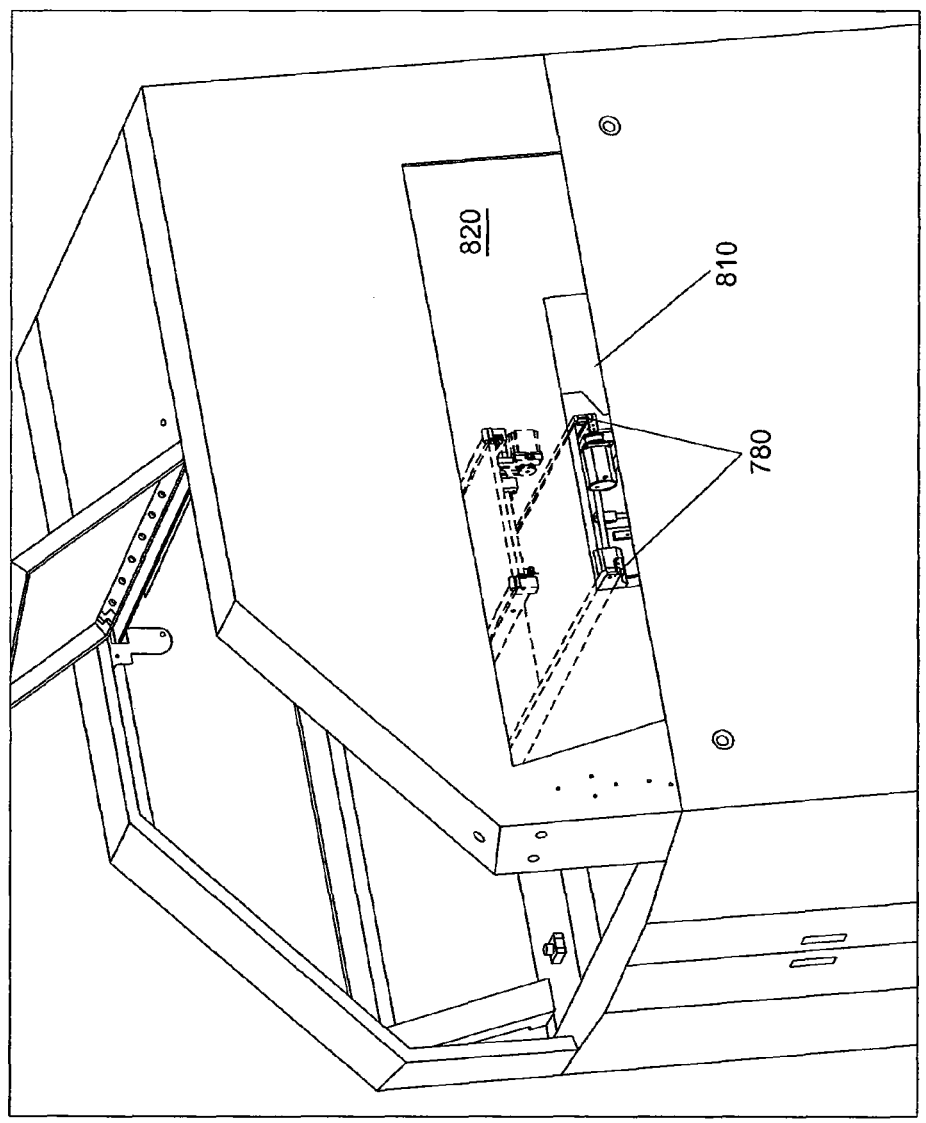

FIG. 42 illustrates the system 700 shown in FIG. 41 with the lower conveyor track 780 raised to the level of the transport opening 810 so that it may be used to transport a board into or out of the machine. A circuit board located on the upper conveyor track (shown in dotted lines) located within the machine is shown in dotted lines—this board is capable of being worked on within the machine in this position.

Figure 43:
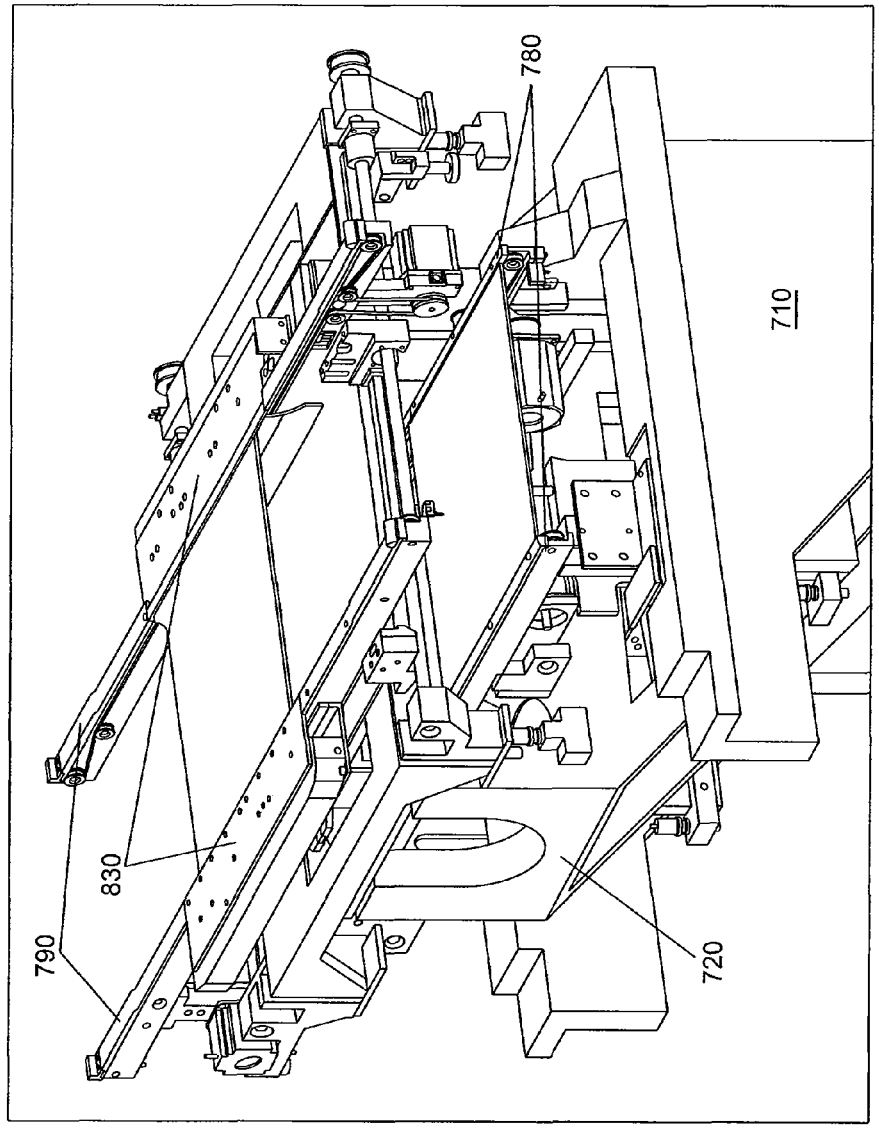

FIG. 43 illustrates a system with the lower conveyor track 780 in its lower position. A first circuit board is on the lower conveyor track in a position ready to exit the machine when the lower conveyor track 780 is raised to transport height. A second circuit board is shown on a worknest 830 ready for lifting into a position for processing. In the position illustrated, circuit boards may be transported to the worknest 830 by the upper conveyor track 790.

Figure 44:
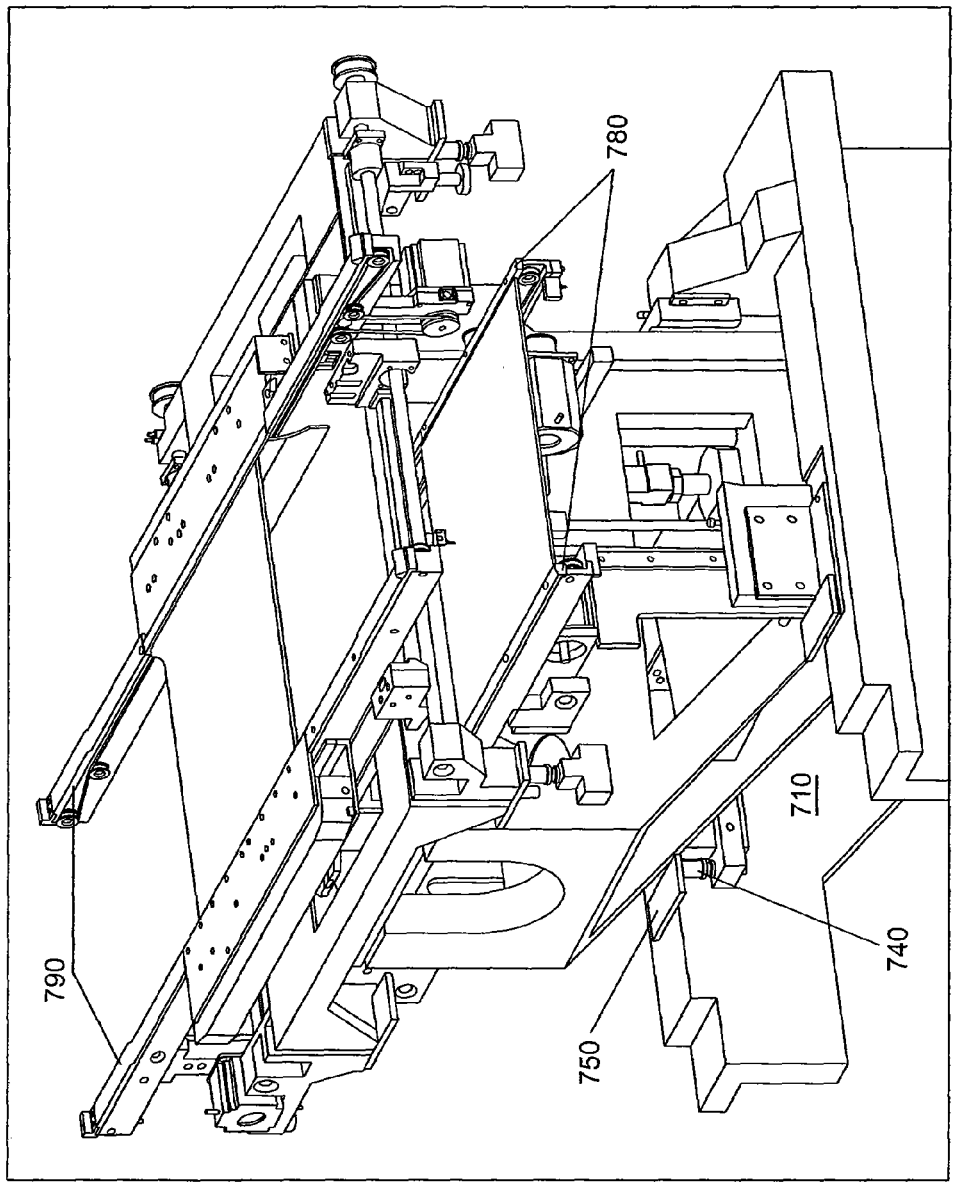

FIG. 44 illustrates the apparatus of FIG. 43 with the moving z-axis casting 720 in the upper position with the lower conveyor positioned for board transport. As shown, the upper travel limit shock 740 is in contact with the stop plate 750 that is mounted to the fixed z-axis casting 710. The lower conveyor track 780 is shown in its upper position. In this position, boards may be transported onto or off of the lower conveyor track 780. The illustrated upper position of the lower conveyor track 780 may vertically align with the lower position of the upper conveyor track 790, as illustrated in, for example, FIG. 43. In some embodiments, the relative heights of the upper and lower conveyor tracks may be set by adjusting collars on the shocks 740, 770.

Figure 45:
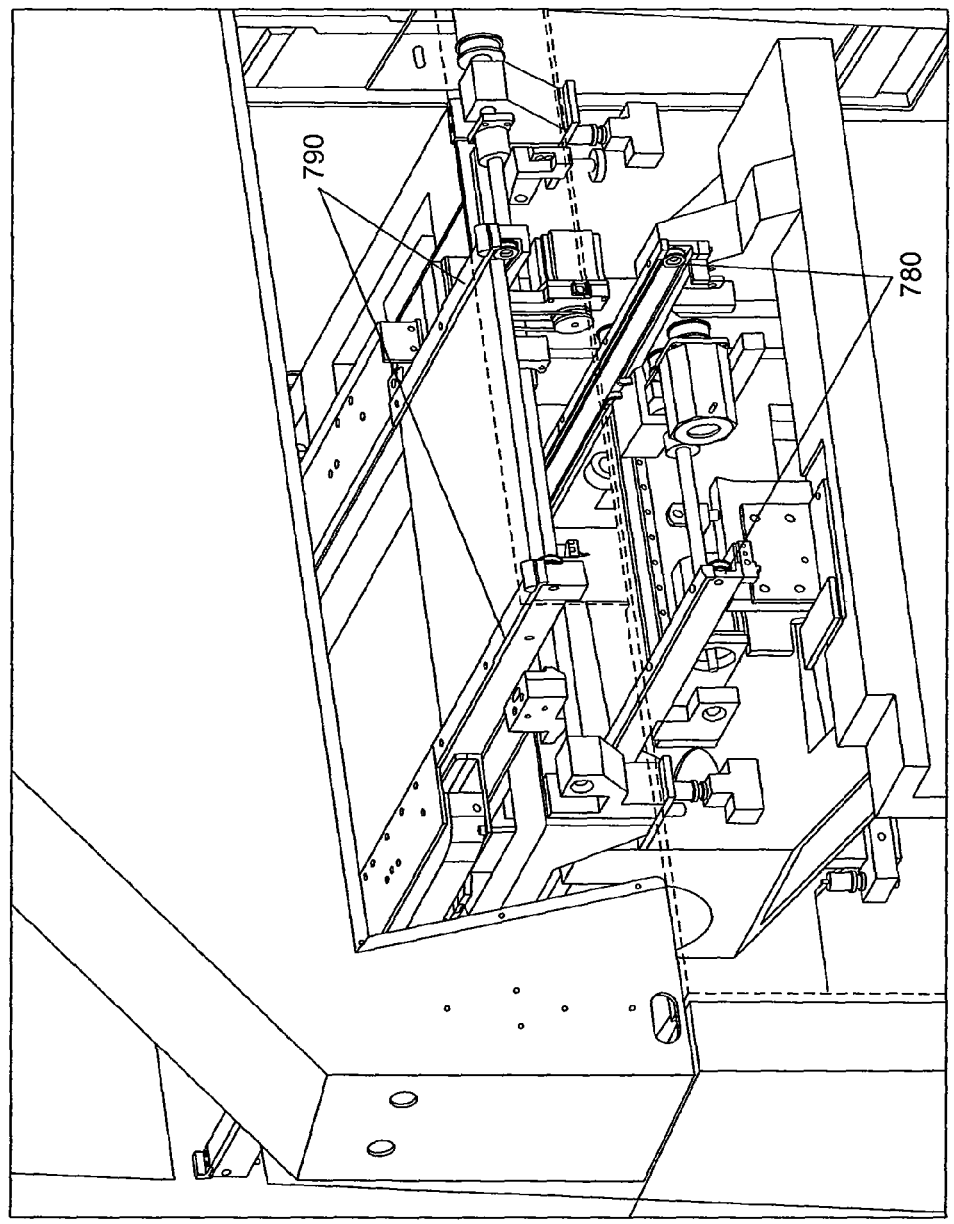

FIG. 45 shows a finished printed circuit board ready to exit the machine from the upper conveyor track 790. The lower conveyor track 780 can be seen behind the transparent cover in the down position. The lower conveyor track 780 is located within the machine, but is shown in solid lines, as the side cover of the machine is illustrated as transparent in this figure. It can also be seen that there is no board on the lower conveyor, which, in some embodiments, will typically be the situation when the conveyor is in the retracted position. In some embodiments, the only time that a board will be on the lower conveyor when in the retracted state will be when a board is stored there in conjunction with the sophisticated control system.

Figure 46:
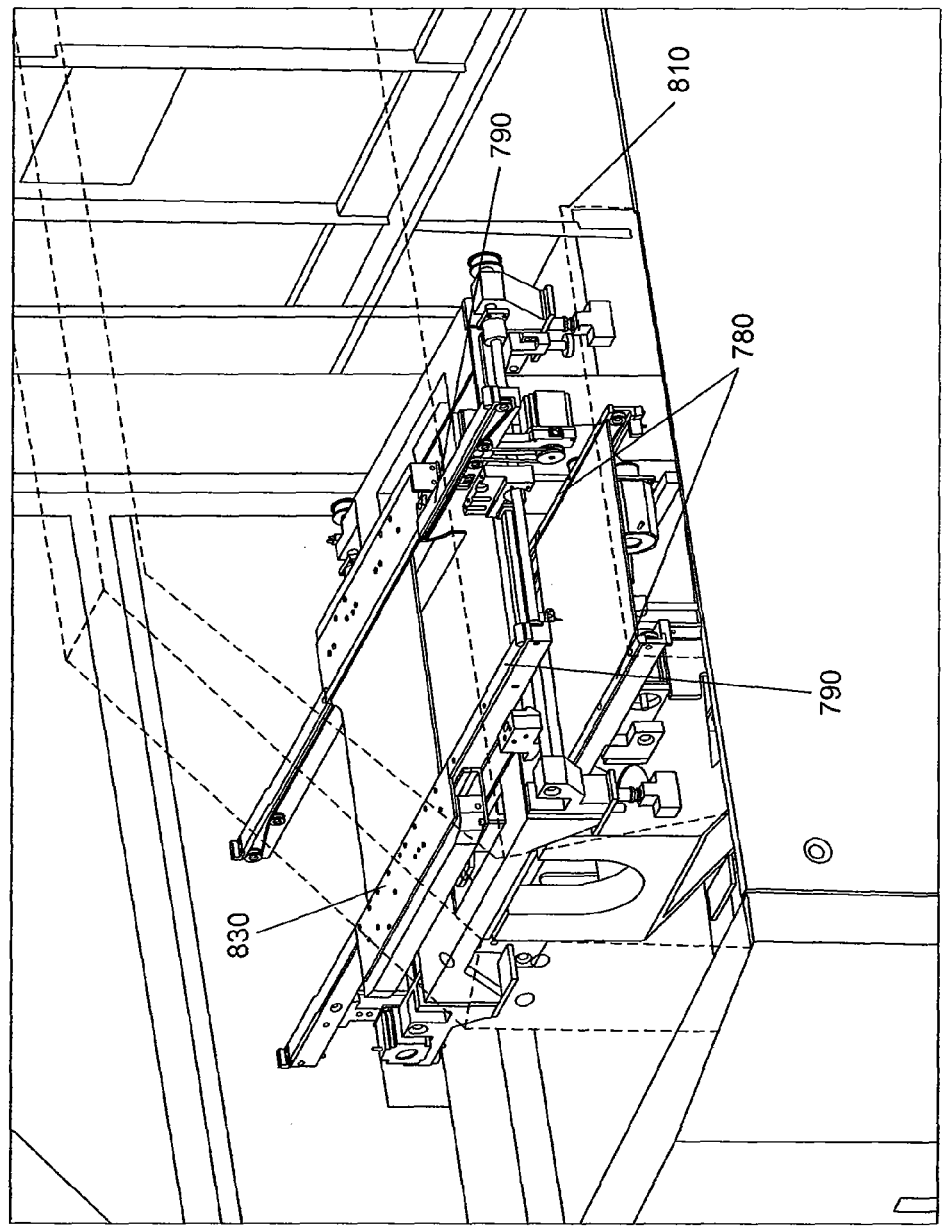

FIG. 46 shows a finished printed circuit board ready to exit the machine from the lower conveyor track 780. As in FIG. 45, the upper and lower tracks and other elements of the assembly within the machine are shown in solid lines as the side cover of the machine is illustrated as transparent. A second circuit board is shown on the worknest 830 ready for processing behind the transparent cover.

Figure 47:
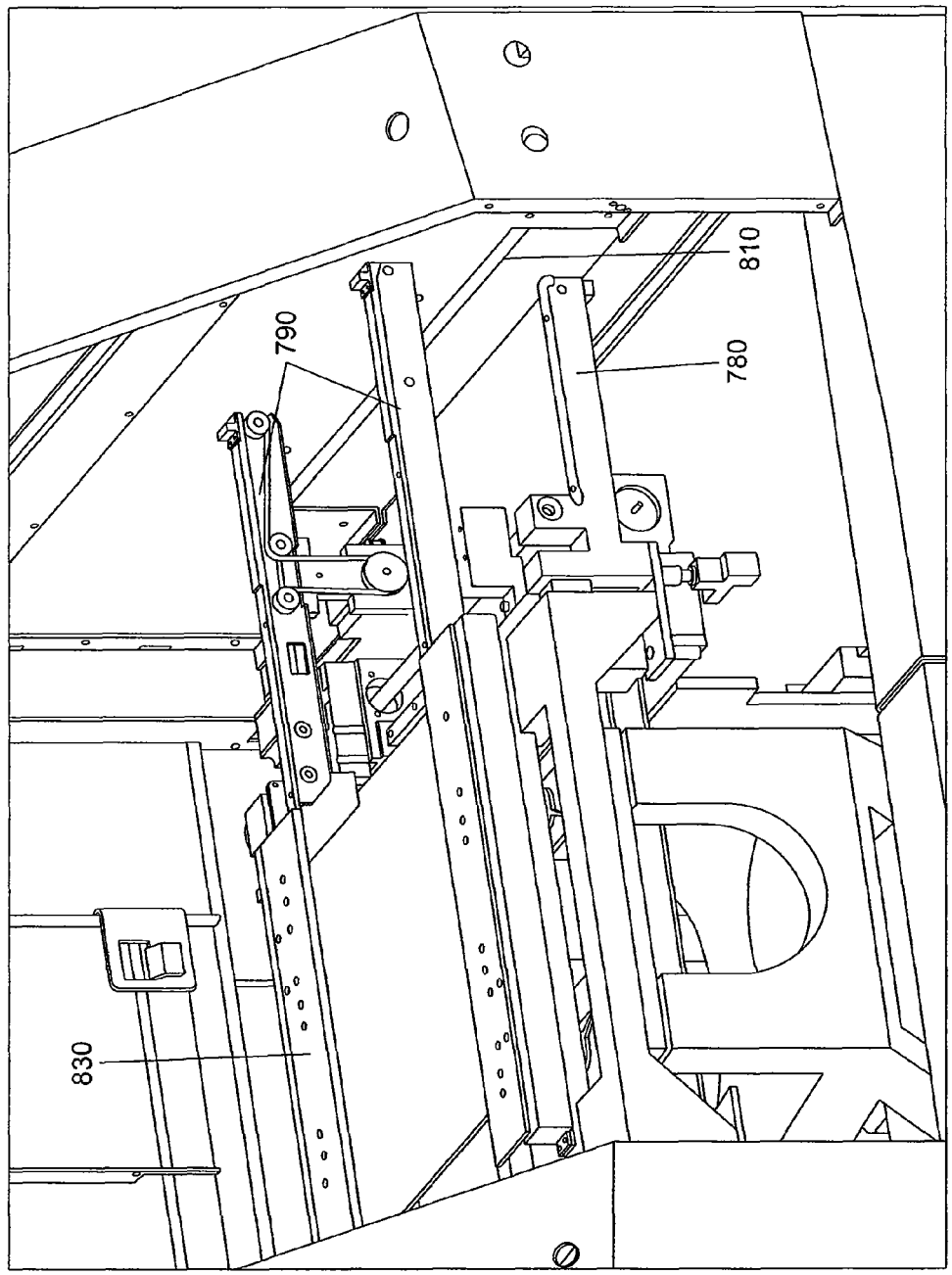

FIG. 47 shows the machine and boards in the configuration shown in FIG. 46 from a front of the stencil printer platform with the front hood opened.

The platform described above and in FIGS. 37-47 may be modified to function as an inspection station, dispenser, direct write machine, or an electronic component placement machine.

Various changes to the platform described above and in FIGS. 37-47 may be made while still falling within the scope of the present disclosure. For example, in some embodiments, the upper and lower conveyor tracks of a stencil printer platform or other piece of surface mount technology manufacturing equipment, such as a placement machine or inspection station, may be configured to move completely independently of one another. In some embodiments, a lower conveyor track may remain in a lowermost position regardless of the vertical position of an upper conveyor track.

Also, the platform described above and in FIGS. 37-47 may be utilized in a dual or multi-lane machine, such as a multi-lane printer, dispenser, inspection station, or placement machine wherein one or more lanes may include lower and upper conveyor tracks as described.

In other embodiments, one of either an upper conveyor track or a lower conveyor track, or both, may be removable from the equipment in which it is installed while the other conveyor track remains operational. For example, in some embodiments, a lower conveyor track may be removable from a stencil printer or other type of equipment, while an upper track is in operation. A different type of lower track or other type of equipment may be installed in the place of the removed lower conveyor track. For example, a lower conveyor track may be removed and replaced with a track which has functionality for passing boards through the equipment, but lacks other functionality of the removed conveyor track. Alternatively, the replacement track may include additional features, such as a visual inspection or a defect detection mechanism which may not be present in the removed lower track. In other embodiments, the temporarily exposed hole through the machine may be used for a manual board transport system, or a robotic arm or other transport system may be utilized in place of the removed lower track to pass boards through the piece of equipment. This equipment may be mounted to the machine or may be a separate piece of hardware operating independently, but with regard to the state of the machine.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system comprising:
    a piece of equipment configured to perform an operation on an electronic substrate in a surface mount manufacturing process;
    a substrate support assembly configured to support an electronic substrate in a work position of the piece of equipment, the substrate support assembly including a support configured to support and secure the electronic substrate in the work position; and
    a sub-system configured to shuttle electronic substrates to and from the support of the substrate support assembly, the sub-system including
        an upper track extending through the piece of equipment,
        a lower track extending through the piece of equipment and disposed below the upper track, and
        a displacement mechanism configured to raise the upper track relative to the lower track.

2. The system of claim 1, wherein a transport width of at least one of the upper track and the lower track is adjustable.

3. The system of claim 2, wherein the transport width of at least one of the upper track and the lower track is controlled by a controller associated with the system.

4. The system of claim 3, wherein the controller is located external to the system.

5. The system of claim 3, wherein the controller is located internal to the system.

6. The system of claim 1, wherein the lower track is configured to be removed from the system without disrupting an operation of the assembly material applicator or disrupting an operation of the upper track.

7. The system of claim 6, wherein removal of the lower track provides an opening in the system of a sufficient size so that an alternate transport system may be coupled to the apparatus and assume a function of the lower track.

8. The system of claim 1, wherein the system is configured as at least one of an inspection system and a placement system.

9. The system of claim 1, further comprising a second sub-system configured to shuttle electronic substrates though the system.

10. The system of claim 9, wherein the second sub-system comprises:
    a second upper track extending through the piece of equipment;
    a second lower track extending through the piece of equipment and disposed below the second upper track; and
    a second displacement mechanism configured to raise the second upper track relative to the second lower track.

11. The system of claim 10, wherein a transport width of at least one of the second upper track and the second lower track is adjustable.

12. The system of claim 1, further comprising a first opening defined a wall of the system of a sufficient size to allow transport of the electronic substrate through the system by passing through the first opening.

13. The system of claim 12, further comprising a second opening defined a second wall of the system of a sufficient size to allow transport of the electronic substrate through the system by passing through the second opening, at least one of the upper track and the lower track extending between the first opening and the second opening.

14. The system of claim 1, further comprising a frame including a fixed frame member and a movable frame member coupled to the fixed frame member.

15. The system of claim 14, wherein the movable frame member is movably secured to the fixed frame member by linear bearings.

16. The system of claim 15, wherein the frame further includes a mechanism to move the movable frame member with respect to the fixed frame member.

17. The system of claim 14, further comprising an assembly material applicator coupled to the frame and configured to apply assembly material to the electronic substrate.

18. The system of claim 17, wherein the piece of equipment is configured as a stencil printer and the assembly material comprises at least one of a solder paste and a conductive ink.

19. The system of claim 17, wherein the assembly material comprises an encapsulent.

20. The system of claim 17, wherein the piece of equipment is configured as a direct write printer and the assembly material comprises at least one of a solder paste and a conductive ink.

\* \* \* \* \*